(12) United States Patent
Noguchi

(10) Patent No.: US 6,169,688 B1
(45) Date of Patent: *Jan. 2, 2001

(54) MAGNETIC STORAGE DEVICE USING UNIPOLE CURRENTS FOR SELECTING MEMORY CELLS

(75) Inventor: Mitsuhiro Noguchi, Yokohama (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/272,192

(22) Filed: Mar. 18, 1999

(30) Foreign Application Priority Data

Mar. 23, 1998 (JP) .................................. 10-074577
Jun. 1, 1998 (JP) .................................. 10-151368

(51) Int. Cl.[7] .................................................. G11C 11/14
(52) U.S. Cl. ........................................... 365/171; 365/173
(58) Field of Search .................... 365/171, 173; 257/295

(56) References Cited

U.S. PATENT DOCUMENTS 5,343,422   8/1994   Kung et al. ............................ 365/173
5,640,343 * 6/1997   Gallagher et al. ................... 365/171
5,801,984 * 9/1998   Parkin .................................. 365/171

FOREIGN PATENT DOCUMENTS 5-101641   4/1993   (JP) .

OTHER PUBLICATIONS

Z.G. Wang et al., "Spin Tunneling Random Access Memory (STram)", IEEE Transactions on Magnetics, vol. 32, No. 5, pp. 4022–4024, Sep. 1996.

A.E. Berkowitz et al., "Giant Magnetoresistance in Heterogeneous Cu–Co Alloys", Physical Review Letters, vol. 68, No. 25, pp. 3745–3748, Jun. 1992.

* cited by examiner

Primary Examiner—Son T. Dinh
Assistant Examiner—Anh Phung
(74) Attorney, Agent, or Firm—Finnegan, Henderson, Farabow, Garrett, & Dunner, L.L.P.

(57) ABSTRACT

A current flow passing a data selection line both in a data write operation and data readout operation is directed to the same direction. A soft ferromagnetic film having a coercivity smaller than that of a ferromagnetic film is formed on the ferromagnetic film via a nonmagnetic conductive film. A barrier metal layer having a projecting portion is formed on the soft ferromagnetic film. A metal conductive layer is formed at the top of the projecting portion of the barrier metal layer. An insulating interlayer is formed on the entire surface. A data selection line is formed mainly in a region where the metal conductive layer is not formed.

22 Claims, 27 Drawing Sheets

MAGNETIC STORAGE DEVICE USING UNIPOLE CURRENTS FOR SELECTING MEMORY CELLS

BACKGROUND OF THE INVENTION

The present invention relates to a magnetic storage device capable of providing a large read output signal and of easily achieving high-density integration and a driving method therefor.

Magnetic storage devices for storing information as a digital bit using a magnetic state of a magnetic thin film and its change in resistance are disclosed in, e.g., Jpn. Pat. Appln. KOKAI Publication Nos. 5-101641 (prior art 1) and 8-306014 (prior art 2).

Prior art 1 discloses a magnetic storage device having data transfer lines each comprising two ferromagnetic films sandwiching a nonmagnetic conductive film therebetween and having almost the same coercivity, and data selection lines extending perpendicularly to the data transfer lines. The multilayered structure comprising the two ferromagnetic films and the nonmagnetic conductive film forms a magnetic storage portion 16 whose resistance changes in accordance with the magnetic state.

In this magnetic storage device, when the influence of an offset magnetic field is small, the data selection line current necessary for a non-destruction read is equal to or larger than the lower limit of the data selection line current necessary for a write, so a large current must be supplied to the data selection lines in the read.

Supply of a large current readily causes electro-migration due to an increase in the data selection line current, resulting in a decrease in reliability. In addition, heat generated from the data selection line decreases or locally changes the resistance change ratio. Also, since the rate of an increase in temperature changes in accordance with the number of times of read operation, the resistance changes depending on the read operations previously conducted.

More specifically, the signal output of read data changes, or the resistance values of memory cells in the neighborhood change. For this reason, when the degree of integration is increased, array noise increases to make the read difficult.

In prior art 2, the magnetization easy axes of a ferromagnetic film and a soft magnetic film are parallel to a data transfer line. One-bit logic information (two levels) is stored by setting the direction of magnetization of the ferromagnetic film forward or reverse along the magnetization easy axis.

Since this prior art uses a data selection line having a bending pattern, the pattern interval is not constant unlike a straight data selection line pattern. This structure requires a lithography or etching margin, and the degree of integration can hardly be increased. In addition, since the data selection line and data transfer line need be stacked in parallel, the margin to the vertical alignment shift of the data transfer line becomes smaller than that in a structure wherein a data selection line and a data transfer line extend perpendicularly to each other.

Prior art 2 also discloses a memory cell in which the magnetization easy axis of a ferromagnetic film is matched with the direction of a synthesized magnetic field formed by a data selection line and a data transfer line.

In this memory cell structure, when a plurality of memory cells are connected to corresponding one of data transfer lines, and a plurality of data transfer lines are connected to the data selection lines, two different magnetization directions along the magnetization easy axis of a ferromagnetic film 11 are used to store information. To write arbitrary information, not only the current of the data transfer lines but also the current of the data selection line must be changed to two levels in accordance with the write information.

The reason for this will be described below. Assume that binary information of level "0" or "1" given by a magnetic field formed by the data selection line is to be written in a specific memory cell selected by the data selection line.

When binary information is to be written, magnetic fields along the magnetization easy axis, which are formed by the data transfer line in correspondence with magnetization information of two levels, are defined as $H_{BL0}$ and $H_{BL1}$ in correspondence with the bit information of level "0" and "1", respectively. A magnetic field along the magnetization easy axis, which is formed by a selected data selection line for a selected memory cell connected to the selected data selection line, is defined as $H_{WLSEL}$. A magnetic field formed by an unselected data selection line for an unselected memory cell connected to the unselected data selection line is defined as $H_{WLUNSEL}$.

The magnitude of a coercivity of the ferromagnetic film along the magnetization easy axis is represented by $H_K$, the bias magnetic field is represented by $H_0$, and the positive and negative directions of magnetization along the magnetization easy axis are made to correspond to the information of level "0" and "1", respectively. The condition for writing the information of level "0" in the selected memory cell is as follows.

$$H_{BL0} + H_{WLSEL} > H_K + H_0 \qquad (1)$$

At this time, the information of level "0" is prevented from being erroneously written in a memory cell connected to the same data transfer line as that connected to the memory cell in which the information of level "0" is to be written, and connected to an unselected data selection line under the following condition.

$$H_{BL0} + H_{WLUNSEL} < H_K + H_0 \qquad (2)$$

The solution of simultaneous inequalities (1) and (2) yields $$H_{WLUNSEL} < H_{WLSEL} \qquad (3)$$

The information of level "1" is written in the selected memory cell under the following condition because magnetization must be caused in a direction reverse to that for information of level "0".

$$H_{BL1} + H_{WLUNSEL} < -H_K + H_0 \qquad (4)$$

At this time, the information of level "1" is prevented from being erroneously written in a memory cell connected to the same data transfer line as that connected to the memory cell in which the information of level "1" is to be written, and connected to an unselected data selection line under the following condition.

$$H_{BL1} + H_{WLUNSEL} > -H_K + H_0 \qquad (5)$$

The solution of simultaneous inequalities (4) and (5) yields $$H_{WLSEL} < H_{WLUNSEL} \qquad (6)$$

Inequalities (3) and (6) cannot be simultaneously satisfied by constant magnetic fields $H_{WLSEL}$ and $H_{WLUNSEL}$. That is, in the memory cell structure of prior art 2, the current flowed to the data selection line must be changed in accordance with the condition for writing the information of level "1" and "0".

More specifically, when a plurality of memory cells are connected to one data selection line, and random data are to be written in the memory cells, the magnitude of the current of the data selection line must be changed to at least two levels in correspondence with the write information of "0" and "1" and supplied with a time lag to write the information along the opposite directions of magnetization.

To write the information of level "0" and information of level "1", the current direction of the data selection line is inverted to write the information of level "0" and "1". Three-level control is required to drive the data selection line, resulting in complexity.

In addition, high-speed operation is difficult because a sufficient current value which changes to two levels in the write need be ensured and stabilized.

BRIEF SUMMARY OF THE INVENTION

The present invention relates to a magnetic storage device using a magnetoresistance effect. According to the present invention, there is provided a magnetic storage device comprising a plurality of data selection lines, a first power supply node for supplying currents of two types having the same polarity and different magnitudes to the plurality of data selection lines, a plurality of data transfer lines arranged to intersect the plurality of data selection lines, and a plurality of memory cells each comprising a first magnetic material element having a magnetization easy axis arranged to substantially be parallel to the longitudinal direction of the data selection lines, a second magnetic material having a magnetization easy axis arranged to substantially be parallel to the longitudinal direction of the data selection lines and having a coercivity smaller than that of the first magnetic material, a nonmagnetic material being interposed between the first magnetic material and the second magnetic material. Each of the memory cells is located at the intersection region between one of the data selection lines and one of the data transfer lines. In the magnetic storage device, when data is to be written in a selected memory cell, one of the currents of two types is supplied to a selected data selection line, and when data is to be read from the selected memory cell, the other of the currents of two types is supplied to the selected data selection line.

The present invention having the above arrangement has the following functions/effects.

When the arrangement of the present invention is used, a circuit can be constructed by flowing the current to the data selection line in one direction, and a large read signal amount can be ensured. The current necessary for the read and write need be flowed to the driving circuit of the data selection line in only one direction. With this arrangement, the area of the switching element between the data selection lines and the current source can be made smaller than that in an arrangement for flowing the current in two directions, and additionally, the number of elements can be reduced. Even when the potential at one terminal of the data selection line is fixed, the potential at the other terminal need only be changed to one side, i.e., in the positive direction of the potential at one end. Large voltage amplitude can be ensured by a simpler circuit than a circuit for generating positive and negative voltages. The current source for generating a voltage on the negative side of the potential at one end is not required. For this reason, the circuit area and power consumption can be reduced.

The voltage at one end of the data transfer line can be fixed at a constant value and need not be changed. The impedance of the data transfer line can be kept low relative to the power supply. For example, the capacitively coupled noise on the data transfer line, which is generated when the potential of the data selection line is changed, can be decreased, and a more stable data read can be realized.

In the write, two different current values need not be time-serially supplied to the data selection line, so the current switching circuit can be simplified. In addition, the time necessary for switching between the two different currents, i.e. the time for charging the data selection line and stabilizing the current can be shortened, and a higher-speed operation can be realized. Furthermore, since charges in the data selection line, which are necessary for switching the current, can be decreased, the power consumption can be further reduced. In addition, since the wiring area from the current source to the switching element can be reduced, a high-density memory cell array can be formed.

In the present invention, an arrangement in which the data transfer lines are perpendicular to the data selection lines can be used. Both the data transfer lines and data selection lines can be arranged in a straight pattern, unlike an arrangement in which the data transfer lines and data selection lines are arranged parallel to each other, so a high-density memory cell can be formed. Since the data transfer lines or data selection line can be laid out not in a bending pattern but in a straight pattern, the magnetic fields formed by the wiring can be made uniform, variations between memory cells can be decreased, and the operation can be made stable. Since the wiring layout is linear, variations in wiring width in lithography or etching can be suppressed. Since the data selection lines and data transfer lines are perpendicular to each other, the margin for the alignment shift in the plane increases as compared to an arrangement in which the data selection lines and data transfer lines are parallel to each other.

When the memory cell structure of the present invention is used, a sufficient resistance difference between data of level "1" and data of level "0" can be obtained even when the current of the data transfer line in the data read is small. Hence, degradation in reliability by electro-migration upon an increase in current of the data selection line, a decrease or local change in resistance change ratio due to heat generated by the data selection line, or a change in resistance depending on the read history because of the different degrees of increase in temperature depending on the read count can be prevented. A change in read data signal output or a change in resistance values of memory cells in the neighborhood can also be prevented. Therefore, even when the degree of integration is increased, the read does not become difficult because the array noise does not increase.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

FIRST EMBODIMENT

[MEMORY CELL]

Figure 1A:
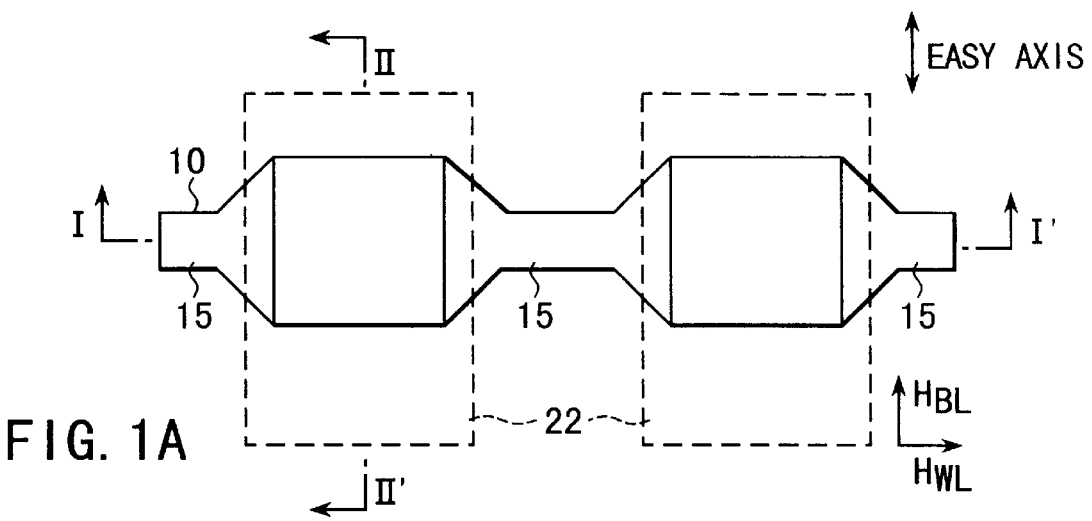
FIGS. 1A to 1C are views showing the structure of a magnetic storage device according to the first embodiment.
Figure 1B:
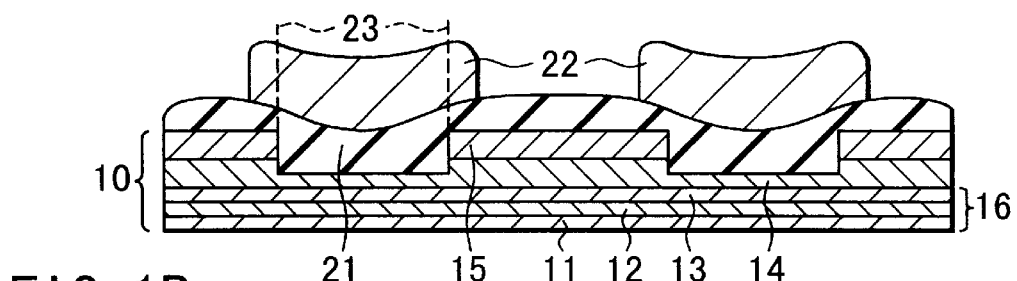
Figure 1C:
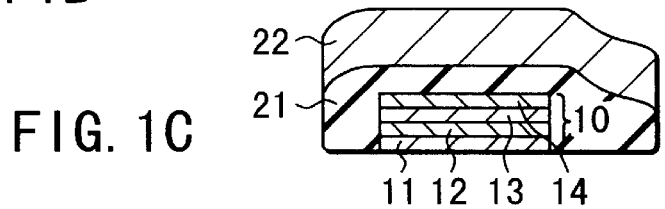

FIGS. 1A to 1C are views showing the structure of memory cells of a magnetic storage device according to the first embodiment of the present invention. FIG. 1A is a plan view, FIG. 1B is a sectional view taken along a line I–I' in FIG. 1A, and FIG. 1C is a sectional view taken along a line II–II' in FIG. 1A.

A soft ferromagnetic film 13 having a smaller coercivity than that of a ferromagnetic film 11 is formed on the ferromagnetic film 11 via a nonmagnetic conductive film 12. A barrier metal layer 14 having projecting portions is formed on the soft ferromagnetic film 13. A metal conductive layer 15 is formed at the top of each projecting portion of the barrier metal layer 14. An insulating interlayer 21 is formed on these layers. Data selection lines 22 are formed to cover regions where no metal conductive layers 15 are formed.

The coercivity of the soft ferromagnetic film 13 must be smaller than that of the ferromagnetic film 11. However, the ferromagnetic film 11 need not always be formed from a ferromagnetic material, and the soft ferromagnetic film 13 need not always be formed from a soft magnetic material. For example, both the ferromagnetic film 11 and soft ferromagnetic film 13 may be formed from a ferromagnetic material or both the ferromagnetic film 11 and soft ferromagnetic film 13 may be formed from a soft magnetic material.

As the ferromagnetic film 11, for example, a 0.5-nm to 500-nm thick film of Fe, Ni, Co, Cr, or Mn, or an alloy thereof: NiFe, CoPe, NiFeCo, or CoPt, or a multilayered structure of these films can be used. The coercivity is, e.g., 200 Oe. The soft ferromagnetic film 13 preferably has a smaller coercivity than that of the ferromagnetic film 11 and magnetization almost the same as that of the ferromagnetic film 11. For example, a 0.5-nm to 500-nm thick NiFe, CoFe, NiFeCo, CoTaZr, CoNbZr, or FeTa film, or a multilayered structure of CoZrNb/NiFe/CoFe or the like may be used as the soft ferromagnetic film 13.

The coercivity of the soft ferromagnetic film 13 can be made smaller than that of the ferromagnetic film 11 by changing the material of the soft ferromagnetic film 13 or forming a thinner soft ferromagnetic film 13 than the ferromagnetic film 11 from the same material as that of the ferromagnetic film 11.

The nonmagnetic film 12 is formed from, e.g., a 0.5-nm to 10-nm thick nonmagnetic film of Cu, AgCu, TaN, or the like. The thickness of the nonmagnetic film 12 must be smaller than the free path of conductive carriers in the nonmagnetic film 12. The thickness of the nonmagnetic film 12 is selected such that when the magnetization vectors of the ferromagnetic film 11 and soft ferromagnetic film 13 are parallel, the resistance of the data transfer line becomes low, and when the magnetization vectors of these films are antiparallel, the resistance of the data transfer line is maximized. To independently control the magnetization vectors of the ferromagnetic film 11 and soft ferromagnetic film 13, the exchange magnetic field of the ferromagnetic film 11 and soft ferromagnetic film 13 is preferably weaker than the coercivity of the soft ferromagnetic film 13.

In addition, to orient magnetization at the central portion of the data selection line 22 along the direction of the data selection line independently of magnetization of the edge portion of the data selection line 22, preferably, the ferromagnetic film 11 and soft ferromagnetic film 13 are made thick, and the width of a data transfer line 10 is made larger than the thickness of the magnetic domain wall.

The ferromagnetic film 11, nonmagnetic film 12, and soft ferromagnetic film 13 which have a multilayered structure form a magnetic storage portion 16 whose resistance changes in accordance with a magnetic state. The magnetic storage portion 16 forms a memory cell 23 for storing a magnetic state at a portion where the magnetic storage portion 16 and data selection line 22 cross. That is, in FIG. 1A, one memory cell is formed in correspondence with each data selection line 22.

The barrier metal layer 14 is formed from, e.g., a 1-nm to 100-nm thick TaN, TiN, WN, or TaW film and prevents impurity contamination from the upper structure. The metal conductive layer 15 is formed from, e.g., a 50-nm to 1,000-nm thick W, Al, AlCu, or Cu film and reduces the parasitic resistance of the connection region between adjacent memory cells of the data transfer line 10. The insulating interlayer 21 is formed from, e.g., a 5-nm to 100-nm thick silicon oxide film or silicon nitride film and electrically isolates the data selection line 22 from the data transfer line 10.

The data transfer line 10 and data selection line 22 are formed perpendicularly to each other, and consequently, the directions of magnetic fields formed by these lines are perpendicular to each other.

The magnetization easy axis of the ferromagnetic film 11 and that of the soft ferromagnetic film 13 are formed to be substantially parallel to the longitudinal direction of the data selection line 22. When the magnetic films 11 and 13 are made of NiFe, a magnetic anisotropy of about 5 to 15 Oe can be formed therein by depositing the films while applying a magnetic field in a direction along the data selection line 22.

CONTROLLING GMR

In the memory cell having the above structure, when the directions of magnetization of the ferromagnetic film 11 and soft ferromagnetic film 13 are set forward or reverse along the magnetization easy axis, information in the digital state, i.e., 1-bit logic information can be stored.

Referring back to FIG. 1A, $H_{WL}$ represents a magnetic field generated upon flowing a current to the data selection line 22, which is directed to the right in the figure, and $H_{BL}$ represents a magnetic field generated upon flowing a current to the data transfer line 10, which is directed to the upper side in the figure. These directions are defined as positive directions. The magnetic field $H_{BL}$ matches with the magnetization easy axis of the ferromagnetic film 11 and soft ferromagnetic film 13. The magnetic field $H_{WL}$ matches the magnetization hard axis perpendicular to the magnetization easy axis.

Since the magnetization easy axis of the ferromagnetic film 11 is formed parallel to the data selection line 22, the direction of a synthesized magnetic field generated by the currents flowing to the data selection line 22 and data transfer line 10 is normally different from the magnetization easy axis.

Figure 2:
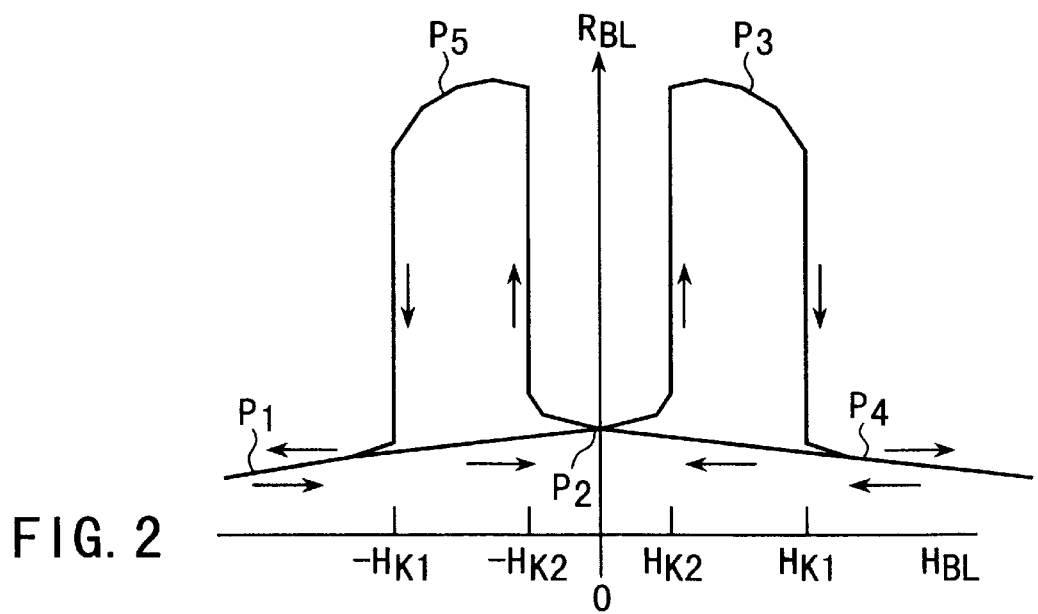
FIG. 2 is a graph showing the dependence of a resistance $R_{BL}$ of a data transfer line on a magnetic field $H_{BL}$.

FIG. 2 shows a change in resistance $R_{BL}$ of the data transfer line 10 with respect to the magnitude of the magnetic field $H_{BL}$ when the magnetic field $H_{WL}$ is not applied. Referring to FIG. 2, the magnetic field $H_{BL}$ changes in the order of P1→P2→P3→P4 and then P4→P2→P5→P1. A magnitude $H_{K1}$ of the magnetic field $H_{BL}$ represents a magnitude for inverting the direction of magnetization of the ferromagnetic film 11, and a magnitude $H_{K2}$ represents a magnitude for inverting the direction of magnetization of the soft ferromagnetic film 13.

Figure 4A:
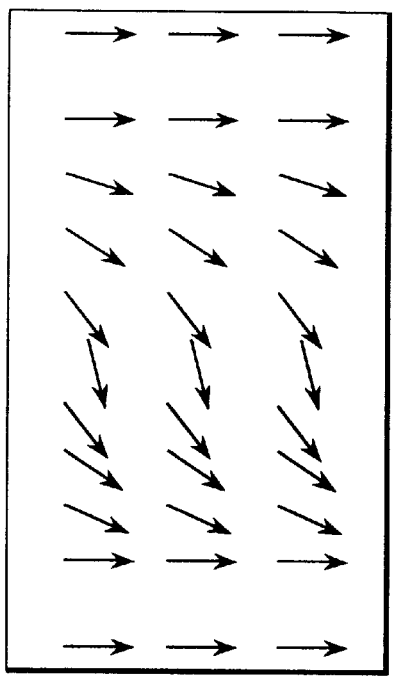
FIGS. 4A to 4D are schematic views showing the magnetic states of the ferromagnetic film and soft magnetic film corresponding to states P5 and P1 in FIG. 2.
Figure 4B:
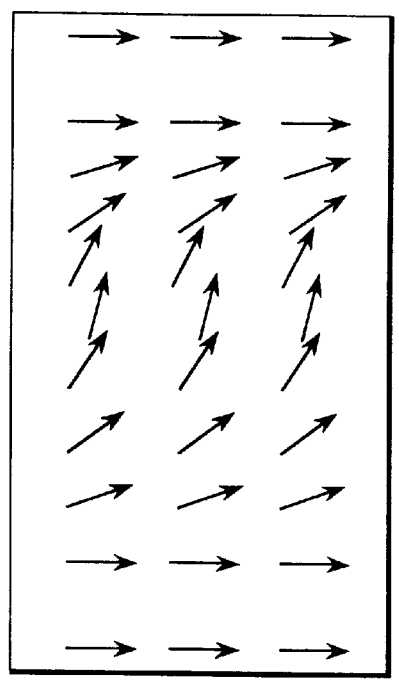
Figure 4C:
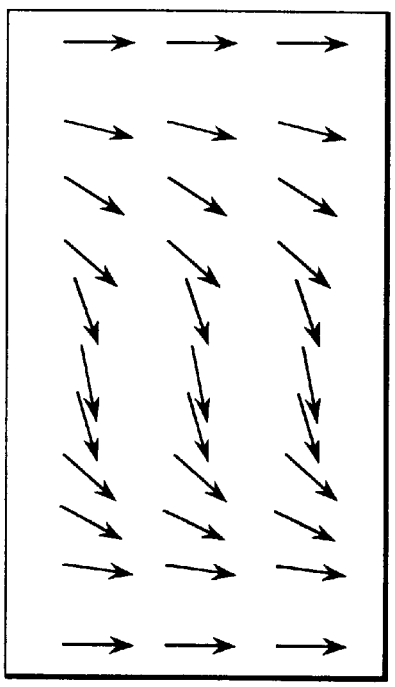
Figure 4D:
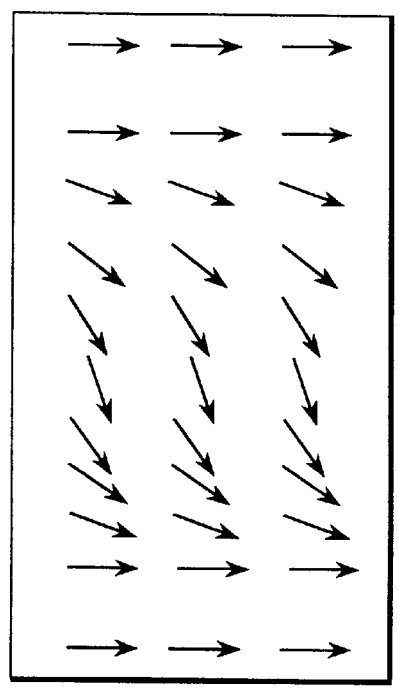

At P1, the magnetic field $H_{BL}$ larger than the magnitude $H_{K1}$ is applied in the negative direction (toward the left in FIG. 1A). The ferromagnetic film 11 and soft ferromagnetic film 13 are in a state corresponding to one of two recording holding states. This may be a recording holding state corresponding to data of level "0". FIG. 4D shows the magnetic state of the ferromagnetic film 11 at P1, and FIG. 4C shows the magnetic state of the soft ferromagnetic film 13 at P1. The directions of magnetization at the central portions of these films are directed downward and parallel in the figures.

The magnitude of the magnetic field $H_{BL}$ is decreased to zero at P2. The resistance $R_{BL}$ moderately increases. At this time, the magnetic states of the ferromagnetic film 11 and soft ferromagnetic film 13 are almost the same as those at P1.

Figure 3A:
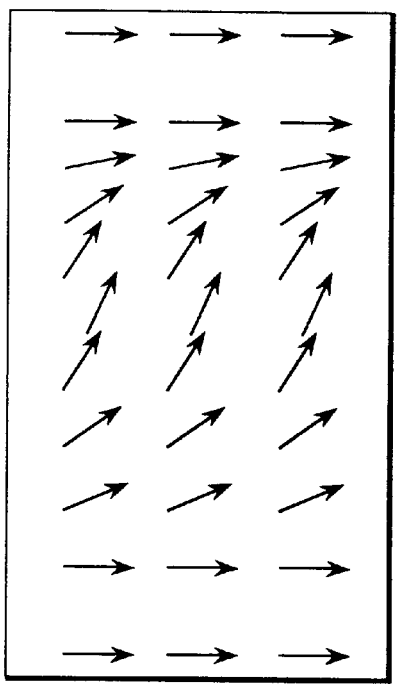
FIGS. 3A to 3D are schematic views showing the magnetic states of the ferromagnetic film and soft magnetic film corresponding to states P3 and P4 in FIG. 2.
Figure 3B:
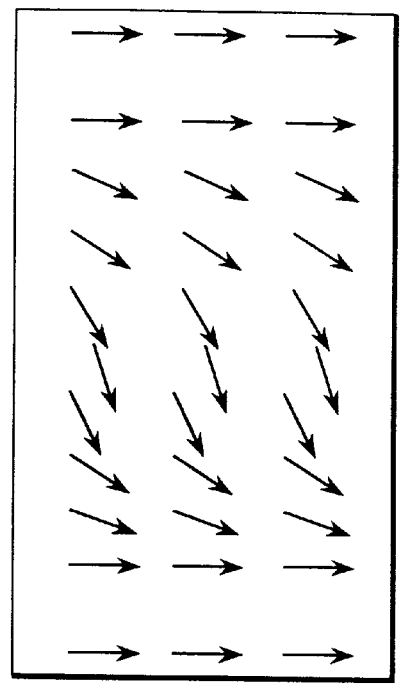

The magnetic field $H_{BL}$ is applied in the positive direction while gradually increasing the magnitude to change the state from P2 to P3. When the magnitude of the magnetic field $H_{BL}$ exceeds $H_{K2}$, the direction of magnetization of the soft ferromagnetic film 13 is reversed and directed upward (FIG. 3A) while the direction of magnetization of the ferromagnetic film 11 is kept directed downward (FIG. 3B). Since the directions of magnetization of the ferromagnetic film 11 and soft ferromagnetic film 13 become antiparallel, the resistance $R_{BL}$ abruptly increases.

Figure 3C:
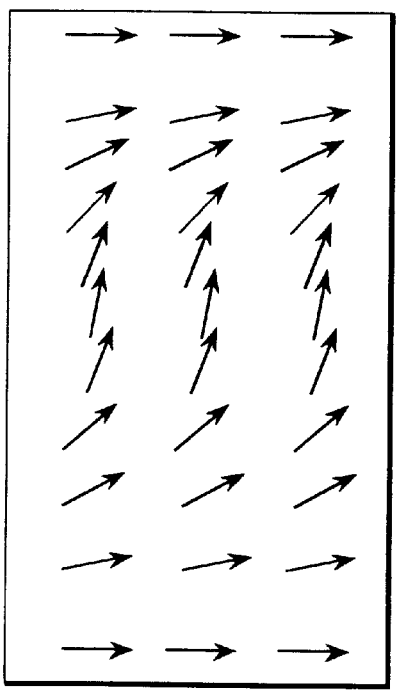
Figure 3D:
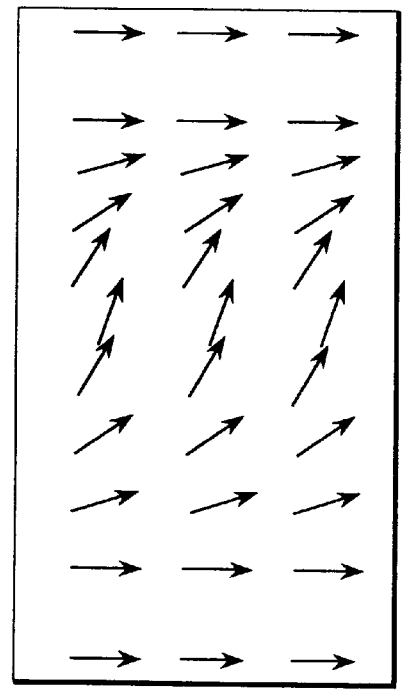

The magnetic field $H_{BL}$ in the positive direction is further increased. When the magnitude exceeds $H_{K1}$, the direction of magnetization of the ferromagnetic film 11 is also inverted (P4). At this time, the direction of magnetization of the soft ferromagnetic film 13 is directed upward (FIG. 3C), and the direction of magnetization of the ferromagnetic film 11 is directed upward (FIG. 3D). Since the directions of magnetization are parallel, the resistance $R_{BL}$ abruptly decreases.

The magnetic field $H_{BL}$ in the positive direction is gradually decreased until the magnitude becomes zero. The state directly changes from P4 to P2 without interposing P3. This is because the directions of magnetization of the ferromagnetic film 11 and soft ferromagnetic film 13 do not change and are kept directed upward and parallel.

Next, the magnetic field $H_{BL}$ is applied in the negative direction while increasing the magnitude to change the state from P2 to P5. When the magnitude of the magnetic field $H_{BL}$ exceeds $-H_{K2}$, the direction of magnetization of the soft ferromagnetic film 13 is reversed and directed downward (FIG. 4A) while the direction of magnetization of the ferromagnetic film 11 is kept directed upward (FIG. 4B). Since the directions of magnetization of the ferromagnetic film 11 and soft ferromagnetic film 13 are antiparallel, the resistance $R_{BL}$ abruptly increases (state P5).

The magnetic field $H_{BL}$ is further increased in the negative direction to change the state from P5 to P1. When the magnitude of the magnetic field $H_{BL}$ exceeds $-H_{K1}$, the direction of magnetization of the ferromagnetic film 11 is also reversed and directed downward. At this time, the direction of magnetization of the soft ferromagnetic film 13 is kept directed downward (FIG. 4C), and the direction of magnetization of the ferromagnetic film 11 is directed downward (FIG. 4D). Since the directions of magnetization are parallel, the resistance $R_{BL}$ abruptly decreases.

As is known, when a magnetic field in the magnetization hard axis is applied to a ferromagnetic thin film having a magnetization easy axis in the film, the magnitude of the critical magnetic field at which magnetization inversion along the magnetization easy axis occurs becomes small (Kinbara and Fujiwara, "Thin Film", Shouka-bo, Applied Physics Selection 3, p. 300). This can be explained from the fact that when the magnetic field $H_{WL}$ is applied along the magnetization hard axis and the magnetic field $H_{BL}$ is applied along the magnetization easy axis, an energy E of an ideal magnetic thin film having a single magnetic domain is given by $$E = (H_K/2) \times \sin^2\theta - H_{BL} \times \cos\theta - H_{WL} \times \sin\theta \quad (7)$$

where θ is the angle made by a magnetization vector M and magnetization easy axis of the ferromagnetic film, and $H_K$ is the anisotropic magnetic field. A magnetic field $H_{BL0}$ whose magnetization is inverted along the magnetization easy axis is given when $dE/d\theta=0$ and $d^2E/d\theta^2$=zero. In this case, the following relation holds based on equation (7).

$$H_{BL0} = (H_K^{2/3} - H_{WL}^{2/3})^{3/2} \quad (8)$$

Figure 5:
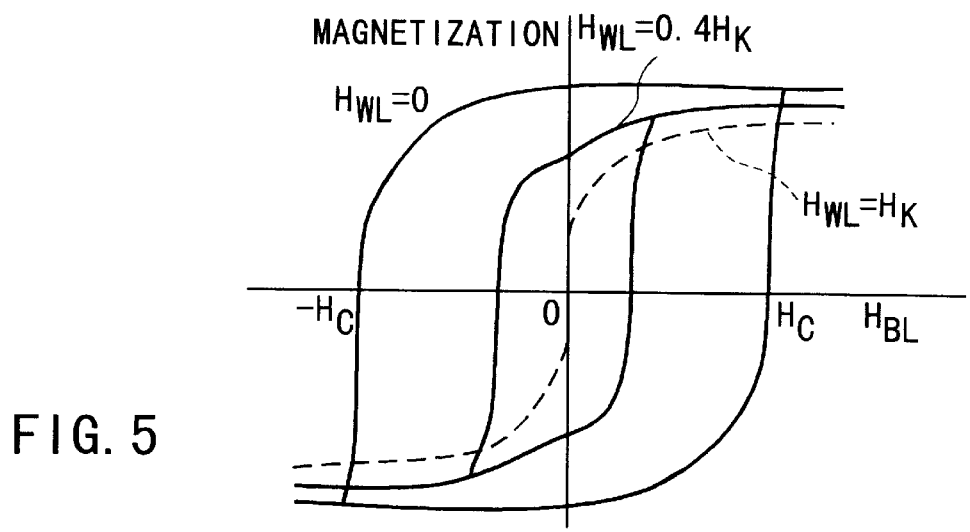
FIG. 5 is a graph showing the magnetization the ferromagnetic thin film as a function of the magnetic field $H_{BL}$ when a magnetic field $H_{WL}$ is applied along the magnetization hard axis.

FIG. 5 shows the dependence of magnetization of a ferromagnetic thin film on the magnetic field $H_{BL}$ when the magnetic field $H_{WL}$ along the magnetization hard axis is 0, $0.4H_K$, or $H_K$.

As is apparent from equation (8), when the magnetic field $H_{WL}$ is applied along the magnetization hard axis, the magnetic field $H_{BL0}$ where magnetization inversion occurs becomes small. Generally, when the magnetic field $H_{WL}$ is almost 0, a coercivity $H_C$ along the magnetization easy axis becomes smaller than $H_K$ because of the magnetization mechanism based on magnetic domain wall movement. However, when the magnetic field $H_{WL}$ is made large, the characteristic feature that the magnetic field $H_{BL0}$ monotonically decreases can be maintained.

WRITE OPERATION

The write operation of the magnetic storage device of this embodiment will be described next.

In the present invention, two storage holding states corresponding to "0" and "1" are used. In each storage holding state, the directions of magnetization of the ferromagnetic film 11 and soft ferromagnetic film 13 are substantially parallel. The magnetization directions of the "0" state and "1" state are opposite to each other. In the recording holding state representing "0", the magnetization directions of the ferromagnetic film 11 and soft ferromagnetic film 13 may be set parallel in an upward direction, as shown in FIGS. 3D and 3C. In the other recording holding state representing data "1", the magnetization directions of the ferromagnetic film 11 and soft ferromagnetic film 13 may be set parallel in a downward direction, as shown in FIGS. 4D and 4C. Alternatively, the setting may be reversed.

In a write mode, for example, a current passing the data selection line 22 in the positive direction (downward in FIG. 1A) induces the magnetic field $H_{WL}$ in the positive direction (rightward in FIG. 1A). It is preferable to set the direction of magnetic field $H_{WL}$ along the direction of magnetization of the edge portion of the data transfer line 10, thereby to reduce the current for the write of the data transfer line 10. Note that the direction of the magnetic field $H_{WL}$ matches with the magnetization hard axis, while the direction of the magnetic field $H_{BL}$ matches with the magnetization easy axis.

Figure 6:
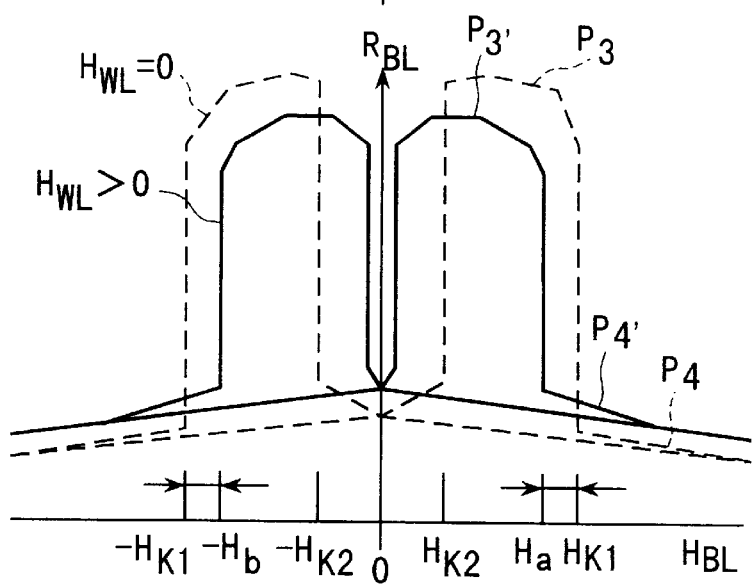
FIG. 6 is a graph showing the resistance $R_{BL}$ of the data transfer line as a function of the magnetic field $H_{BL}$ where magnetic field $H_{WL}$ is used as a parameter.

FIG. 6 shows change of the resistance $R_{BL}$ of the data transfer line 10 according to the magnetic field $H_{BL}$ in the case of $H_{WL}=0$ and $H_{WL}>0$ ($H_{WL}<H_{K2}$). In association with the horizontal axis, $H_{K1}$ represents the magnitude of the magnetic field $H_{BL}$ at which the direction of magnetization of the ferromagnetic film 11 is reversed when $H_{WL}=0$, $H_{K2}$ represents the magnitude of the magnetic field $H_{BL}$ at which the direction of magnetization of the soft ferromagnetic film 13 is reversed when $H_{WL}=0$, $H_a$ represents the magnitude of the magnetic field $H_{BL}$ in the positive direction at which the direction of magnetization of the ferromagnetic film 11 is reversed when $H_{WL}>0$, and $-H_b$ represents the magnitude of the magnetic field $H_{BL}$ in the negative direction at which the direction of magnetization of the ferromagnetic film 11 is reversed when $H_{WL}>0$.

As described above, when the magnetic field $H_{WL}$ is applied in the direction of the magnetization hard axis, the magnitude of the magnetic field necessary for reversing the direction of magnetization is smaller than that in the case where the magnetic field $H_{WL}$ is not applied. As shown in FIG. 6, when the magnetic field $H_{WL}$ is applied, and the magnetic field $H_{BL}$ is in positive direction (upward in FIG. 1A), the magnetization direction of the ferromagnetic film 11 is reversed at $H_a$ which is smaller than $H_{K1}$. When the magnetic field $H_{BL}$ is in the negative direction (downward in FIG. 1A), the magnetization direction of the ferromagnetic film 11 is reversed at $-H_b$ which is smaller than $-H_{K1}$ (i.e., $|-H_{K1}|>|-H_b|$).

Figure 7A:
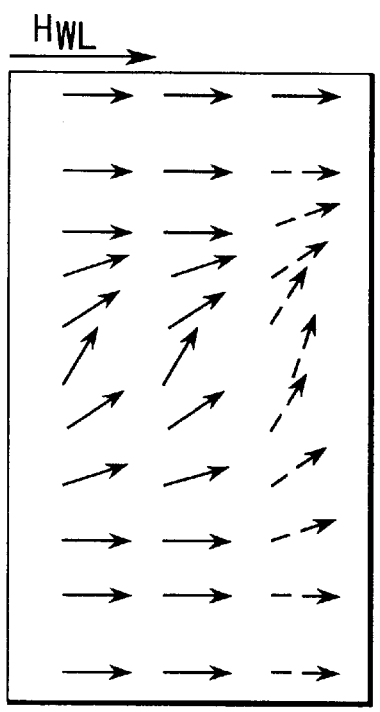
FIGS. 7A to 7D are schematic views showing the magnetic states of the ferromagnetic film and soft magnetic film corresponding to states P3', P4', P3, and P4 indicated in FIG. 6, respectively.
Figure 7B:
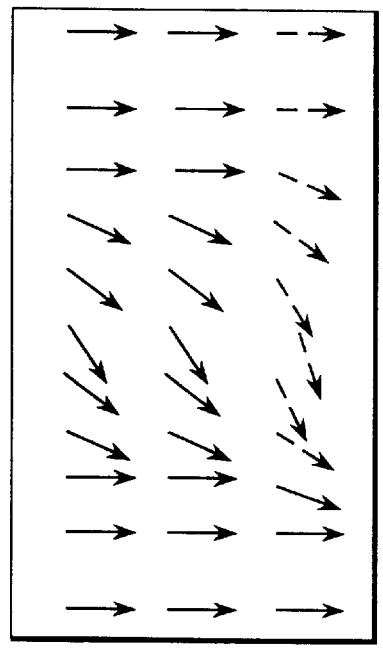

FIGS. 7A and 7B show the magnetic states of the ferromagnetic film 11 and soft ferromagnetic film 13 in correspondence with states P3' and P4' (in the case that the magnetic field $H_{WL}$ is applied) and states P3 and P4 (in the case that the magnetic field $H_{WL}$ is not applied) indicated in FIG. 6.

Figure 7C:
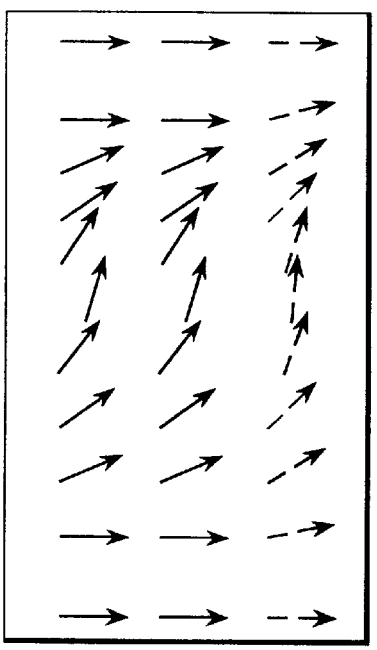
Figure 7D:
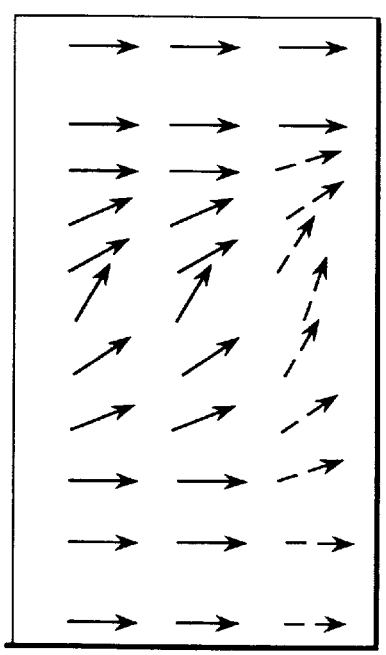

In FIG. 7A, the magnetic states of the soft ferromagnetic film 13 at P3' and P3 where the magnetic fields $H_{BL}$ of the same magnitude are applied are indicated by solid and dotted arrows, respectively. Referring to FIG. 6, the direction of the magnetic field generated by the data selection line 22 is defined as $H_{WL}$. In FIG. 7B, the magnetic states of the ferromagnetic film 11 at P3' and P3 where the magnetic fields $H_{BL}$ of the same magnitude are applied are indicated by solid and dotted arrows, respectively. In FIG. 7C, the magnetic states of the soft ferromagnetic film 13 at P4' and P4 where the magnetic fields $H_{BL}$ of the same magnitude are applied are indicated by solid and dotted arrows, respectively. In FIG. 7D, the magnetic states of the ferromagnetic film 11 at P4' and P4 where the magnetic fields $H_{BL}$ of the same magnitude are applied are indicated by solid and dotted arrows, respectively.

At P3', since magnetization directions of the central portions of the ferromagnetic film 11 and soft ferromagnetic film 13, which are separated from the edge portions, are parallel along the edge of the data transfer line relative to that in the state P3, the direction of magnetization can be changed from the negative direction to the positive direction with a smaller magnetic field $H_{BL}$. When the magnitude of the magnetic field $H_{BL}$ is increased in the positive direction, to exceed the magnitude $H_a$, the magnetization direction of the ferromagnetic film 11 changes from downward to upward, whereby the state P3' transits to the state P4'. In the state P4', since the magnetization directions of the ferromagnetic film 11 and soft ferromagnetic film 13 at the central portions, which are separated from the edge portions, are set parallel, the resistance $R_{BL}$ of the data transfer line decreases.

To write data "0" in a memory cell, it is necessary to pass a current of an appropriate magnitude through the data transfer line 10, thereby applying the magnetic field $H_{BL}$ having a magnitude larger than $H_a$ and smaller than $H_{K1}$ while passing a current through the data selection line 22 so as to apply the magnetic field $H_{WL}$ of the positive direction to the memory cell. As a result, the magnetization directions of the soft ferromagnetic film 13 and ferromagnetic film 11 at the central portions in the memory cell are set upward and parallel to each other (P4' in FIG. 6).

To write data "1" in a memory cell, a current in the negative direction is supplied to the data transfer line 10 corresponding to the memory cell, thereby applying the magnetic field $H_{BL}$ of a magnitude between $-H_{K1}$ and $-H_b$ in the negative direction (downward in FIG. 1A) while passing a current through the data selection line 22 coupled to the memory cell to apply the magnetic field $H_{WL}$ in the positive direction to the memory cell. As a consequence, the magnetization direction of the soft ferromagnetic film 13 and ferromagnetic film 11 are set downward and parallel to each other at the central portion of the memory cell.

The magnitude of the current supplied to the data selection line 22 is adjusted such that the magnitude of the magnetic field $H_{WL}$ becomes almost 0 on any of memory cells coupled to unselected data selection lines. Since the magnitude of the magnetic field $H_{BL}$ generated by the data transfer line 10 is set to be smaller than $-H_{K1}$ and larger than $-H_b$, the magnetization direction of the ferromagnetic film 11 in the memory cell applied with the magnetic field $H_{WL}$ changes. However, in memory cells where the magnitude of the magnetic field $H_{WL}$ is almost zero, the magnetization direction of the ferromagnetic film 11 does not change. Hence, in the selected memory cell coupled to the selected data selection line generating the magnetic field $H_{WL}$, the magnetization direction of the ferromagnetic film 11 changes. On the other hand, in memory cells corresponding to the unselected data selection lines, the magnetization directions of the ferromagnetic films 11 do not change.

Therefore, assuming that a plurality of memory cells are connected to a data transfer line, data can be selectively written in only a desired memory cell using the data selection line, so the data is not erroneously written in cells other than the target memory cell.

In the write operation of the present invention, the current to the data selection line need be flowed in only one direction.

READ OPERATION

The read operation of the present invention will be described next.

In the read mode, a current in the positive direction is supplied to the data selection line 22 connected to a selected memory cell, to form the magnetic field $H_{WL}$ in the positive direction. The magnitude of the current is adjusted such that the magnetic field $H_{WL}$ to be applied is almost zero on any of memory cells connected to unselected data selection lines 22.

Figure 8:
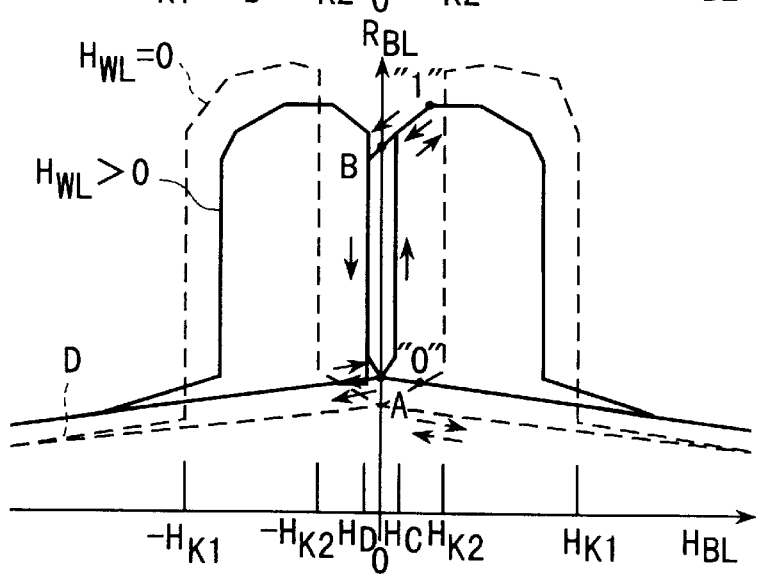
FIG. 8 is a graph showing the resistance $R_{BL}$ of the data transfer line as a function of the magnetic field $H_{BL}$ where the applied magnetic field $H_{WL}$ is zero or a positive magnetic field.

FIG. 8 shows change of the resistance $R_{BL}$ of the data transfer line 10 depending on the magnetic field $H_{BL}$ in the cases that the magnetic field $H_{WL}$ is 0 and positive ($H_{K2}$>$H_{WL}$>0). Referring to FIG. 8, arrows represent the course of changes of the magnetic fields in the read operation. As described in relation to the write operation, when the magnetic field $H_{WL}$ is applied, the magnetization direction can be reversed by a smaller magnetic field. Because of this effect, when the magnetic field $H_{BL}$ is in the positive direction (upward in FIG. 1A), the magnitude of magnetic field sufficient for inverting magnetization of the soft ferromagnetic film 13 is $H_C$ smaller than $H_{K2}$. When the magnetic field $H_{BL}$ is in the negative direction (downward in FIG. 1A), the magnitude of the magnetic field is $H_D$ whose absolute value is smaller than that of $-H_{K2}$ (sign "−" represents a magnetic field in the negative direction).

When data is to be read, a current is supplied to the data selection line to generate the magnetic field $H_{WL}$ in the positive direction, and a current is supplied to the data transfer line to induce the magnetic field $H_{BL}$ of a magnitude between $H_C$ and $H_{K2}$. The magnitude of magnetic field $H_{BL}$ is less than $H_{K2}$ at which the magnetization directions of the ferromagnetic films 13 are inverted in unselected memory cells, the data stored in the unselected memory cells are not destructed due to the read operation.

When data "0" is written, the magnetic state changes from point A to point "0" in FIG. 8. The state at the point "0" corresponds to the magnetic state shown in FIGS. 7C and 7D, so magnetization of the soft ferromagnetic film 13 is kept directed to the upper right side. Since the magnetization directions of the soft ferromagnetic film 13 and ferromagnetic film 11 are directed to the upper right side at the central portion, the resistance of the data transfer line is reduced.

When data "1" is to be written to a memory cell, the magnetic state changes from point A to point "1". At the point "1", the magnetic field $H_{BL}$ of a magnitude greater than $H_C$ is applied to the memory cell, thereby to change the direction of magnetization of the soft ferromagnetic film 13 from the lower right side to the upper right side. The magnetic states are shown in FIGS. 7A and 7B. Since the directions of magnetization of the soft ferromagnetic film 13 and ferromagnetic film 11 are directed to the upper right side and lower right side at the central portions, respectively, and the angle made by magnetization of the soft ferromagnetic film 13 with that of the ferromagnetic film 11 is larger than that at point "0", the resistance of the data transfer line 10 becomes higher than that in the "0" state.

The current passing selected data selection line 22 is adjusted such that the magnitude of magnetic field $H_{WL}$ becomes almost 0 on memory cells on unselected data selection lines 22, while a current is supplied to data transfer line 10 so as to apply the sense magnetic field $H_{BL}$ within the range of $H_{K2}$ to $H_C$ to the memory cells on the data transfer line 10. With this operation, in a memory cell storing data "1" and being connected to the unselected data selection line, no magnetization inversion occurs because the applied magnetic field $H_{BL}$ is smaller than $H_{K2}$. Thus, magnetization of the soft ferromagnetic film 13 is kept directed to the lower right side. Since the magnetization directions of the soft ferromagnetic film 13 and ferromagnetic film 11 are directed to the lower right direction at the central portion, the resistance of the data transfer line is low. On the other hand, in memory cells storing data "0" and being connected to the unselected data selection lines, the directions of magnetization of the soft ferromagnetic films 13 and ferromagnetic films 11 are directed to the upper right direction at the central portions, and the resistance of the data transfer line is small.

For memory cells connected to the unselected data selection lines, the output difference between a memory cell storing data "0" and a memory cell storing data "1" is smaller than those connected to the selected data selection line. Hence, even when a plurality of memory cells are cascade-connected to the selected data transfer line 10, data can be selectively read from a selected memory cell using the data selection line. In this read operation, a unidirectional current to the data selection line is available, and the direction of a current passing the data selection line can be the same as that in the write operation.

In the above mentioned read operation, the magnitude of magnetic field $H_{BL}$ is less than $H_{K2}$ at which the magnetization directions of the ferromagnetic films 13 are inverted in unselected memory cells, the data readout can be achieved without destructing data stored in the unselected memory cells.

When the magnetic coupling between the soft ferromagnetic film 13 and ferromagnetic film 11 is weak, in the read of data "1", the direction of magnetization of the soft ferromagnetic film 13 changes from the lower right direction to the upper right direction. Even when the magnetic field $H_{BL}$ is decreased to 0, the magnetic state returns to the state B in FIG. 8, and the high-resistance state is maintained. Due to this, the resistance largely varies depending on data "0" or data "1".

Consider a case that after data "1" is read out from a memory cell, data is to be read from another memory cell connected to the common data transfer line. When a plurality of memory cells are cascade-connected to each data transfer line, the series resistance value changes due to the previously read-accessed memory cell, so that the read margin should be decreased.

In the read operation of data "1", it is preferable to restore the magnetic state of the read-accessed memory cell by changing the direction of magnetization of the soft ferromagnetic film 13 from the upper right direction to the lower right direction, for example, by supplying a current to the data transfer line so as to generate the magnetic field $H_{BL}$ within the range of $-H_{K2}$ to $H_D$.

As is apparent from described above, in this embodiment, a memory cell connected to the data line can be selected by passing a current in one direction to the data selection line, and the read/write operation can be performed by controlling the current direction in the data transfer line.

MEMORY CELL MATRIX

It will be described down below that data can be read out from and written in memory cells of the present invention, arranged in a matrix containing a plurality of data transfer lines each connecting a column of memory cells in series, and a plurality of data selection lines each connecting a row of memory cells in series, and that an output larger than that in the prior art can be obtained.

Figure 9A:
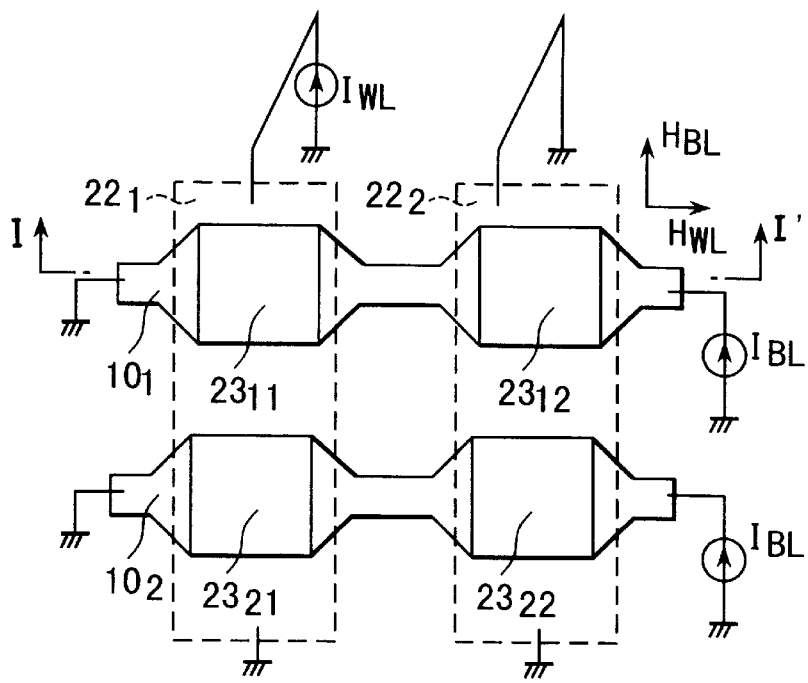
FIGS. 9A to 9C are views showing the structure of a memory matrix according to the first embodiment.
Figure 9B:
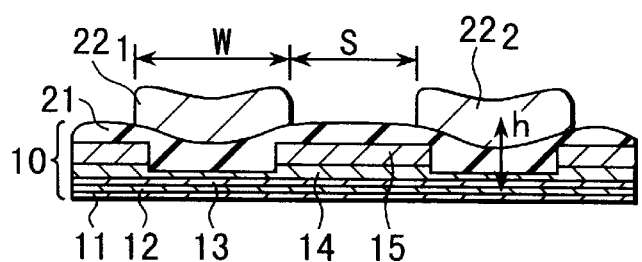
Figure 9C:
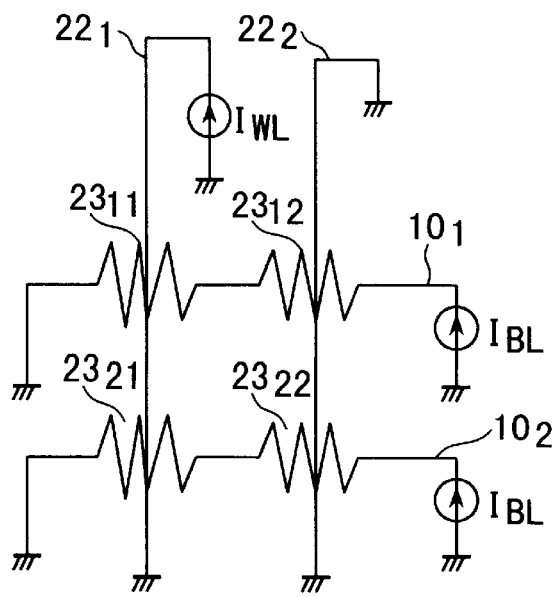

FIGS. 9A to 9C are views showing an example of memory cell matrix using the memory cells of the first embodiment. FIG. 9A is a plan view showing the layout of the memory cell matrix. FIG. 9B is a sectional view taken along a line I–I' in FIG. 9A. FIG. 9C is a circuit diagram corresponding to FIG. 9A.

In this example, memory cells $23_{11}$, $23_{12}$, $23_{21}$, and $23_{22}$ are formed at the intersections between two data transfer lines $10_1$ and $10_2$ and two data selection lines $22_1$ and $22_2$. The data selection line $22_1$ is a data selection line selected by being connected to a current source $I_{WL}$ and generates the magnetic field $H_{WL}$ in the positive direction on the memory cells $23_{11}$ and $23_{21}$. The data selection line $22_2$ is an unselected data selection line which is not connected to any current source.

Current sources $I_{BL}$ are connected to the data transfer lines $10_1$ and $10_2$ to selectively write/read data in/from the memory cells $23_{11}$ and $23_{21}$, respectively. In this case, it is necessary to prevent erroneous write or read, or data destruction with respect to the memory cells $23_{12}$ and $23_{22}$ connected to the unselected data selection line $22_2$.

Extensive examination of the magnetic field condition in the operation of a magnetic memory cell according to the prior art has revealed that there is a problem that a sufficient output power cannot be gained when the absolute value of the current supplied to the data selection line in the data readout operation is set to be equal to or smaller than the absolute value of the current supplied in the write operation. In the following description, for simplification, it is assumed that when the current supplied to the data selection line is 0 in magnitude, the bias magnetic field along the magnetic field $H_{WL}$ is sufficiently smaller than $H_K$ of equation (8), when the current flowed to the data transfer line is 0, the bias magnetic field along the magnetic field $H_{BL}$ is sufficiently smaller than $H_K$ of equation (8). Thus, in the following, the effect that the magnetization direction of the data transfer line at the edge portion is oriented in the longitudinal direction of the data transfer line is so small that it can be neglected. The arrangement of the memory cells of prior art 1 can be the same as that shown in FIG. 9A.

Figure 10A:
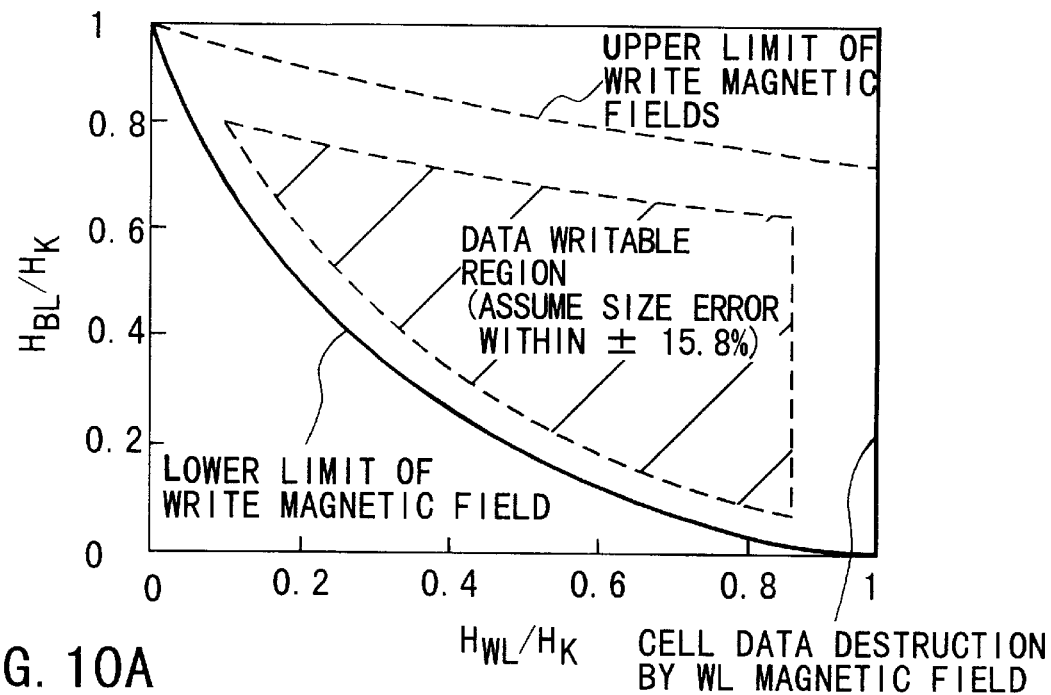
FIGS. 10A and 10B are graphs showing the usable regions defined by magnetic fields $H_{BL}$ and $H_{WL}$ in read and write operations in the prior art.

Firstly, it will be explained that in the arrangement of prior art 1, the change in resistance in the read operation is of very small amount. Conditions regarding the magnetic fields $H_{BL}$ and $H_{WL}$ are shown in FIG. 10A. Referring to FIG. 10A, the horizontal axis represents the magnetic field $H_{WL}$ normalized by the anisotropic magnetic field $H_K$ of the ferromagnetic film 11 and ferromagnetic film 13, and the vertical axis represents the magnetic field $H_{BL}$ normalized by the magnetic field $H_K$.

The hatched area in FIG. 10A represents conditions on which stable data write in a memory cell is possible even when the magnetic fields $H_{WL}$ and $H_{BL}$ have an error of ±15.8% due to structural variations or variations in current or resistance of the current source. The hatched area is defined by the following three conditions:

The first condition is the lower limit of the magnitudes of the magnetic fields $H_{WL}$ and $H_{BL}$ capable of inverting the magnetization directions of the ferromagnetic film 11 and ferromagnetic film 13 at the central portions. This condition is obtained from equation (8). If the magnitudes of the magnetic fields are equal to or smaller than the lower limit, the magnetization directions of the ferromagnetic film 11 and ferromagnetic film 13 are not inverted, so data write cannot be made.

The second condition is the upper limit of the magnitude of the magnetic field $H_{WL}$. When the magnitude of the magnetic field $H_{WL}$ generated by the data selection line 22 is larger than magnitude $H_K$, the magnetic field $H_{BL}$ for causing switching of magnetization becomes zero, and information stored in the memory cell 23 is lost. Hence, the magnitude of the magnetic field $H_{WL}$ should be smaller than $H_K$.

The third condition is the upper limit of the magnitudes of the magnetic fields $H_{WL}$ and $H_{BL}$. If the magnetic field $H_{WL}$ generated by the selected data selection line $22_1$ influences the adjacent memory cells $23_{12}$ and $23_{22}$, erroneous data may be written in those memory cells.

In FIG. 9B, w represents the width of the data selection line 22, s represents the spacing between the data selection lines, and h represents the distance from the data selection line 22 to the center of the data transfer line 10 in the memory cell portion. When the magnetic field $H_{WL}$ is generated at the central portion of the selected memory cell $23_{11}$ by the current passing the data selection line $22_1$, the magnitude of the magnetic field on memory cell $23_{12}$ is $wh/\pi\{h^2+(w+s)^2\}$ times the magnitude of the magnetic field at the central portion of the cell $23_{11}$.

FIG. 10A shows a result obtained when h=0.45 μm, w=0.6 μm, and s=0.4 μm. In this case, a magnetic field as large as 0.07 times the magnetic field $H_{WL}$ is applied to adjacent unselected memory cells. On the basis of equation (8), the condition for preventing any erroneous write is obtained as $H_{BL}^{2/3}+(0.07H_{WL})^{2/3}<H_K^{2/3}$.

In prior art 1, to flow a read current in the data selection line 22 in the direction opposed to a write current, the read operation needs a current larger than that in the write operation, as described in "Background of the Invention".

Figure 10B:
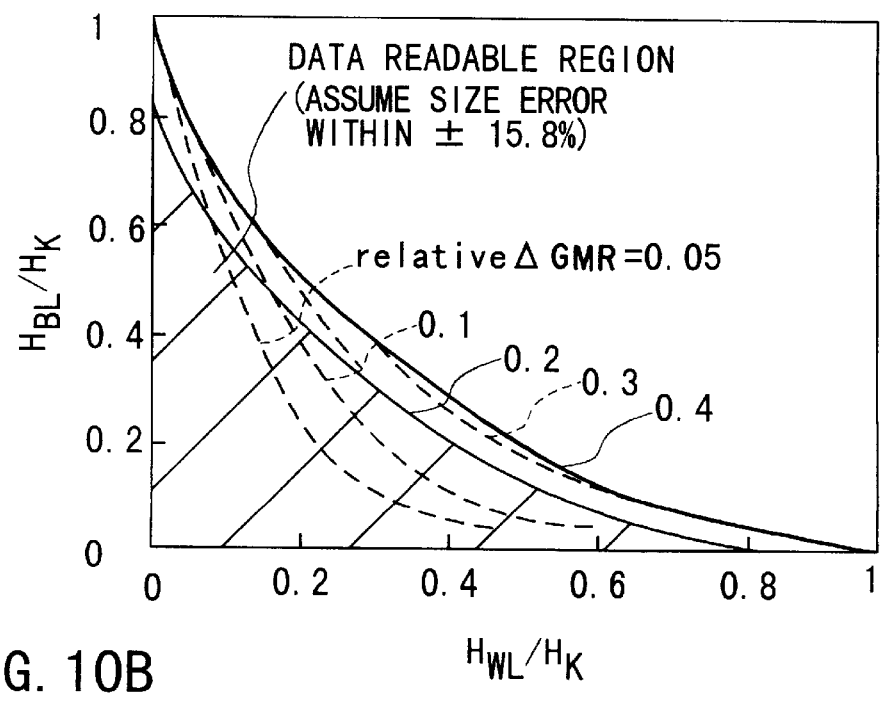

When the arrangement of prior art 1 is used, and a read current and a write current in the same direction in the data selection line 22, the read signal amount is small. This will be explained with reference to FIG. 10B. FIG. 10B shows the restriction regions of the magnetic fields $H_{BL}$ and $H_{WL}$ in the read. The abscissa represents the magnetic field $H_{WL}$ normalized by the anisotropic magnetic field $H_K$ of the ferromagnetic film 11 and ferromagnetic film 13, and the ordinate represents the magnetic field $H_{BL}$ normalized by the magnetic field $H_K$.

FIG. 10B shows conditions on which stable data read from a memory cell can be performed even when the magnetic fields $H_{WL}$ and $H_{BL}$ have an error of ±15.8% due to structural variations or variations in current or resistance of the current source. Such conditions are represented by a hatched area.

In the hatched area, there are provided dotted lines each of which indicates as a read signal amount ΔGMR, which means a change amount in the resistance value of a memory cell between the antiparallel state and the parallel state. The read signal amount ΔGMR is normalized by a change amount from the resistance value when the directions of magnetization of the ferromagnetic film 11 and ferromagnetic film 13 are in the antiparallel state to that in the parallel state, i.e., the maximum signal output. Letting θ be the angle made by the directions of magnetization of the ferromagnetic film 11 and ferromagnetic film 13, $\Delta GMR=\sin^2(\theta/2)$.

As is seen from FIG. 10B, in prior art 1, when a variation of ±15.8% is taken into consideration, ΔGMR should be about 0.2 or less on the condition for stable data read from the memory cell (in the hatched area). For this reason, in prior art 1, a large read output cannot be available.

Figure 11A:
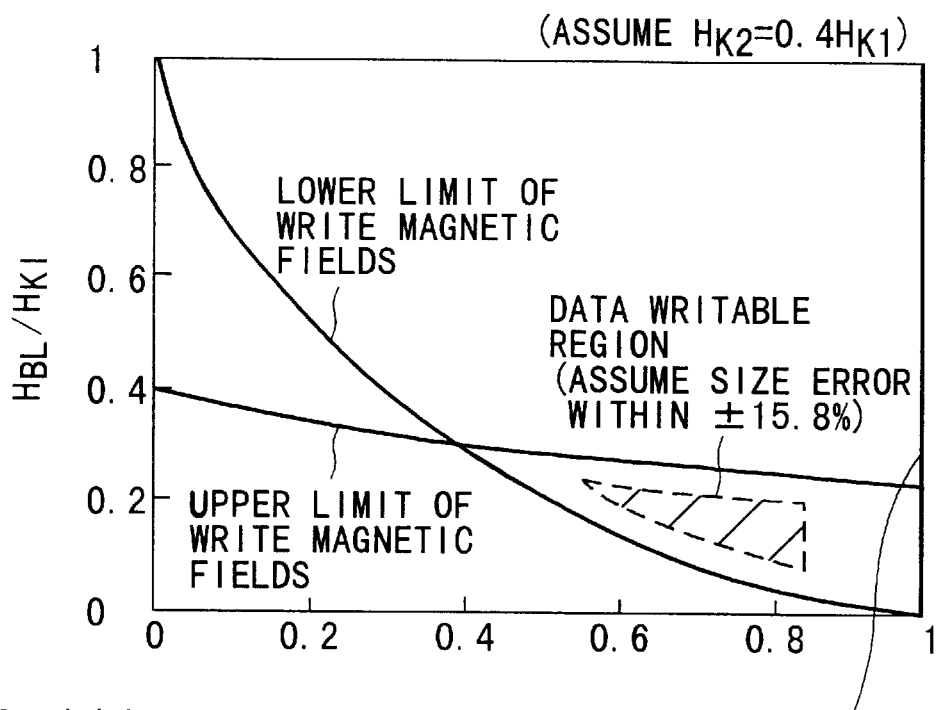
FIGS. 11A and 11B are graphs showing usable regions defined by magnetic fields $H_{BL}$ and $H_{WL}$ preferable in read and write operations in the first embodiment.

On the contrary, in the first embodiment according to the present invention, a large read signal amount ΔGMR can be ensured. This will be described below. FIG. 11A shows conditions regarding the magnetic fit $H_{BL}$ and $H_{WL}$ available for the write operation. The anisotropic magnetic field of the soft ferromagnetic film 13 is represented by $H_{K2}$, and that of the ferromagnetic film 11 is represented by $H_{K1}$. Assume that $H_{K1}=0.4H_{K2}$.

Referring to FIG. 11A, the horizontal axis represents the magnetic field $H_{WL}$ normalized by the anisotropic magnetic field $H_{K1}$ of the ferromagnetic film 11, and the vertical axis represents the magnetic field $H_{BL}$ normalized by the magnetic field $H_{K1}$. The hatched area represents conditions on which stable data write in a memory cell can be performed even when the magnetic fields $H_{WL}$ and $H_{BL}$ have an error of ±15.8% due to structural variations or variations in current or resistance of the current source.

The data writable region is defined by the same three conditions as those in prior art 1.

Figure 11B:
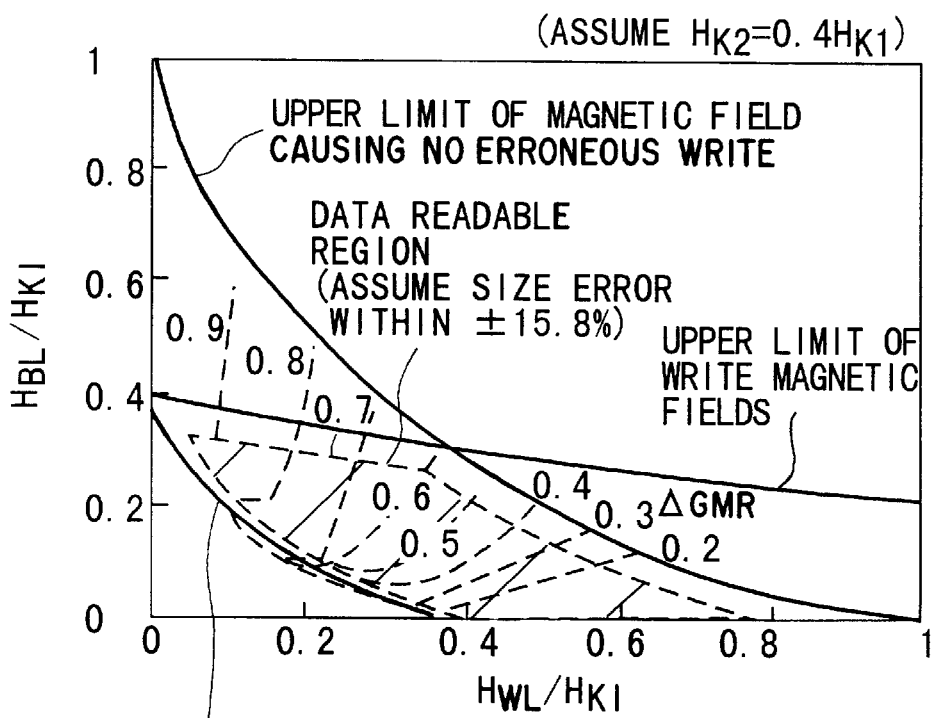

The read margin of the magnetic storage device of the first embodiment will be described next. FIG. 11B shows the conditions concerning the magnetic fields $H_{BL}$ and $H_{WL}$ suitable for readout operation. The abscissa represents the magnetic field $H_{WL}$ normalized by the anisotropic magnetic field $H_{K1}$ of the ferromagnetic film 11, and the ordinate represents the magnetic field $H_{BL}$ normalized by the magnetic field $H_{K1}$.

In FIG. 11B, the hatched area represents conditions on which stable data read from a memory cell can be performed even when the magnetic fields $H_{WL}$ and $H_{BL}$ have an error of ±15.8% due to structural variations or variations in current or resistance of the current source.

The cell readable region is defined by three conditions. One condition is the upper limit of the magnetic fields not reversing the direction of magnetization of the ferromagnetic film 11 and is represented by $H_{BL}^{2/3}+H_{WL}^{2/3}<H_{K1}^{2/3}$. If the magnitude exceeds the upper limit, magnetization of the ferromagnetic film 11 is inverted to cause an erroneous write in the read.

The second condition is the lower limit of the magnitudes of magnetic fields for reversing the direction of magnetization of the soft ferromagnetic film 13, which is necessary for read from the selected memory cell. To reverse the direction of magnetization of the soft ferromagnetic film 13 at the selected memory cell, $H_{BL}^{2/3}+H_{WL}^{2/3}>H_{K2}^{2/3}$ must be satisfied.

The third condition is the upper limit of the magnitudes of the magnetic fields because the magnetic field formed by the selected data selection line 22 causes magnetic fields along the magnetic field $H_{WL}$ in the adjacent memory cells $23_{12}$ and $23_{22}$, and magnetization of the soft ferromagnetic film 13 is inverted to cause an erroneous read in those adjacent memory cells.

Under the same conditions as in the write operation, a magnetic field having a magnitude as large as 0.07 times the magnitude of the magnetic field $H_{WL}$ at the central portion of the selected memory cell is formed on adjacent unselected memory cells. To prevent any erroneous read from adjacent memory cells in the direction of the data transfer line, $H_{BL}^{2/3}+(0.07H_{WL})^{2/3}<H_{K2}^{2/3}$ must hold.

In FIG. 11B, in the cell readable region defined by the above three conditions, dotted lines represent read signal amounts ΔGMR, change amounts in the resistance value with reference to the resistance value in the parallel state as the data holding state. The read signal amount ΔGMR is normalized by a change amount from the resistance value when the directions of magnetization of the ferromagnetic film 11 and soft ferromagnetic film 13 are in the parallel state to that in the antiparallel state, i.e., the maximum signal output. Letting θ be the angle made by the directions of magnetization of the ferromagnetic film 11 and soft ferromagnetic film 13, $\Delta GMR = \sin^2(\theta/2)$.

As is apparent from FIG. 11B, in the arrangement of the present invention, when $H_{BL}/H_{K1}=0.2$, and $H_{WL}/H_{K1}=0.2$, the read signal amount $\Delta GMR$ can be set to be 0.7 or more under the conditions that stable data read from a memory cell can be performed even in consideration of a variation of ±15.8%, so a larger read output than that in the prior art can be obtained.

In addition, as is apparent from FIGS. 11A and 11B, under the condition of $H_{BL}/H_{K1}=0.2$, the write operation can be performed by setting $H_{WL}/H_{K1}=0.8$, the read operation can be performed by setting $H_{WL}/H_{K1}=0.2$. In short, the data read and write operations can be realized using binary current sources for current supplied to the data transfer line and for current supplied to the data selection line. Hence, the current driving circuits for the data transfer lines and data selection lines can be simplified.

MEMORY CELL ARRAY AND READ/WRITE CIRCUITS

A memory matrix formed using the above memory cells according the present invention and a circuit arrangement for reading/writing data from/in the memory cell matrix will be described next.

Figure 12:
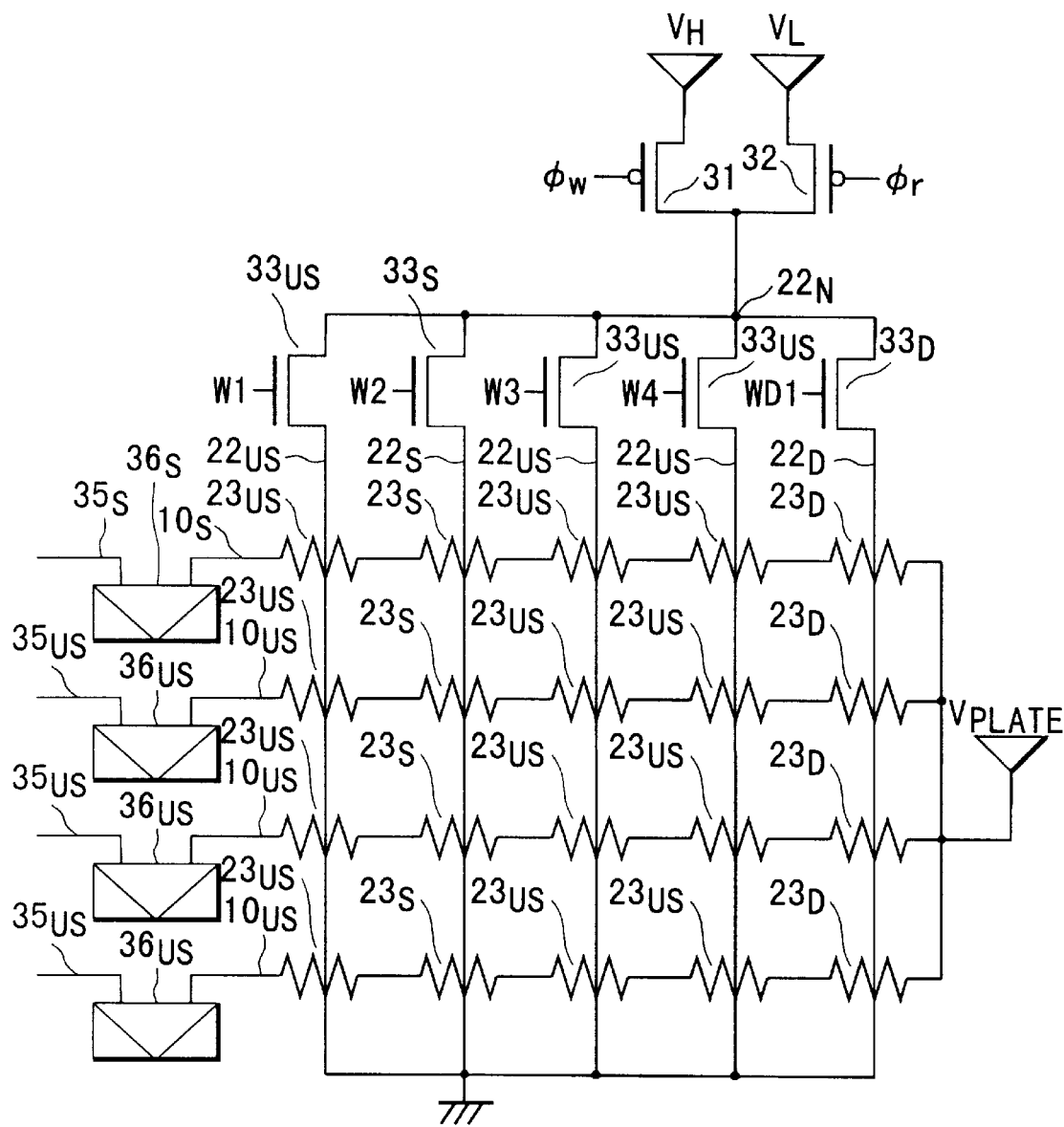
FIG. 12 is a view showing a circuit arrangement including a memory matrix according to the first embodiment.

FIG. 12 is a circuit diagram including a matrix of memory cells according to the present invention. The same reference numerals as in FIGS. 9A to 9C denote the same parts in FIG. 12, and a detailed description thereof will be omitted.

Referring to FIG. 12, memory cells 23 ($23_S$ and $23_{US}$) are formed at intersections between four data transfer lines 10 ($10_S$ and $10_{US}$) and four data selection lines 22 ($22_S$ and $22_{US}$). In addition, each of the four data transfer lines 10 has one dummy memory cell $23_D$.

The data selection line $22_S$ represents a selected data selection line 22, which selectively writes/reads data in/from the memory cells $23_S$ connected to the data selection line $22_S$. The data selection lines $22_{US}$ represents unselected data selection lines. As discussed in the following, for the memory cells $23_{US}$ connected to the unselected data selection lines $22_{US}$, a circuit arrangement and timing adjustment for preventing any erroneous write or read or data destruction are required.

One terminal of each data selection lines 22 ($22_S$ and $22_{US}$) is connected to one terminal of the source/drain electrode of a corresponding one of transistors 33 ($33_S$ and $33_{US}$) The gate electrodes of the transistors 33 are connected to voltage nodes W (W1 to W4), respectively. The voltage nodes W are connected to a so-called address decoder to exclusively and selectively supply a current to a selected data selection line $22_S$. For the address decoder, a well-known circuit for a DRAM or an SRAM may be used. The other terminal of each of the data selection lines 22 is connected to a voltage supply node set at, e.g., 0V.

The other terminal of the source/drain electrode of each transistor 33 is connected to a current supply node $22_N$. The current supply node $22_N$ is connected to one terminal of the source/drain electrode of a transistor 31. The other terminal of the source/drain electrode of the transistor 31 is connected to a voltage node $V_H$ for supplying, e.g., a positive potential. The voltage node $V_H$ supplies a sufficient data selection line current to write data in a selected memory cell. The supplied voltage is equal to, e.g., a power supply voltage $V_{DD}$ or one to three times larger than the power supply voltage $V_{DD}$.

The current supply node $22_N$ is connected to one terminal of the source/drain electrode of a transistor 32. The other terminal of the transistor 32 is connected to a voltage node $V_L$ for supplying a positive voltage. The voltage node $V_L$ supplies a sufficient data selection line current to read data from a memory cell. The supplied voltage of $V_L$ may be, e.g., within the range of 0V and the power supply voltage $V_{DD}$.

The transistors 31 and 32 are preferably p-type MISFETs because the voltage at the current supply node $22_N$ does not drop due to the threshold value from the voltage node $V_H$ or $V_L$ when the current supply node $22_N$ is being charged.

One terminal of each data transfer line 10 is connected, through the memory cells $23_S$ and $23_{US}$ and dummy memory cell $23_D$, which are connected in series, to a voltage source $V_{plate}$ for supplying a voltage $V_{plate}$. The other terminal of each data transfer line 10 is connected to a corresponding one of differential sense amplifiers 36 ($36_S$ and $36_{US}$). Data transfer lines 35 ($35_S$ and $35_{US}$) respectively paired with the data transfer lines 10 are connected to the differential sense amplifiers 36.

The differential sense amplifiers $36_{US}$ and data transfer lines $10_{us}$ and $35_{US}$ are connected in parallel to the differential sense amplifier $36_S$ and data transfer lines $10_S$ and $35_S$ and can be operated in the same manner as the differential sense amplifier $36_S$ and data transfer lines $10_S$ and $35_S$. Alternatively, only the selected data transfer lines $10_S$ and $35_S$ can be operated.

In the circuit arrangement shown in FIG. 12, the four memory cells 23 are connected to each of the four data transfer lines 10, to provide a 4×4 memory cell array. A dummy memory cell $23_D$ is connected to each data transfer line 10. The number of data transfer lines 10 and the number of memory cells 23 connected to each data transfer line 10 are not limited to four, and a plurality of data transfer lines or memory cells suffice. The number is preferably $2^n$ (n is a positive integer) in view of address decoding operation.

Figure 13:
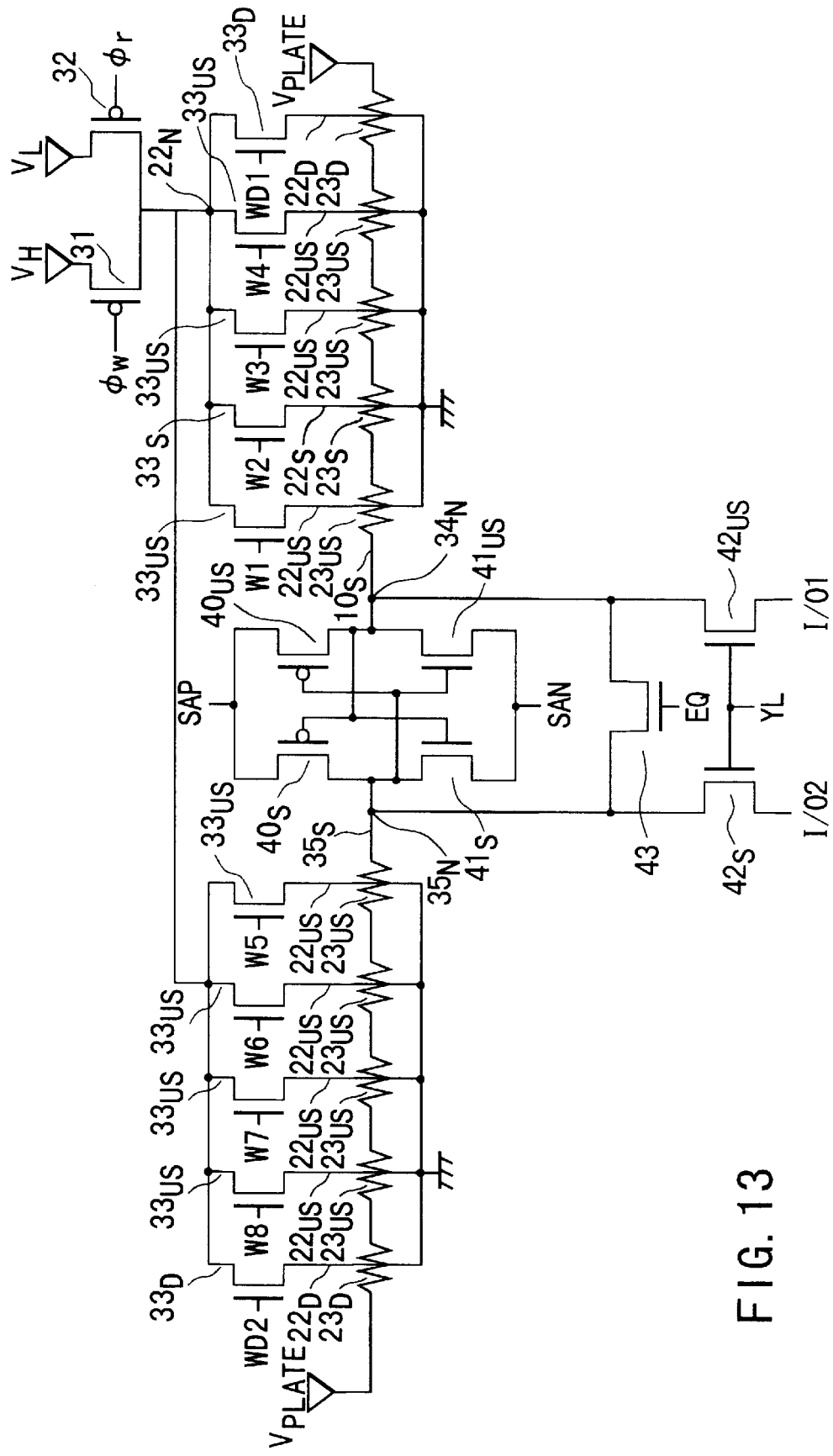
FIG. 13 is a view showing in detail a part of the circuit arrangement in FIG. 12.

FIG. 13 is a circuit diagram showing the pair of data transfer lines $10_S$ and $35_S$ and corresponding one of differential sense amplifiers $36_S$ in FIG. 12. The same reference numerals as in FIG. 12 denote the same parts in FIG. 13, and a detailed description thereof will be omitted.

Referring to FIG. 13, the unselected data transfer lines $10_{US}$ and $35_{US}$ and differential sense amplifiers $36_{US}$ which are formed in parallel like the data transfer lines $10_S$ and $35_S$ and differential sense amplifiers $36_S$, are omitted for the illustrative convenience.

The differential sense amplifier 36 comprises p-type MISFETs ($40_S$ and $40_{US}$) and n-type MISFETs 41 ($41_S$ and $41_{US}$). One of the source/drain electrodes of the n-type MISFET $41_{US}$ is connected to the data transfer line $10_S$, and the other is connected to a voltage node SAN. The gate electrode of the n-type MISFET $41_{US}$ is connected to the data transfer line $35_S$.

One of the source/drain electrodes of the n-type MISFET $41_S$ is connected to the data transfer line $35_S$, and the other terminal is connected to the voltage node SAN. The gate electrode of the n-type MISFET $41_S$ is connected to the data transfer line $10_S$. These n-type MISFETs $41_S$ and $41_{US}$ provide a so-called cross-coupled amplifier.

One of the source/drain electrodes of the p-type MISFET $40_{US}$ is connected to the data transfer line $10_S$, and the other is connected to the voltage node SAP. The gate electrode of the p-type MISFET $40_{US}$ is connected to the data transfer line $35_S$. The p-type MISFETs $40_S$ and $40_{US}$ provides a so-called cross-coupled amplifier for the data transfer lines $10_S$ and $35_S$.

One of the source/drain electrodes of a MISFET $42_{US}$ is connected to the data transfer line $10_S$, and the other is connected to an external input/output terminal I/O1. One of the source/drain electrodes of a MISFET $42_S$ is connected to the data transfer line $35_S$, and the other is connected to another external input/output terminal I/O2.

The gate electrodes of the MISFETs $42_S$ and $42_{US}$ are connected to a voltage node YL. Connection/disconnection between the external input/output terminals I/O1 and I/O2 and the data transfer lines $10_S$ and $35_S$ can be controlled by changing the voltage at the voltage node YL coupled to the MISFETs $42_S$ and $42_{US}$.

One of the source/drain electrodes of a MISFET 43 is connected to the data transfer line $10_S$, and the other terminal is connected to the data transfer line $35_S$. The gate electrode of the MISFET 43 is connected to a voltage node EQ. When the voltage at the voltage node EQ is changed, the potentials of the data transfer lines $10_S$ and $35_S$ are equalized, and the voltage difference between the data transfer line $10_S$ and data transfer line $35_S$ is decreased.

If the data transfer lines $10_S$ and $35_S$ are connected to a power supply for supplying the voltage $V_{plate}$ at a sufficiently low impedance, and the voltage difference between the data transfer lines poses no problem, the MISFET 43 and voltage node EQ may be omitted.

In this embodiment, the memory cells $23_S$ and $23_{US}$ are connected in series to the sense amplifier circuit and voltage power supply $V_{plate}$ without interposing any transistors. Hence, the embodiment can prevent the read signal margin from decreasing due to a voltage drop according to the channel resistance of a serially connected transistor. In the read, a read current passes through the external input/output terminals I/O1 and I/O2, and little current, if any, flows to the transistor $40_S$, $40_{US}$, $41_S$, or $41_{US}$ of the sense amplifier portion. For this reason, the transistors of the sense amplifier do not cause a voltage drop upon flowing the read current, and the embodiment can prevent the read signal margin from being decreased due to a voltage drop in the sense amplifier.

The dummy memory cells $23_D$ have a resistance change amount equal to or smaller than {(resistance value of memory cell 23 storing "1" during a read sense condition)–(resistance value of memory cell 23 storing "0" during a read sense condition)} when the corresponding data selection line $22_D$ changes from the unselected state to the selected state.

The resistance change amount of the dummy memory cell preferably has a value obtained by adding {(resistance value of a selected memory cell $23_S$ storing "0")–(resistance value of unselected memory cell $23_{US}$ storing "0")} to ½ of {(resistance value of memory cell 23 storing "1" during a read sense condition)–(resistance value of memory cell 23 storing "0" during a read sense condition)}.

Figure 14A:
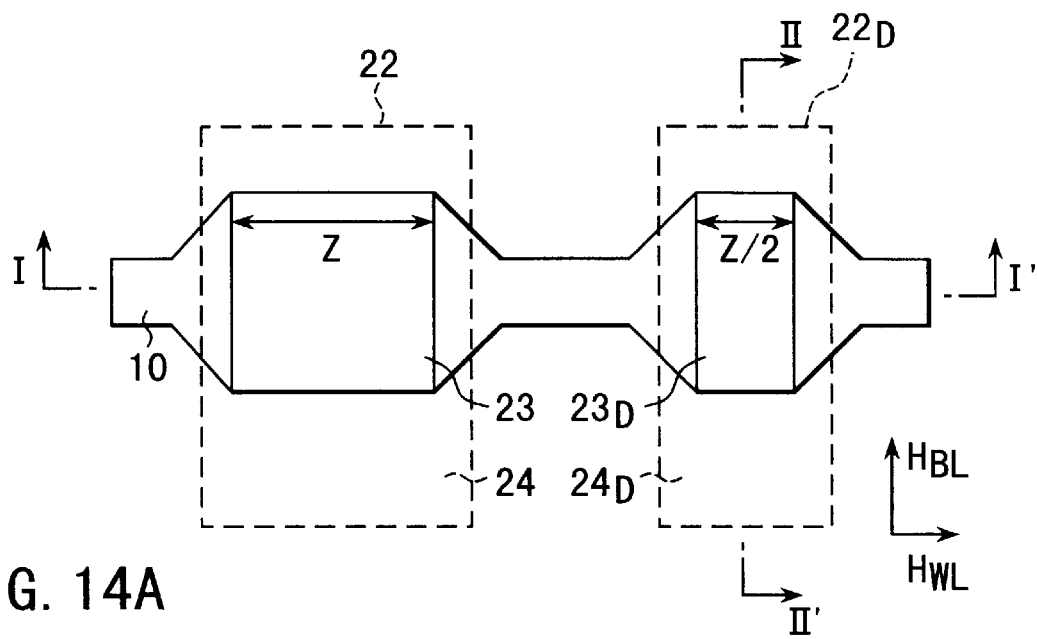
FIGS. 14A to 14C are views showing the structure of a reference cell.
Figure 14B:
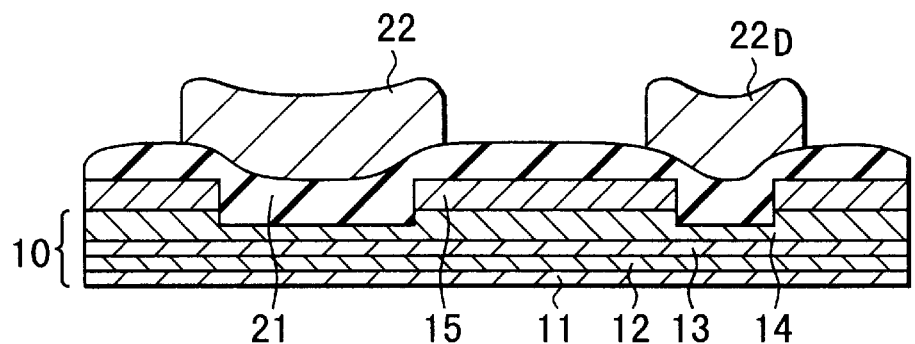
Figure 14C:
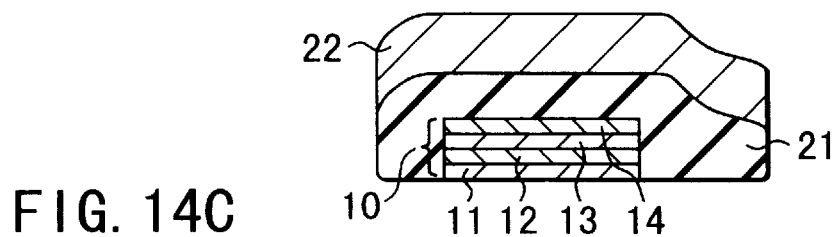

To form the dummy memory cell $23_D$, when the length of the data storage region of the memory cell 23 along the longitudinal direction of the data transfer line 10 is represented by z, the dummy memory cell $23_D$ is formed to have a length z/2, as shown in FIG. 14A. FIG. 14A is a plan view showing the arrangement of the memory cell and dummy memory cell. FIG. 14B is a sectional view taken along a line I–I' in FIG. 14A. FIG. 14C is a sectional view taken along a line II–II' in FIG. 14A.

When the currents supplied to the data selection lines 22 and $22_D$ corresponding to the memory cell 23 and dummy memory cell $23_D$, respectively, are equal in amount, the resistance change amount of a selected dummy memory cell $23_D$, between "1" state and "0" state, has a preferable value, i.e., ½ the resistance change amount of the memory cell 23.

For comparison, an example in which the memory cell 23 and dummy memory cell $23_D$ are cascade-connected to the data transfer line 10 is shown.

Figure 15A:
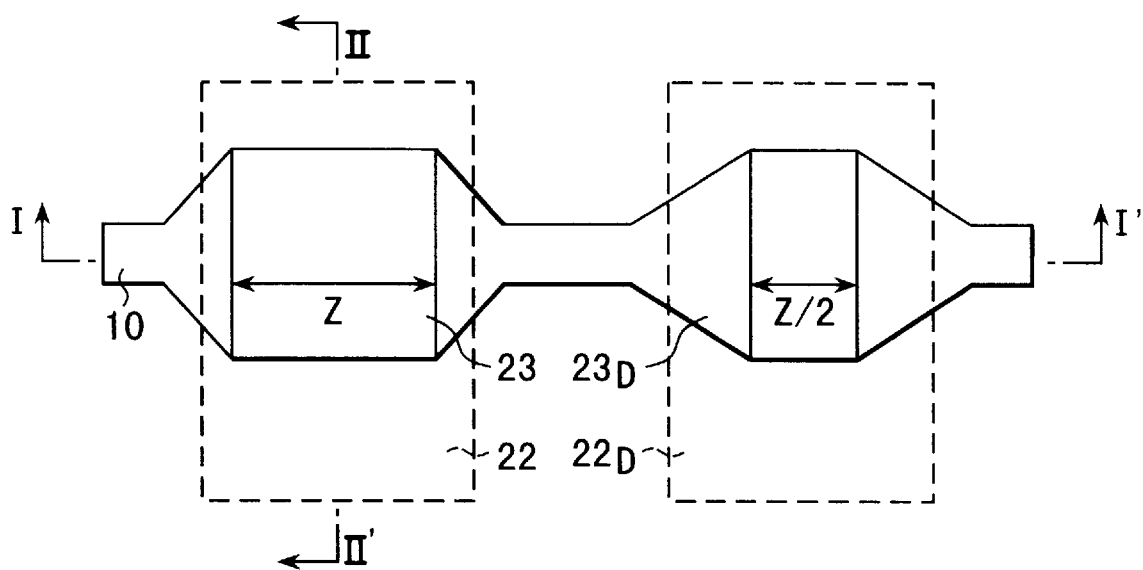
FIGS. 15A to 15C are views showing the structure of another reference cell.
Figure 15B:
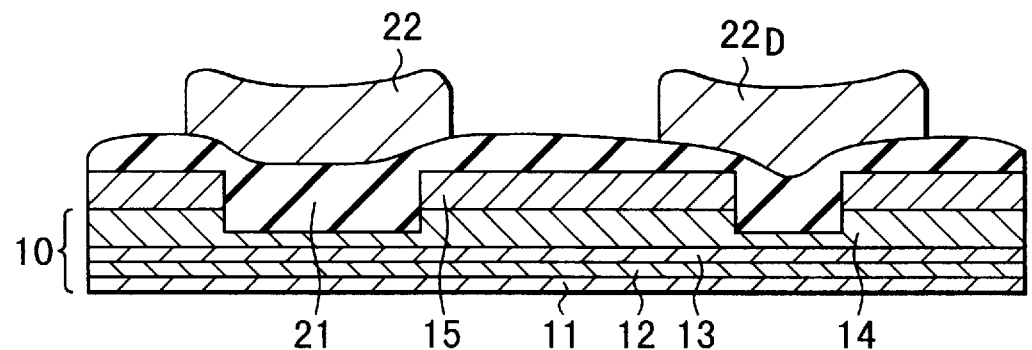
Figure 15C:
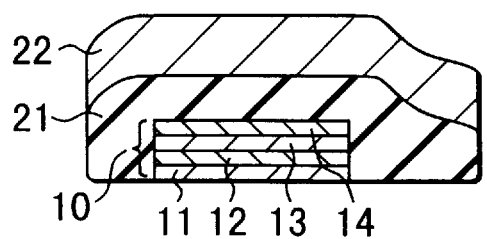

As shown in FIGS. 15A to 15C, the data selection line 22 on the memory cell 23 and the data selection line $22_D$ on the dummy memory cell $23_D$ may be formed to have the same width, and the length of the storage region of the dummy memory cell $23_D$ may be reduced to ½ of the length of the memory cell 23. In this case, when currents are supplied to the data selection lines 22 and $22_D$, equal magnetic fields can be formed by the data selection lines 22 and $22_D$ at almost the same current density, so a preferable form for the reliability of the data selection line $22_D$ is obtained.

FIG. 15A is a plan view showing the arrangement of the memory cell and dummy memory cell. FIG. 15B is a sectional view taken along a line I–I' in FIG. 15A. FIG. 15C is a sectional view taken along a line II–II' in FIG. 15A.

Figure 16A:
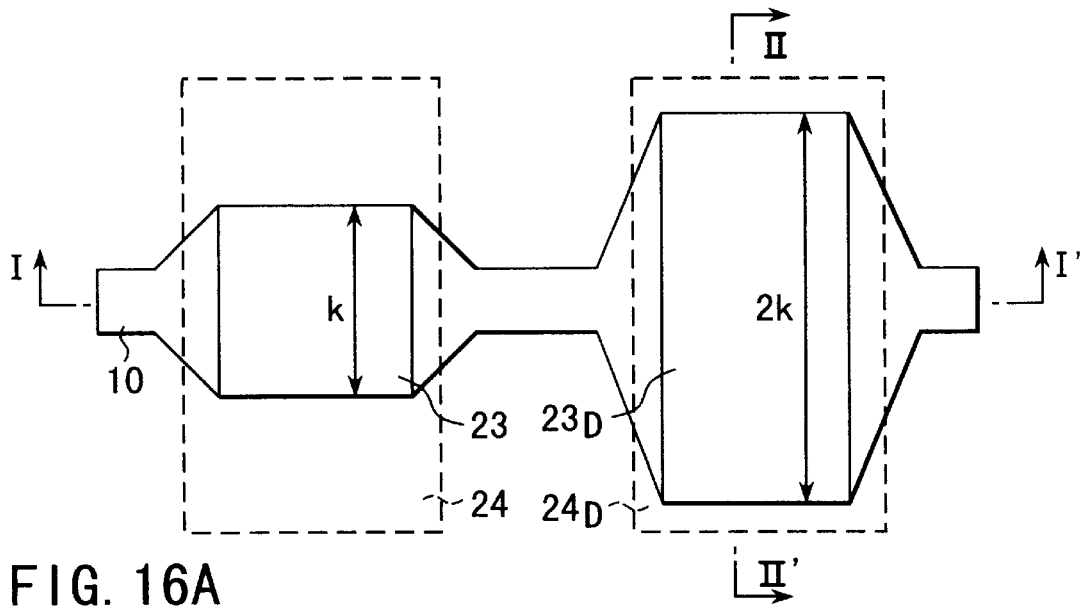
FIGS. 16A to 16C are views showing the structure of still another reference cell.
Figure 16B:
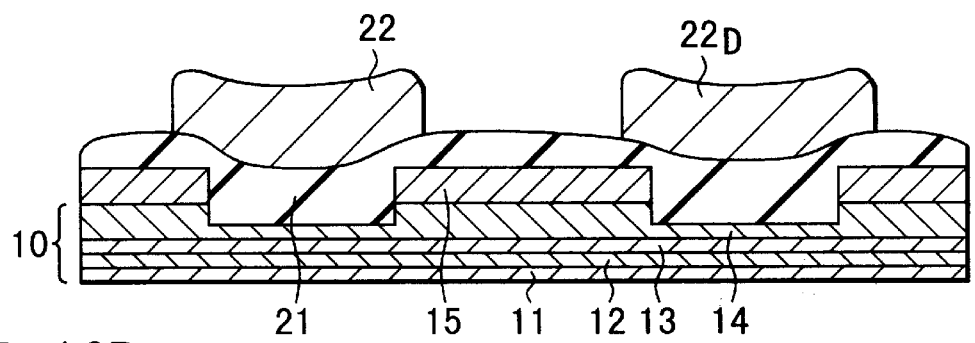
Figure 16C:
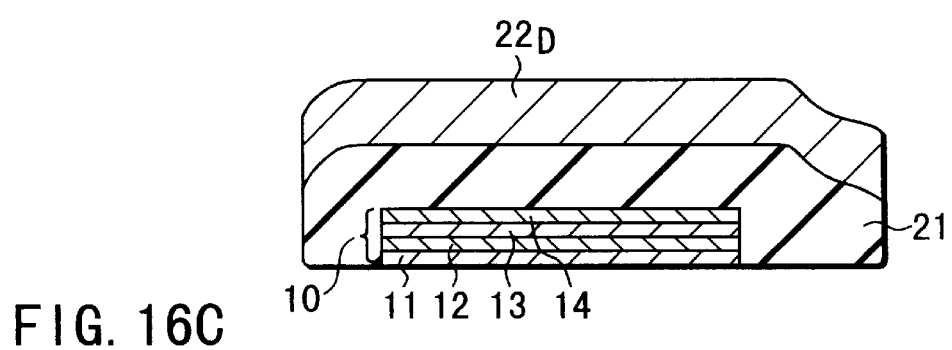

FIGS. 16A to 16C show another arrangement of the dummy memory cell. FIG. 16A is a plan view showing the arrangement of the memory cell and dummy memory cell. FIG. 16B is a sectional view taken along a line I–I' in FIG. 16A. FIG. 16C is a sectional view taken along a line I'I' in FIG. 16A.

When an excess space is present in the direction perpendicular to the longitudinal direction of the data transfer line 10, a memory cell having a width (2k) twice the width k of the memory cell 23 may be formed as the dummy memory cell $23_D$.

In this dummy memory cell $23_D$ as well, when equal currents are flowed to the data selection lines 22 and $22_D$ corresponding to the memory cell 23 and dummy memory cell $23_D$, the resistance change amount of the dummy memory cell $23_D$ between "1" state and "0" state is ½ of the resistance change amount of the memory cell 23 i.e., a preferable value of a dummy memory cell.

In this embodiment, the dummy memory cell $23_D$ can be formed using the same material and structure as those of the memory cell 23. When the differential sense amplifiers and dummy memory cells may compensate for variation in memory cell resistance due to a change in temperature and a change in magnetization curve due to variations in directions of thickness or compositions of the ferromagnetic film 11, nonmagnetic film 12, and soft ferromagnetic film 13, so a more stable memory read operation can be realized.

The magnetization of the ferromagnetic film 11 of the dummy memory cell $23_D$ is set in advance such that the dummy memory cell $23_D$ is set in the same magnetic state as that in reading data "1" from a normal memory cell 23 when a read selection current is flowed to the data selection line $22_D$. To do this, for example, the write operation of data "1" (to be described later) is performed for the dummy memory cell $23_D$.

The dummy memory cell need not necessarily be formed using the same material and structure as those of the memory cell 23, as far as the dummy memory cell has a resistance change amount equal to or smaller than the value {(resistance value of memory cell 23 in "1" state)–(resistance value of memory cell 23 in "0" state)} when the read selection current is flowed to the data selection line $22_D$ on the dummy memory cell $23_D$.

Figure 17:
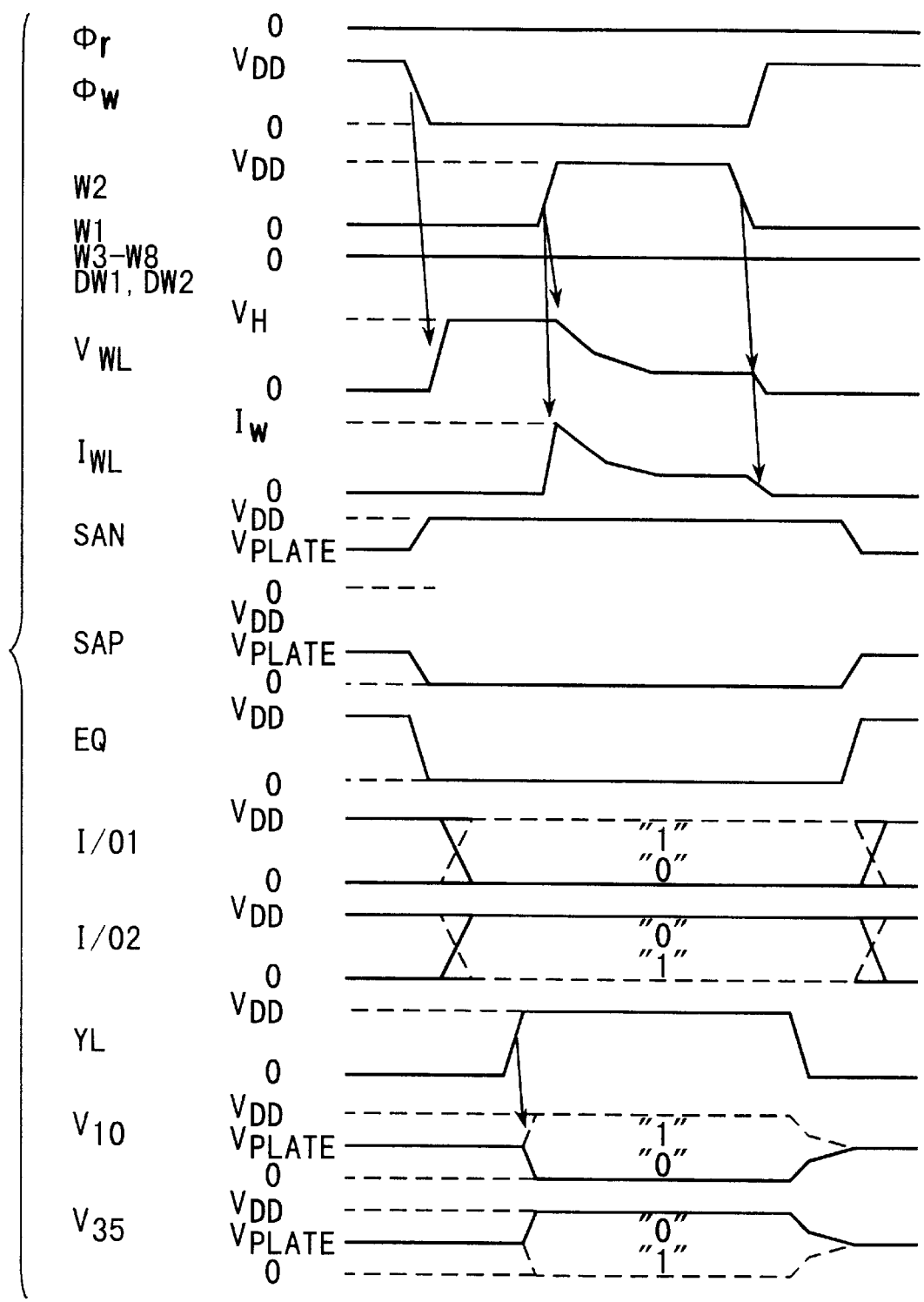
FIG. 17 is a timing chart for explaining a write operation.

The write operation for the memory cell 23 shown in FIG. 13 will be described below with reference to the timing chart in FIG. 17. In the following description, the ON state of a transistor means that a voltage larger than the threshold value of the transistor is applied to the gate electrode to connect the source and drain electrodes of the MISFET. The OFF state of a transistor means that a voltage smaller than the threshold value of the transistor is applied to the gate electrode to disconnect the source electrode of the MISFET from the drain electrode.

As the threshold value, a gate voltage at which the current flowing between the source and drain electrodes has a value of, e.g., 40 nA×(channel width)/(gate length) is used.

In this embodiment, a transistor having a positive threshold value will be exemplified because a normal CMOS logic circuit has a simple arrangement. As a matter of course, a transistor having a negative threshold value can also be used as far as the threshold value falls within the changeable range of the gate voltage.

First, a gate potential $\Phi w$ of the transistor (p-type MISFET) 31 is changed from $V_{DD}$ to 0V to turn on the transistor 31, thereby to charge the current supply node $22_N$ so as to set potential $V_{WL}$ thereof at $V_H$. The current supply node $22_N$ has a large capacitance and therefore requires a large charge current because terminals of the source/drain electrodes of the plurality of transistors $33_{US}$ and $33_D$ are connected in parallel to the current supply node $22_N$. The current supply node $22_N$ is charged to be $V_H$ in potential in advance. This embodiment can prevent the current of the data selection line 22 in the write operation from being decreased by the charge current amount for charging node $22_N$ when the transistor 33 transits to the ON state, in comparison with the case wherein the current supply node $22_N$ is not charged.

For the data transfer lines, potentials are applied to the external data input/output terminals I/O1 and I/O2 as write data to flow a current corresponding to the write data to the data transfer line 10. The solid lines indicate write data "0", and the broken lines indicate write data "1".

The potential of the voltage node EQ is changed from $V_{DD}$ to 0V to turn off the transistor 43 for keeping potentials $V_{10}$ and $V_{35}$ of the data transfer lines $10_S$ and $35_S$ equal, thereby preventing the current from flowing from the data transfer line $10_S$ to the data transfer line $35_S$ paired with the data transfer line $10_S$ and vice versa, i.e., preventing erroneous flow of the write current. The voltage transition at the voltage node EQ is performed before transition at the voltage node YL with which the MISFETs $42_S$ and $42_{US}$ are turned on.

If a parasitic effect is caused by the current flow from the data transfer lines $10_S$ and $35_S$ which are set at 0V or $V_{DD}$ in the write to the voltage node SAN, and vice versa, the write current may change or power consumption may increase. To prevent this parasitic effect, the voltage at the voltage node SAN of the cross-coupled amplifier formed from the n-type MISFETs $41_S$ and $41_{US}$ is set to have a value equal to or larger than {(the maximum potential value of data signals applicable to terminals I/O1 and I/O2)−(threshold value of n-type MISFETs $41_S$ and $41_{US}$)}, so the cross-coupled amplifier is turned off regardless of the potentials $V_{10}$ and $V_{35}$ of the data transfer lines $10_S$ and $35_S$.

In this timing chart, the voltage at the voltage node SAN is set at $V_{DD}$. For a voltage node SAP as well, a similar parasitic effect occurs. To prevent this, the voltage at the voltage node SAP as a control terminal for the cross-coupled amplifier formed from the p-type MISFETs $40_S$ and $40_{US}$ is set to have a value equal to or smaller than {(the minimum potential value of data signals applicable to terminals I/O1 and I/O2)+(threshold value of p-type MISFETs $40_S$ and $40_{US}$)}, so the cross-coupled amplifier is turned off regardless of the potentials $V_{10}$ and $V_{35}$ of the data transfer lines $10_S$ and $35_S$.

In this timing chart, the voltage at the voltage node SAP is set at 0V. Voltage transition of the voltage nodes SAN and SAP is performed after voltage transition of the voltage node EQ and until voltage transition of the voltage node YL with which the MISFETs $42_S$ and $42_{US}$ are turned on.

Next, a data potential corresponding to write data "0" or "1" is applied to the external input/output terminal I/O1, and a data potential corresponding to inverted data "1" or "0" of the write data is applied to the external input/output terminal I/O2. The external input/output terminals I/O1 and I/O2 are preferably connected to a low-impedance power supply of, e.g., 0V or $V_{DD}$ for the purpose of stabilizing the write current and reducing noise.

For example, the potential at the voltage node YL is changed from 0V to $V_{DD}$ to turn on the MISFETs $42_S$ and $42_{US}$. A current corresponding to the write data flows to the data transfer line $10_S$ due to the potential difference between the voltage $V_{plate}$ and the external input/output terminal I/O1.

As described above, data stored in a memory cell may be changed by changing the direction of the write current flowing to the data transfer line $10_S$ in the data write. To change the current direction, the voltage $V_{plate}$ must be within the range of data potential at the external input/output terminal I/O1 and is preferably set at $V_{DD}/2$ to equalize the write currents for writing data "0" and "1" and enlarge the margin regarding the magnetic field and the current. The data potentials at the external input/output terminals I/O1 and I/O2 need be determined before the rise of the voltage node YL.

After the MISFETs $42_S$ and $42_{US}$ are turned on, for example, the potential at the voltage node W2 connected to the selected data selection line is changed from 0V to $V_{DD}$ to turn on the transistor $33_S$. With this operation, a write current $I_{WL}$ is selectively flowed to the data selection line $22_S$ connected to the memory cell in which the data is to be written, thereby writing the data in a desired cell.

As the currents to the data transfer lines 10 and 22 in the write, for example, currents for generating the magnetic fields $H_{WL}$ and $H_{BL}$ within the hatched area in FIG. 11A can be used to change the direction of magnetization of the ferromagnetic film 11 in accordance with the direction of the write current. For example, for the combination of magnetic films shown in FIG. 11A, the voltage at the external input/output terminal I/O1 is controlled to form, as the magnetic field $H_{BL}$, a magnetic field having a magnitude of $0.2H_{K1}$ for data "1", or a magnetic field having a magnitude of $-0.2H_{K1}$ for data "0". A write current $I_W$ to the data selection line $22_S$ is controlled to form, as the magnetic field $H_{WL}$, a magnetic field having a magnitude of $0.8H_{K1}$ in the data selection line $22_S$ and the magnetic field with a magnitude of almost 0 on unselected data selection lines $22_{US}$.

When the transistor $33_S$ is to be turned on, the voltage nodes W1, W3 to W8, and WD1 and WD2 of the transistors $33_{US}$ and $33_D$ connected to the unselected data selection lines $22_{US}$ and the data selection line $22_D$ connected to the dummy memory cell $23_D$ are preferably set at 0V to turn off the transistors for the purpose of reduction of the power consumption.

Next, the transistor $33_S$ or 31 is turned off to block the write current to the data selection line $22_S$. The current to the data selection line $22_S$ is blocked first, and a current corresponding to the write data is flowed to the data transfer line $10_S$, the direction of magnetization of the soft ferromagnetic film 13 can be stably made parallel to that of the ferromagnetic film 11.

To maintain the potential $V_{10}$ of the data transfer line 10 to perform the subsequent read operation at a high speed, the voltages $V_{10}$ and $V_{35}$ of the data transfer lines 10 and 35 are set at $V_{plate}$. To do this, the voltages at the voltage nodes SAN and SAP for controlling the sense amplifiers are returned to $V_{plate}$. In addition, the voltage at the voltage node EQ is changed from 0V to $V_{DD}$ to equalize the potentials $V_{10}$ and $V_{35}$ of the data transfer lines 10 and 35 to balance them.

In this write sequence, in the memory cells $23_{US}$ connected to the unselected data selection lines $22_{US}$, the magnetic field $H_{WL}$ generated by the data selection line is smaller than the coercivity of the soft ferromagnetic film 13. For this reason, no data is erroneously written in the soft ferromagnetic film 13 and ferromagnetic film 11, and data can be selectively written in only the selected memory cell $23_S$.

Figure 18:
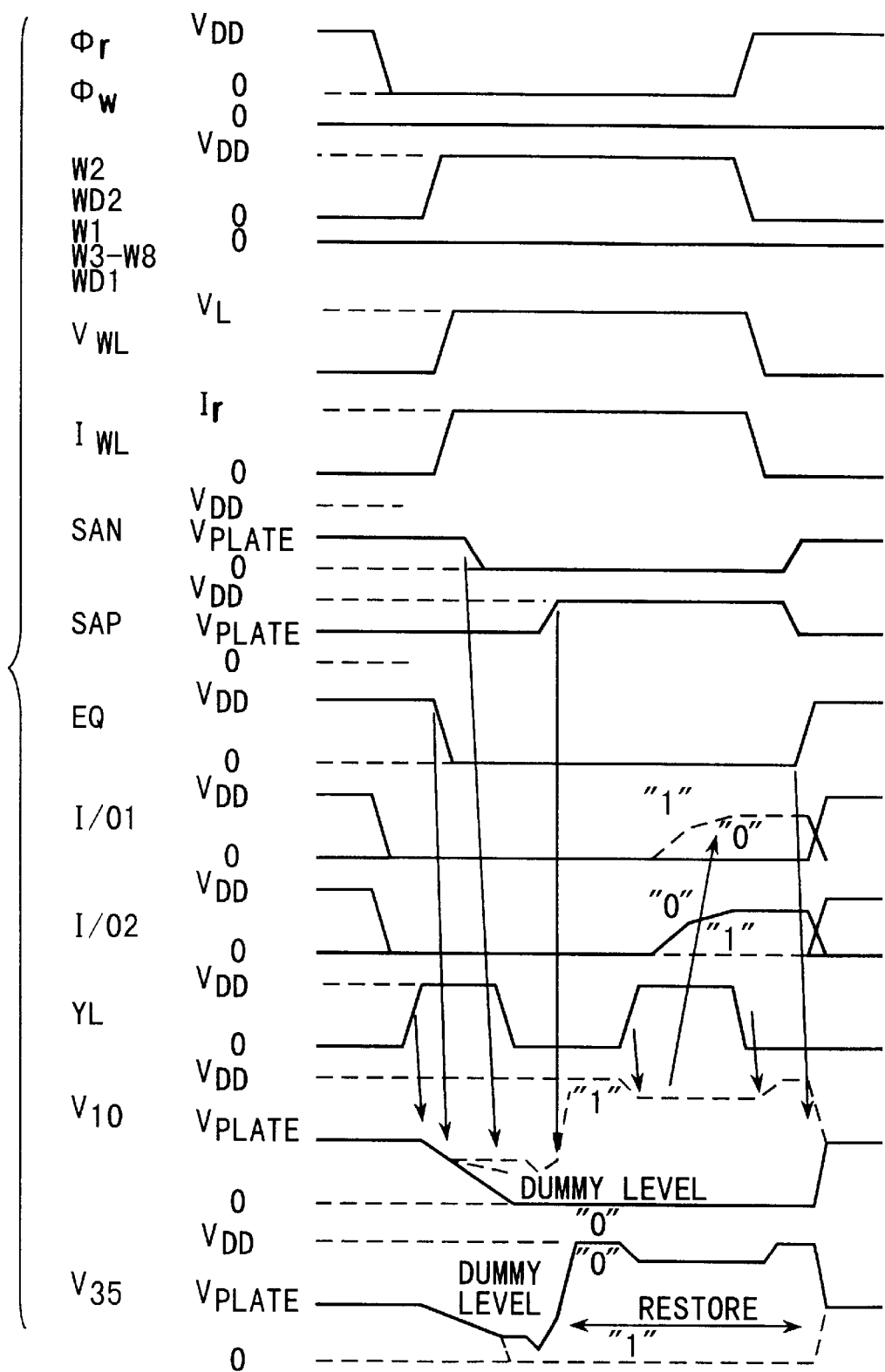
FIG. 18 is a timing chart for explaining a read operation.

The read operation for the memory cell 23 of the circuit shown in FIG. 13 will be described next with reference to the timing chart shown in FIG. 18.

First, the gate potential Φr of the p-type MISFET 32 is changed from the $V_{DD}$ to 0V to turn on the p-type MISFET 32, thereby charging the voltage node $22_N$ to $V_L$.

The voltage node $22_N$ has a large capacitance and therefore requires a large charge current because terminals of the source/drain electrodes of the plurality of transistors $33_{US}$ and $33_D$ are connected in parallel to the voltage node $22_N$. The voltage node $22_N$ is charged to $V_L$ in advance. In this case, the current of the data selection line in the read can be prevented from decreasing by the charge current amount when the transistor 33 is set to be the ON state, unlike the case wherein the voltage node $22_N$ is not charged.

For the data transfer lines, an equipotential of, e.g., 0V is applied to both of the external data input/output terminals I/O1 and I/O2 to flow an equal read sense current to the data transfer lines $10_S$ and $35_S$.

In the timing chart, the solid lines indicate the "0" state, and the broken lines indicate the "1" state. First, the external input/output terminals I/O1 and I/O2 are connected to a low-impedance power supply of, e.g., 0V to apply an equipotential to the terminals. This potential is made equal to the potential in the "0" state or "1" state used in the write.

Next, for example, the potential at the input YL is changed from 0V to $V_{DD}$ to turn on the MISFETs $42_S$ and $42_{US}$. Equal currents flow to the data transfer lines $10_S$ and $35_S$ due to the potential difference between $V_{plate}$ and the external input/output terminal I/O1 and due to the potential difference between $V_{plate}$ and the external input/output terminal I/O2. At this time, no current is flowed to the data selection line. For this reason, when the potential at the external input/output terminals I/O1 and I/2 is equal to that in the "0" state or "1" state used in the write, erroneous write or read due to destruction of magnetization information of the ferromagnetic film 11 and soft ferromagnetic film 13 does not occur, as in the memory cells connected to the unselected data selection lines in the write operation.

The potentials at the voltage nodes W2 and WD2 are changed from 0V to $V_{DD}$ to turn on the transistors $33_S$ and $33_D$. The voltage node W2 is a transistor input for selecting the data selection line $22_S$ connected to the memory cell $23_S$ from which data is to be read. The voltage node WD2 is a transistor input for selecting the dummy memory cell $23_D$ connected to the data transfer line $35_S$. The data transfer line $10_S$ connected to the memory cell $23_S$ from which data is to be read is paired with the data transfer line $35_S$ connected to the selected dummy memory cell $23_D$ to provide the inputs to the differential sense amplifier 36.

When currents for generating the magnetic fields $H_{WL}$ and $H_{BL}$ within the hatched range shown in FIG. 11B are used as the currents to the data transfer line 10 and data selection line 22 in the read sense, the direction of magnetization of the soft ferromagnetic film 13 can be changed in accordance with the direction of the magnetic field $H_{BL}$ in the read, so a resistance change output can be obtained.

For example, for the combination of magnetic films shown in FIG. 11B, the voltage at the external input/output terminals I/O1 and I/O2 is controlled to form, as the magnetic field $H_{BL}$, a magnetic field having a magnitude of $0.2H_{K1}$. A read current $I_r$ to the data selection line $22_S$ connected to the selected memory cell $23_S$ and the read current passing the dummy memory cell $23_D$ connected to the transistor having the gate input WD2 are controlled such that a magnetic field having a magnitude of $0.2H_{K1}$ to $0.3H_{K1}$ is generated in the selected data selection line $22_S$ as the magnetic field $H_{WL}$. In addition, the current is controlled such that magnetic field $H_{WL}$ is almost 0 in magnitude around unselected data selection lines.

In this case, the change in resistance value of the selected memory cell $23_S$ between the "1" and "0" states is sufficiently larger than that of the unselected memory cell $23_{US}$ between the "1" and "0" states. Let $R_{sel}$ be the resistance value corresponding to the "0" state of the selected memory cell $23_S$, $R_{sel}+\Delta R_{sel}$ be the resistance value corresponding to the "1" state, $R_{unsel}$ be the resistance value of the unselected memory cell $23_{US}$, Rdummy be the resistance value of the dummy memory cell $23_D$ corresponding to the "0" state, $R_{dummy}+\Delta R_{dummy}$ be the resistance value corresponding to the "1" and $R_{ch}$ be the channel resistance when the MISFETS $42_S$ and $42_{US}$ are turned on.

Under these conditions, immediately after the MISFETS 42 is turned on, and the memory cell $23_S$ is in the "0" state, the current $I_r$ of the data transfer line $10_S$ is:

$$V_{plate}/(R_{sel}+3^*R_{unsel}+R_{dummy}+R_{ch})$$

When the memory cell $23_S$ is in the "1" state, the current $I_r$ is:

$$V_{plate}/(R_{sel}+\Delta R_{sel}+3^*R_{unsel}+R_{dummy}+R_{ch})$$

On the other hand, immediately after the transistor 32 is turned on, the current of the data transfer line $35_S$ is:

$$V_{plate}/(4^*R_{unsel}+\Delta R_{dummy}+R_{dummy}+R_{ch})$$

When $$\Delta R_{dummy}=(R_{sel}-R_{unsel})+\Delta R_{sel}/2,$$

the "0" and "1" states of the memory cell $23_S$ can be discriminated on the basis of the magnitude relationship between the current of the data transfer line $35_S$ and that of the data transfer line $10_S$.

After the potential at the voltage node EQ changes from $V_{DD}$ to 0V, different voltage drop amounts are obtained at the sense amplifier terminal between the data transfer lines $10_S$ and $35_S$ depending on the data state of the memory cell 23 because different currents flow to the data transfer lines.

For example, when the voltage difference at the sense amplifier terminal between the data transfer lines $10_S$ and $35_S$ becomes 200 mV or more, the potential at the voltage node SAN is set at 0V to operate the cross-coupled amplifier formed by the n-type MISFETs $41_S$ and $41_{US}$. When the memory cell $23_S$ is in the "0" state, the potential $V_{10}$ at the sense amplifier terminal of the data transfer line $10_S$ lowers to 0V. When the memory cell $23_S$ is in the "1" state, the potential $V_{35}$ at the sense amplifier terminal of the data transfer line $35_S$ lowers to 0V.

After this, the potential at the voltage node YL is temporarily changed from $V_{DD}$ to 0V to disconnect the external input/output terminals I/O1 and I/O2 from the data transfer lines $10_S$ and $35_S$, respectively. Subsequently, the cross-coupled amplifier formed by the p-type MISFETs $40_S$ and $40_{US}$ is operated. When the memory cell $23_S$ is in the "1" state, the potential $V_{10}$ at the sense amplifier terminal of the data transfer line 10 increases to $V_{DD}$. This reverses the current direction of the data transfer line 10 of the memory cell $23_S$ and inverts the magnetic field $H_{BL}$. When the data in the memory cell $23_S$ is of level "1", magnetization of the ferromagnetic film 11 and soft ferromagnetic film 13 of the memory cell $23_S$ is switched from an almost parallel state as the data holding state to an almost antiparallel state by the read current.

However, by this inversion of the magnetic field $H_{BL}$, magnetization of the soft ferromagnetic film 13 can be returned to the direction of magnetization of the ferromagnetic film 11, and the magnetic state of the memory cell $23_S$ can be returned to the data holding state. This corresponds to the range "restore" in the timing chart.

When the memory cell $23_S$ is in the "0" state, the potential $V_{35}$ at the sense amplifier terminal of the data transfer line $35_S$ increases to $V_{DD}$. This reverses the current direction of the data transfer line $10_S$ of the dummy memory cell $23_D$ and inverts the magnetic field $H_{BL}$.

When the data in the memory cell $23_S$ is of level "0", magnetization of the ferromagnetic film 11 and soft ferromagnetic film 13 of the dummy memory cell $23_D$ is switched from an almost parallel state as the data holding state to an almost antiparallel state by the read current.

However, by this inversion of the magnetic field $H_{BL}$, magnetization of the soft ferromagnetic film 13 can be returned to the direction of magnetization of the ferromagnetic film 11, and the dummy memory cell $23_D$ can be returned to the initial state. This corresponds to the range "restore" in the timing chart.

The external input/output terminals I/O1 and I/O2 are disconnected from the low-impedance power supply and charged to an equal voltage of, e.g., 0V. The external input/output terminals I/O1 and I/O2 are set in the floating state, i.e., a high-impedance state. The potential at the input YL is increased from 0V to $V_{DD}$ again, and the data transfer lines $10_S$ and $35_S$ are connected to the external input/output terminals I/O1 and I/O2, respectively. With this operation, the read data is output to the external input/output terminals I/O1 and I/O2. If erroneous data inversion does not occur due to noise and load capacitance generated in the external input/output terminals I/O1 and I/O2 set in the high-impedance state, and if the p-type MISFET 40 has a sufficient current drivability, the sequence of temporarily lowering the voltage at the voltage node YL to 0V and increasing it to $V_{DD}$ again can be omitted. The potential at the voltage node YL is changed from $V_{DD}$ to 0V to disconnect the external input/output terminals I/O1 and I/O2 from the data transfer lines $10_S$ and $35_S$, respectively.

To maintain the potential of the data transfer line to perform the subsequent read operation at a high speed, the potentials $V_{10}$ and $V_{35}$ of the data transfer lines $10_S$ and $35_S$ are set at $V_{plate}$. To do this, the voltages at the sense amplifier control inputs SAN and SAP are returned to $V_{plate}$. In addition, the voltage at the voltage node EQ is changed from 0V to $V_{DD}$ to equalize the potentials $V_{10}$ and $V_{35}$ of the data transfer lines $10_S$ and $35_S$ to balance them.

In this read sequence, the absolute values of the currents passing the data transfer lines $10_S$ and $35_S$ are equal to that in the write sequence. In the read sequence, in memory cells connected to unselected data selection lines, the magnetic field $H_{BL}$ generated by the data selection line is smaller than the coercivity of the soft ferromagnetic film 13. For this reason, no data is erroneously written in the soft ferromagnetic film 13 and ferromagnetic film 11, and data can be selectively written only in the selected memory cell $23_S$.

With the circuit arrangement of this embodiment, only two different currents corresponding to data of level "0" and data of level "1" can be used as the currents of the data transfer line to read and write data. For this reason, the peripheral circuits of the data transfer line are simplified. In addition, since the memory cells are connected in series to the sense amplifier circuit and voltage node having the voltage $V_{plate}$ without inserting a transistor, reduction of the read signal margin due to variations in channel resistance of the transistor connected in series can be prevented.

In the dummy memory cell structure of this embodiment, the dummy memory cell $23_D$ can be formed using the same material and structure as those of the memory cell 23. For this reason, by using the differential sense amplifier and dummy memory cells, the influence of a change in memory cell resistance due to a change in temperature, a change due to the read current, or a change in magnetization curve due to variations in directions of thickness of the ferromagnetic film 11, nonmagnetic film 12, and soft ferromagnetic film 13 can be compensated for, so a more stable memory read operation can be realized.

SECOND EMBODIMENT

Figure 19A:
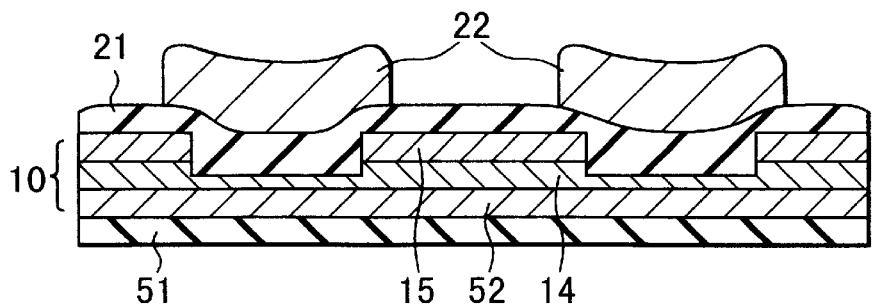
FIGS. 19A to 19C are views showing the structure of a magnetic storage device according to the second embodiment.
Figure 19B:
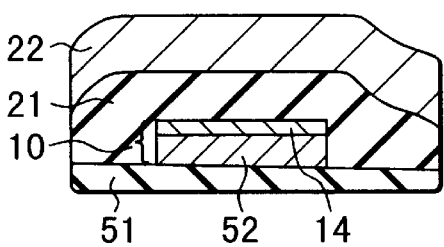

FIGS. 19A and 19B are views showing the arrangement of a magnetic storage device according to the second embodiment of the present invention. FIG. 19A is a sectional view corresponding to a sectional view taken along a line I–I' in the plan view of FIG. 1A. FIG. 19B is a sectional view corresponding to the sectional view taken along a line II–II' in FIG. 1A. The same reference numerals as in FIG. 1A denote the same parts in FIGS. 19A and 19B, and a detailed description thereof will be omitted.

As the characteristic feature of this embodiment, the magnetic storage portion comprising the ferromagnetic film 11, nonmagnetic conductive film 12, and soft ferromagnetic film 13 in FIG. 1A is replaced with a granular thin film 52. Reference numeral 51 denotes an insulating film.

Figure 19C:
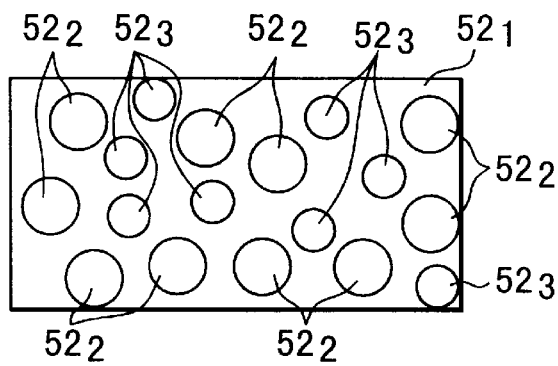

FIG. 19C shows the structure of the granular thin film 52. Ferromagnetic particles $522$ of magnetic material such as Co in a diameter of 0.1 $\mu$mm or less, and soft ferromagnetic particles $52_3$ of Ni or Fe a diameter of 0.1 $\mu$m or less having a coercivity smaller than the ferromagnetic particles $52_2$ are dispersed at 10 to 50% of volume ratio in a nonmagnetic layer $52_1$ of a nonmagnetic material such as Cu or Ag. The resistance changes in accordance with a change in alignment of the magnetization vectors of the ferromagnetic particles $52_2$ and soft ferromagnetic particles $52_3$.

It is known that, in a film formed by dispersing Co particles as the ferromagnetic particles $52_2$ in Cu as the nonmagnetic matrix $52_1$, the resistance decreases by 5% or more upon applying a magnetic field of 10 kOe (Seiji Mitsuya, Hiroki Takanashi, and Hiroyasu Fujimori, "Solid State Physics", Vol. 32, No. 4, p. 238 (1997)).

As the nonmagnetic material layer $52_1$, a nonmagnetic insulating material such as $Al_2O_3$, $SiO_2$, MgO, or $HfO_2$ may be used. It is further known that, in a $Co_{52}Al_{20}O_{28}$ film formed by dispersing Co in aluminum oxide, the resistance decreases by 8% or more upon applying a magnetic field of 10 kOe (Seiji Mitsuya, Hiroki Takanashi, and Hiroyasu Fujimori, "Solid State Physics", Vol. 32, No. 4, p. 235 (1997)).

The resistance value and resistance change amount of the granular thin film 52 depend on the arrangement interval between the ferromagnetic particles $52_2$ and soft ferromagnetic particles $52_3$. In the first embodiment, the thickness of the nonmagnetic film 12 must be equal to or smaller than the average free path of carriers, i.e., typically 10 nm or less at room temperature. To the contrary, the thickness of the granular thin film 52 can be, e.g., about 10 nm. For this reason, variations in resistance value depending on the film formation condition can be further suppressed.

When a nonmagnetic insulating material such as $Al_2O_3$, $SiO_2$, MgO, or $HfO_2$ is used as the nonmagnetic material layer $52_1$, the resistance of a memory cell along the data transfer line can be increased as compared to a structure using a nonmagnetic conductor. This is convenient in terms of impedance matching when a MISFET having a higher channel resistance than that of a metal is used as a read/write circuit.

Figure 20A:
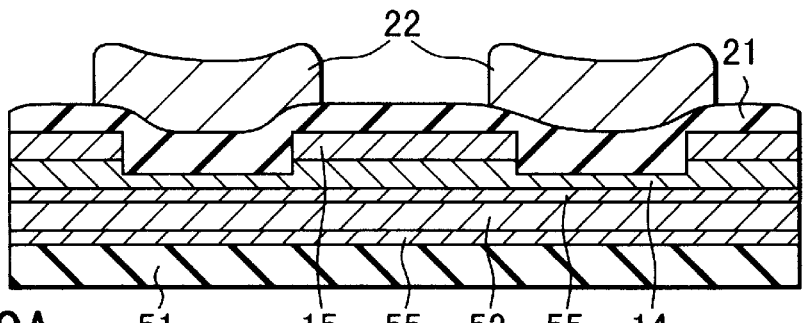
FIGS. 20A to 20C are views showing an alternative structure of a magnetic storage device according to the third embodiment.
Figure 20B:
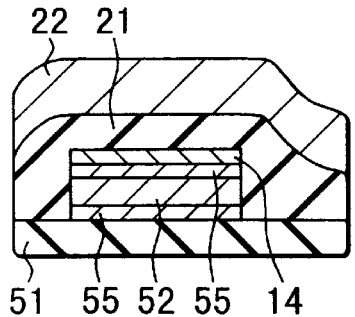
Figure 20C:
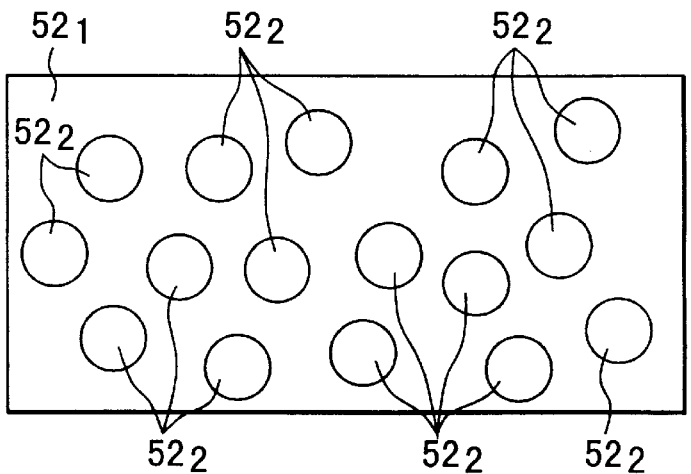

FIGS. 20A to 20C show a modification of this embodiment. FIG. 20A is a sectional view corresponding to the sectional view taken along the line I–I' in the plan view of FIG. 1A. FIG. 20B is a sectional view corresponding to the sectional view taken along the line II–II' in FIG. 1A. FIG. 20C is a view showing the structure of a granular thin film. The same reference numerals as in FIGS. 19A to 19C denote the same parts in FIGS. 20A to 20C, and a detailed description thereof will be omitted.

The structure of this modification is basically the same as in the above embodiment except that the granular thin film 52 is sandwiched by soft ferromagnetic films 55.

The granular thin film 52 is formed by dispersing at 10 to 50 vol% the ferromagnetic particles $52_2$ of a magnetic material such as Co, Ni, or Fe and having a diameter of 0.1 µm or less in the nonmagnetic material layer $52_1$ such as Cu or Ag, as shown in FIG. 20C. The granular thin film 52 is sandwiched by the soft ferromagnetic films 55 having a coercivity smaller than that of the ferromagnetic particles $52_2$.

In accordance with a change in directions of magnetization of the granular thin film 52 and soft ferromagnetic films 55, scattering or tunnel phenomenon depending on the direction of magnetization takes place at the interfaces between the granular thin film 52 and soft ferromagnetic films 55, resulting in a change in resistance.

In this modification as well, a nonmagnetic insulating material such as $Al_2O_3$, $SiO_2$, MgO, or $HfO_2$ may be used as the nonmagnetic material layer $52_1$. In this modification, the resistance value and resistance change amount are determined by the interval between the ferromagnetic particles and soft ferromagnetic film 55, so the granular thin film 52 need not be made excessively thin. Hence, when the granular thin film 52 is formed to be, e.g., 10 nm or more in thickness, variations in resistance value can be further suppressed. In this modification, the granular thin film 52 may be formed by dispersing soft ferromagnetic particles. In this case, ferromagnetic films are used in place of the soft ferromagnetic films 55. Alternatively, only one soft ferromagnetic film 55 may be formed.

THIRD EMBODIMENT

Figure 21A:
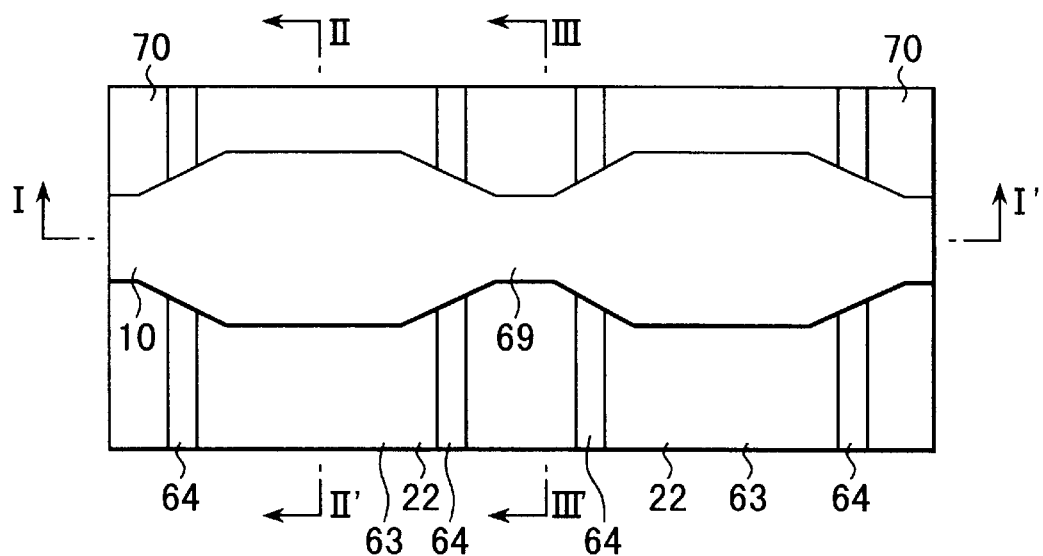
FIGS. 21A to 21D are views showing the structure of a magnetic storage device according to the third embodiment.
Figure 21B:
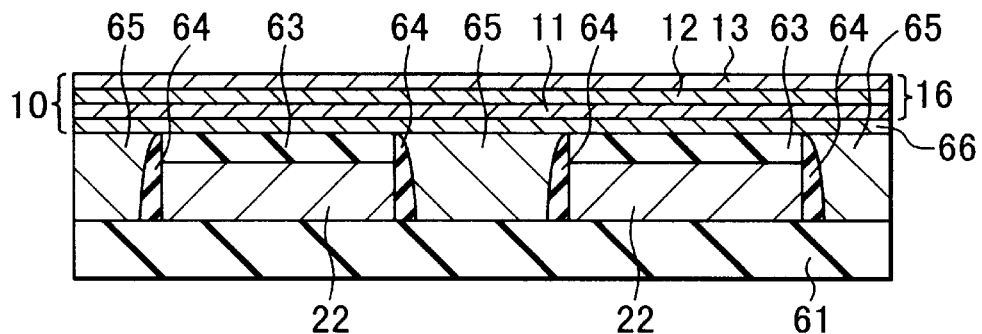
Figure 21C:
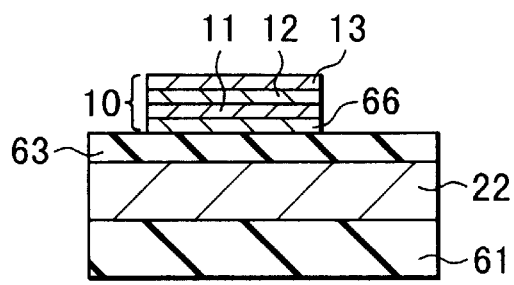
Figure 21D:
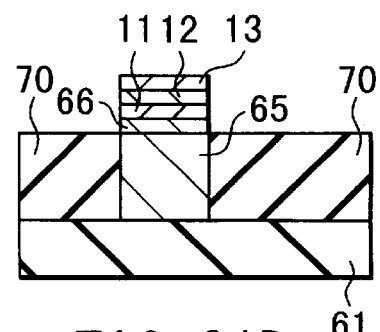
Figure 22A:
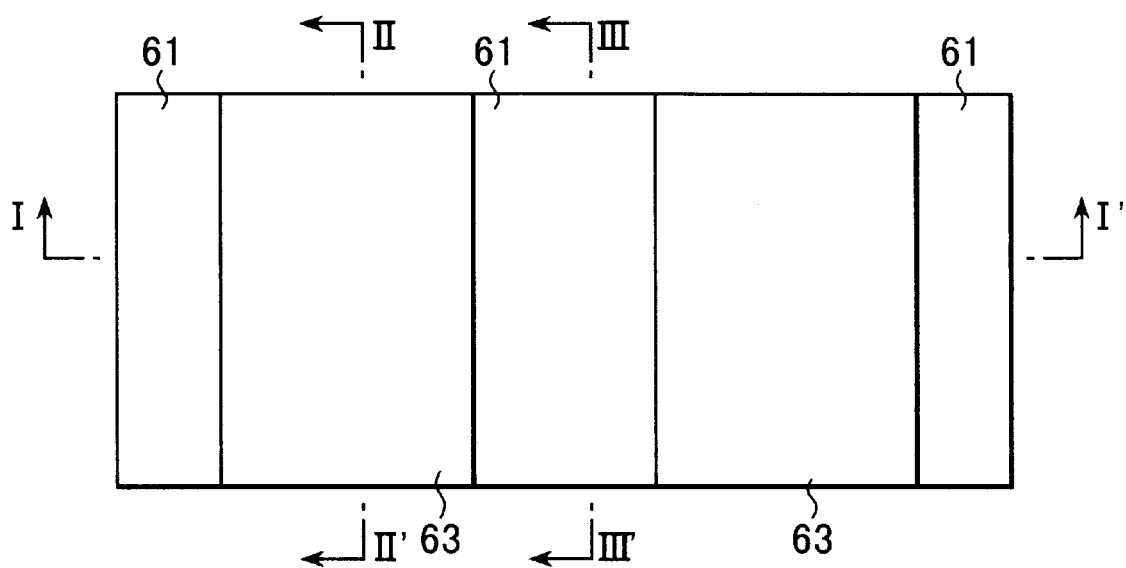
FIGS. 22A to 22D are views showing steps in the manufacture of the magnetic storage device shown in FIGS. 21A to 21D.
Figure 22B:
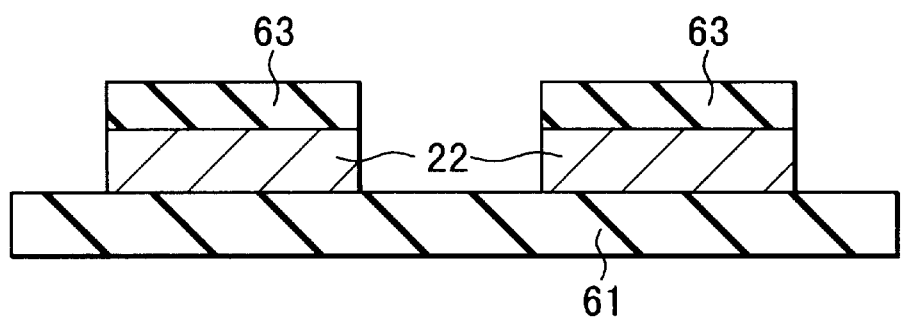
Figures 22C, 22D:
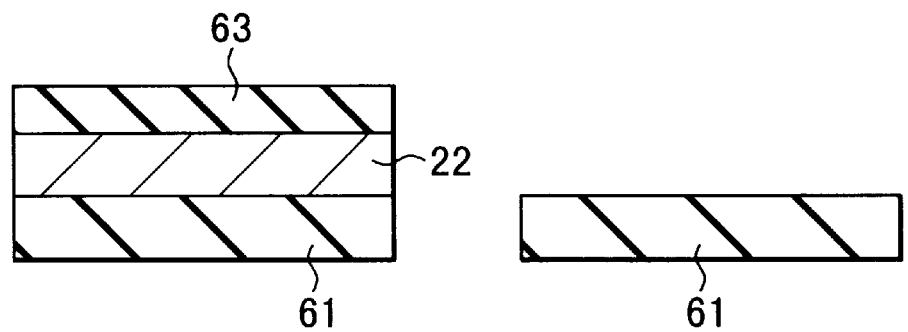

FIGS. 21A to 21D are views showing the arrangement of a magnetic storage device according to the fourth embodiment of the present invention. FIG. 21A is a plan view. FIG. 21B is a sectional view taken along a line I–I' in FIG. 21A. FIG. 21C is a sectional view taken along a line II–II' in FIG. 21A. FIG. 21D is a sectional view taken along a line III–III' in FIG. 21A. The same reference numerals as in FIGS. 1A to 1C denote the same parts in FIGS. 21A to 21D, and a detailed description thereof will be omitted.

Data selection lines 22 are formed on an insulating base 61. A surface insulating film 63 and sidewall insulating films 64 are formed on the upper and side surfaces of each data selection line 22, respectively. An inter-sidewall conductive film 65 is formed on the insulating base 61 between the sidewall insulating films 64. The surfaces of the surface insulating film 63, sidewall insulating films 64, and inter-sidewall conductive film 65 are flush with each other. An insulating interlayer 70 is formed on the insulating base 61 between the inter-sidewall conductive films 65.

A barrier metal layer 66, a ferromagnetic film 11, a nonmagnetic conductive film 12, and a soft ferromagnetic film 13 are sequentially stacked on the surface insulating films 63, sidewall insulating films 64, and inter-sidewall conductive films 65.

This embodiment is different from the first embodiment in that the inter-sidewall conductive films 65 are formed in self-alignment with the data selection lines 22, and data transfer lines 10 are formed on the data selection lines 22.

The barrier metal layer 66 comprises a TaN, TiN, WN, or TaW film having a thickness of, e.g., 1 to 100 nm. The barrier metal layer 66 prevents impurity contamination from the underlying structure and improves the contact between the inter-sidewall conductive film 65 or surface insulating film 63 and the ferromagnetic film 11.

The inter-sidewall conductive film 65 comprises a W, Al, AlCu, or Cu film having a thickness of, e.g., 50 to 1,000 nm. The inter-sidewall conductive film 65 reduces the parasitic resistance of the connection region between memory cells on the data transfer line 10 and is formed in self-alignment with the pattern of the soft ferromagnetic film 13. The inter-sidewall conductive film 65 is in contact with the barrier metal layer 66.

The surface insulating film 63 or sidewall insulating film 64 comprises an insulating film formed from a silicon oxide film or silicon nitride film having a thickness of, e.g., 5 to 100 nm and electrically isolates the data selection lines 22 from the data transfer lines 10.

The data transfer lines 10 and data selection lines 22 are formed perpendicularly to each other and form magnetic fields perpendicularly to each other. The insulating base 61 comprises an insulating film formed from, e.g., a silicon oxide film, silicon nitride film, or alumina.

Steps in the manufacture of the magnetic storage device shown in FIGS. 21A to 21D will be described next with reference to the sectional views of FIGS. 22A to 25D. FIGS. 22A, 23A, 24A, and 25A, FIGS. 22B, 23B, 24B, and 25B, FIGS. 22C, 23C, 24C, and 25C, and FIGS. 22D, 23D, 24D, and 25D correspond to FIGS. 21A, 21B, 21C, and 21D, respectively.

As shown in FIGS. 22A to 22D, a 50-nm to 1,000-nm thick conductive film of W, Al, or AlCu and a 5-nm to 200-nm thick insulating film formed from a silicon oxide film or a silicon nitride film are sequentially deposited on the entire surface of the insulating base 61 which has been planarized by CMP in advance. The conductive and insulating films are selectively patterned and removed by lithography and anisotropic etching to form the data selection lines 22 and surface insulating films 63.

Figure 23A:
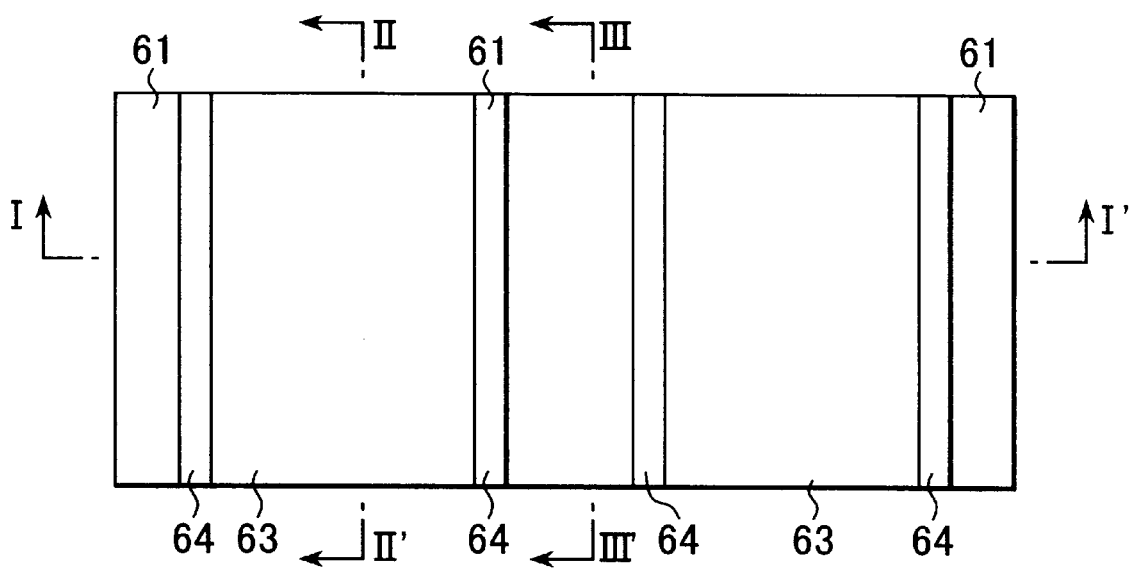
FIGS. 23A to 23D are views showing steps in the manufacture of the magnetic storage device shown in FIGS. 21A to 21D.
Figure 23B:
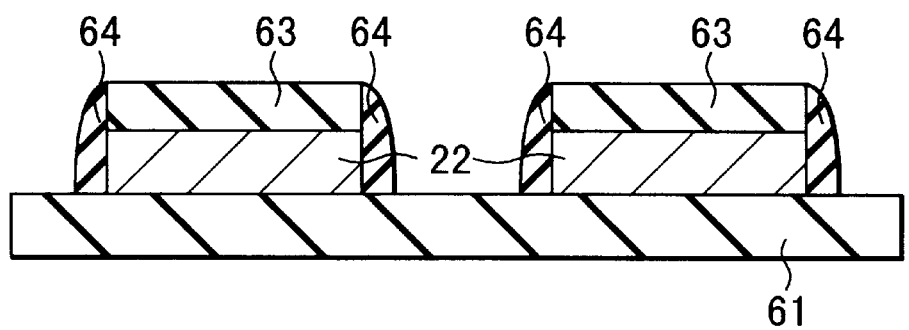
Figures 23C, 23D:
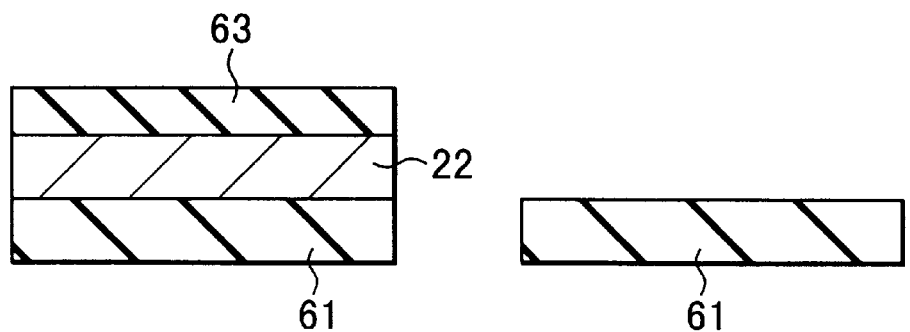
Figure 24A:
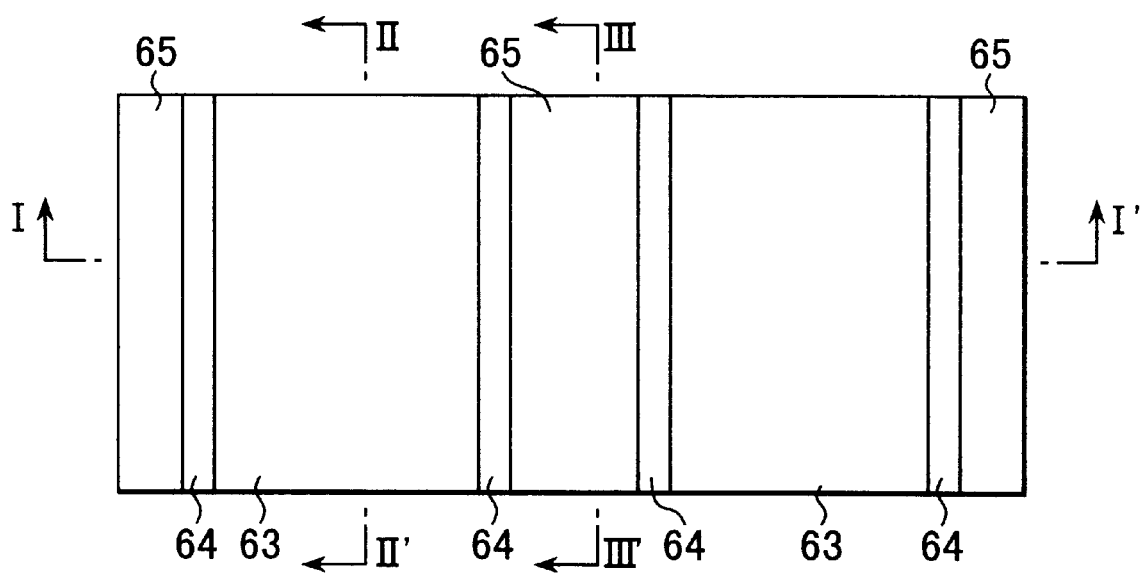
FIGS. 24A to 24D are views showing steps in the manufacture of the magnetic storage device shown in FIGS. 21A to 21D.
Figure 24B:
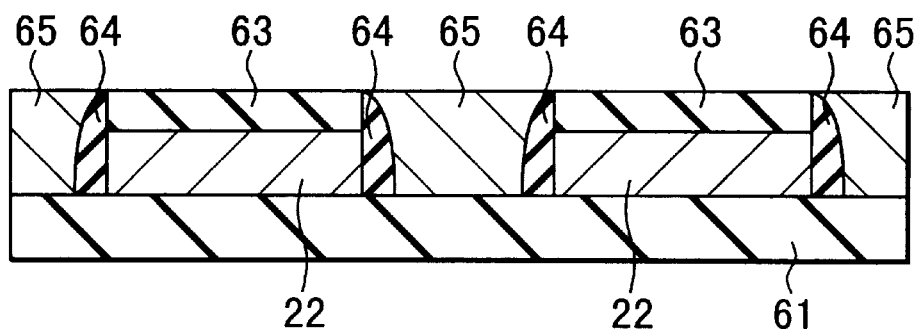
Figures 24C, 24D:
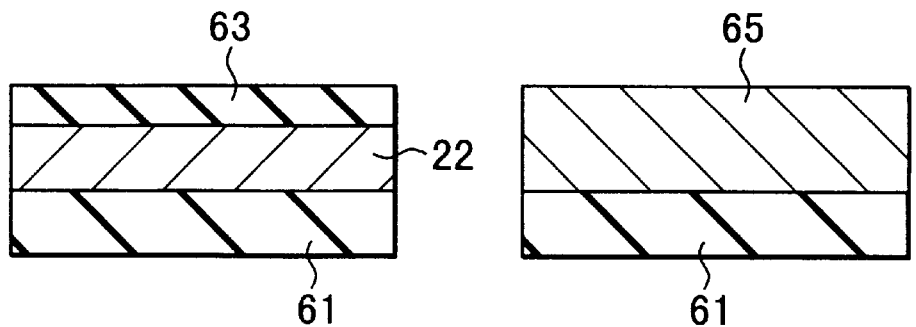
Figure 25A:
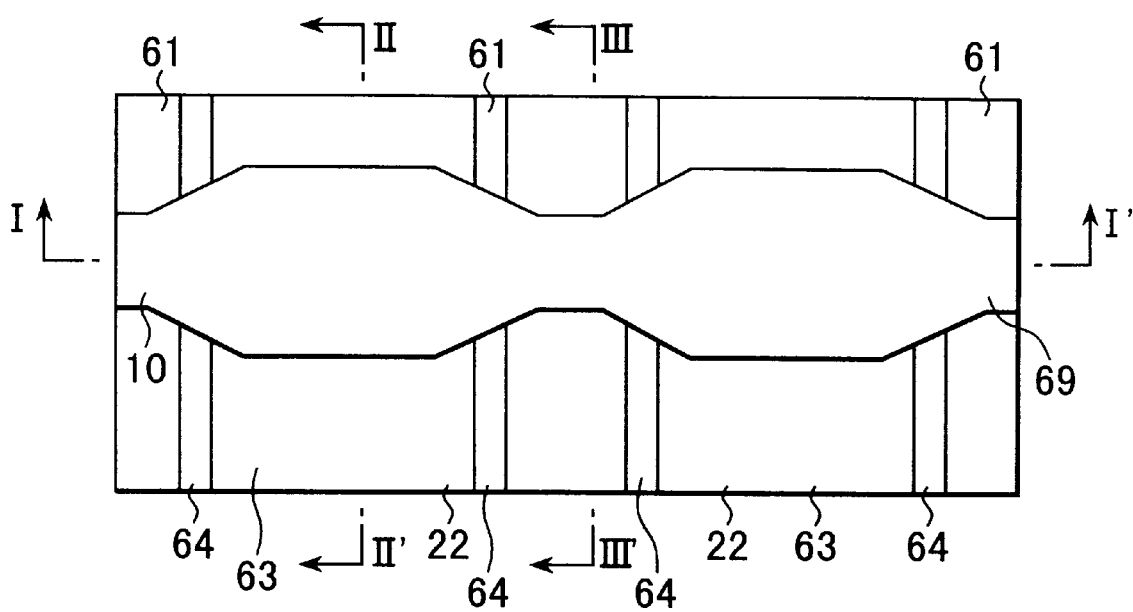
FIGS. 25A to 25D are views showing steps in the manufacture of the magnetic storage device shown in FIGS. 21A to 21D.
Figure 25B:
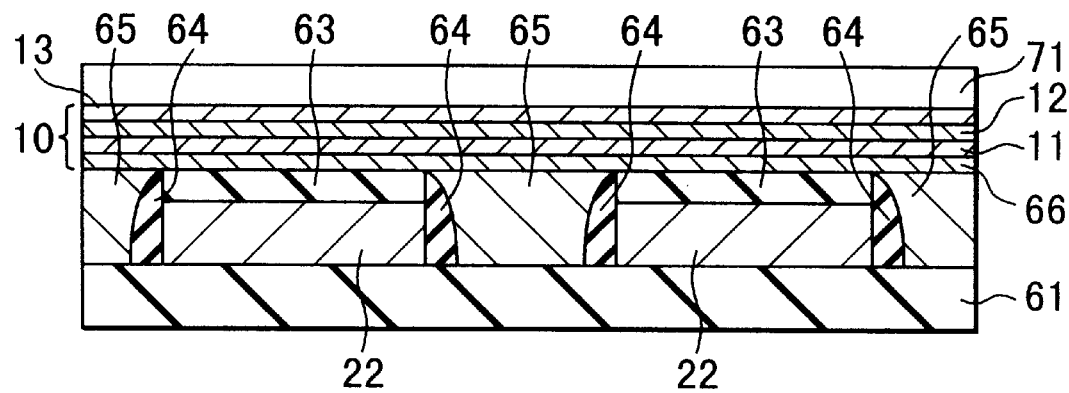
Figure 25C:
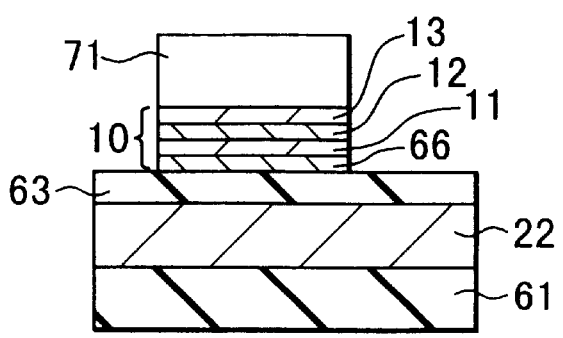
Figure 25D:
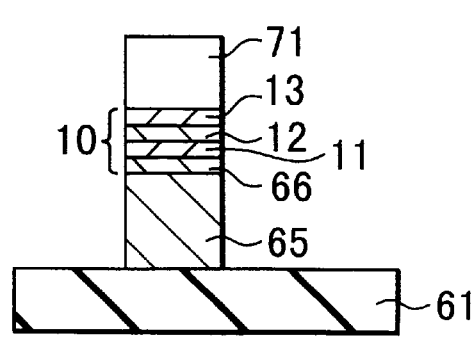

A 1-nm to 200-nm thick insulating film formed from a silicon oxide film or a silicon nitride film is deposited on the entire surface. The thickness of this insulating film is ½ or less of the arrangement interval of the data selection lines 22. As shown in FIGS. 23A to 23$_D$, the insulating film is etched in the vertical direction by, e.g., anisotropic etching and selectively left on the vertical sidewalls of the data selection lines 22 to form the sidewall insulating films 64. To selectively form the sidewall insulating films 64 on the sidewalls of the data selection lines 22, the material of the sidewall insulating film 64 is preferably different from that of the insulating base 61.

As shown in FIGS. 24A to 24D, a 50-nm to 2,000-nm thick conductive film of W, Al, AlCu, or Cu is deposited on the entire surface. After this, the conductive film is planarized by polishing/etching by, e.g., CMP until the surface insulating films 63 are exposed to the surface, thereby forming the inter-sidewall conductive films 65 in regions surrounded by the sidewall insulating films 64. This CMP process may be replaced with a so-called etch-back process in which the entire surface is coated with a planarization resist, and then, etching is performed.

As shown in FIGS. 25A to 25D, the 1-nm to 200-nm thick barrier metal layer 66 of TaN, TiN, WN, or TaW, a 0.5-nm to 500-nm thick ferromagnetic film 11 of Fe, Ni, Co, Cr, or Mn, an alloy thereof such as NiFe, CoFe, NiFeCo, or CoPt, or a multilayered structure thereof, the 0.5-nm to 10-nm thick nonmagnetic film 12 formed from a nonmagnetic material such as Cu, AgCu, or TaN, and the 0.5-nm to 500-nm thick soft ferromagnetic film 13 of NiFe, CoFe, NiFeCo, CoTaZr, CoNbZr, FeTaN, or a multilayered structure of CoZrNb/NiFe/CoFe are sequentially deposited on the entire surface.

A resist 71 is applied to the entire surface and patterned by lithography. The soft ferromagnetic film 13, nonmagnetic film 12, ferromagnetic film 11, barrier metal layer 66, and inter-sidewall conductive films 65 are etched by etching or ion milling. With this process, the inter-sidewall conductive films 65 electrically connected to the data transfer lines 10 each formed from the soft ferromagnetic film 13, nonmagnetic film 12, ferromagnetic film 11, and barrier metal layer 66 can be formed in self-alignment. After this, the resist 71 is removed by ashing.

A 50-nm to 1,000-nm thick insulating film formed from a silicon oxide film or a silicon nitride film is deposited on the entire surface. The insulating film is left in only grooves surrounded by the sidewall insulating films 64 and inter-sidewall conductive films 65 by etch-back to form the insulating interlayers 70, thereby forming the shape shown in FIGS. 21A to 21D.

In this embodiment, the insulating base 61 on which the data selection lines 22 are formed can be planarized in advance. Hence, the thickness, grain size, and alignment of the data selection lines 22 can be easily uniformed as compared to the first embodiment. For this reason, the data selection lines 22 which are unlikely to be disconnected by electro-migration, so the density of the current to be flowed to the data selection lines 22 can be enhanced.

In addition, the film formation for the data selection lines 22 can be made at a temperature higher than the temperature at which deterioration of the ferromagnetic film 11, nonmagnetic film 12, and soft ferromagnetic film 13 occurs. For example, when NiFe is used for the ferromagnetic film 11 and Cu for the nonmagnetic film 12, the resistance change rate degrades at a temperature of 250° C. or more due to interface diffusion between NiFe and Cu.

For this reason, the process after formation of the magnetic storage portion 16 comprising the ferromagnetic film 11, nonmagnetic film 12, and soft ferromagnetic film 13 must be performed at a low temperature of 250° C. or less. In formation of the data selection lines 22 after formation of the magnetic storage portion 16, a film having satisfactory electrical insulating properties, e.g., a plasma SiN film, a plasma SiO$_2$ film using TEOS decomposition, or an SiO$_2$ insulating film formed by atmospheric pressure CVD, which require a film formation temperature of 250° C. or more, can hardly be formed as the insulating film between the data transfer line 10 and data selection line 22 in the prior art.

Since the data selection lines 22 cannot be deposited at a high temperature, either an Al or W film can hardly be formed by CVD which requires a substrate temperature of 400° C. or more. For this reason, when the data transfer lines 10 are formed at a substrate temperature in a range between a room temperature and about 100° C., grain boundary growth hardly occurs, resulting in a film with low reliability and high electrical resistance.

However, when the arrangement and manufacturing method of this embodiment are used, the data transfer lines 10 can be formed after the data selection lines 22 are formed at a temperature of 400° C. or more. This solves the above problem of heat resistance of the data transfer lines 10, and a film having a more satisfactory shape after etching or electrical insulating characteristics can be used as the surface insulating film 63. In addition, since etching damage upon forming the data selection lines 22 is not contained in the magnetic storage portion 16, a more reliable magnetic memory cell can be formed.

In this embodiment, two processes, i.e., formation of the data selection lines 22 and formation of the data transfer lines 10 require lithography. The number of lithography steps is smaller than that in the first embodiment. Furthermore, since the inter-sidewall conductive films 65 for lowering the resistance of the data transfer lines 10 are formed in a self-aligned manner, the magnetic field formed by the data transfer line 10 in a memory cell region can be prevented from being heterogeneous due to misalignment between the data selection line 22 and inter-sidewall conductive film 65. Hence, a change in resistance can be more uniform, and variations in memory cell characteristics can be reduced.

Figure 26A:
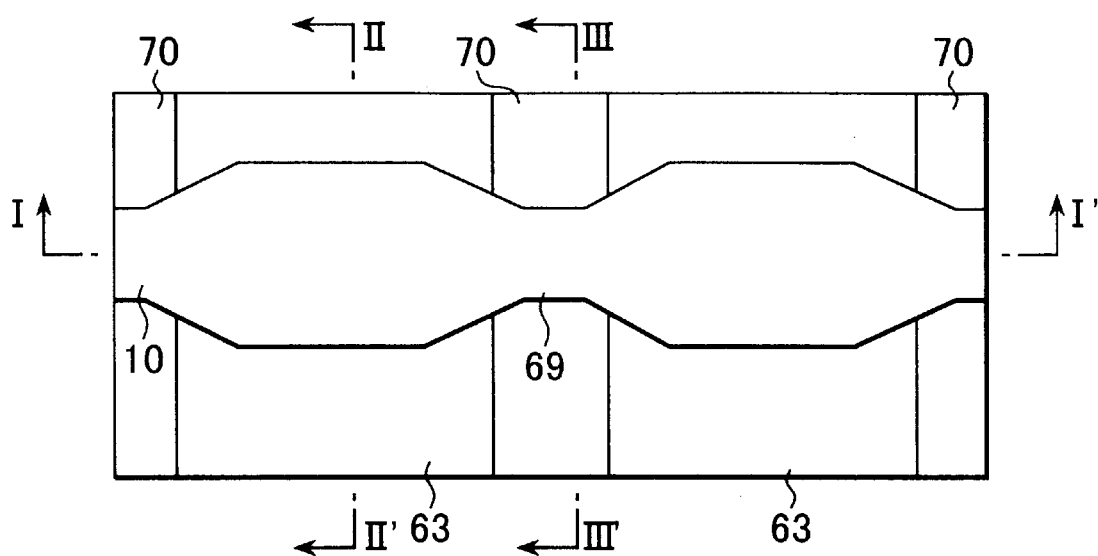
FIGS. 26A to 26D are views showing a modification of the magnetic storage device shown in FIGS. 21A to 21D.
Figure 26B:
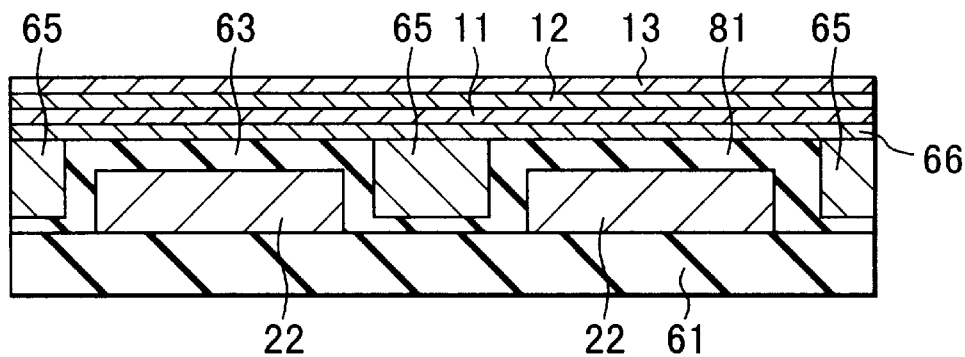
Figures 26C, 26D:
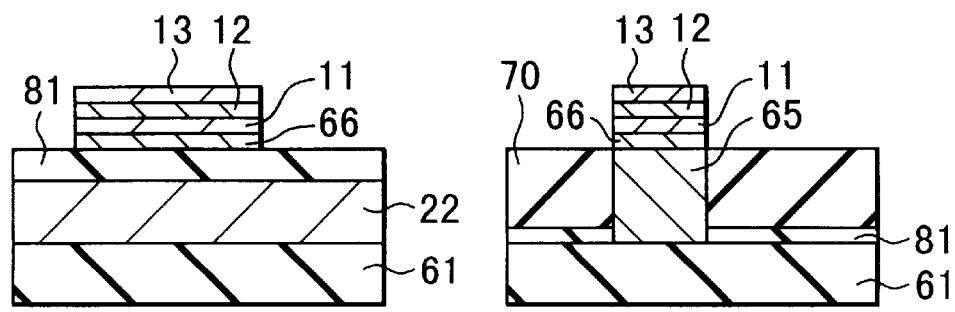

FIGS. 26A to 26D show a modification of this embodiment. FIG. 26A is a plan view. FIG. 26B is a sectional view taken along a line I–I' in FIG. 26A. FIG. 26C is a sectional view taken along a line II–II' in FIG. 26A. FIG. 26D is a sectional view taken along a line III–III' in FIG. 26A. The same reference numerals as in FIGS. 1A to 1C and 21A to 21D denote the same parts in FIGS. 26A to 26D, and a detailed description thereof will be omitted.

As the characteristic feature of this modification, the surface insulating films and sidewall insulating films are integrated with each other to form an insulating interlayer 81 so as to cover the insulating base 61 and data selection lines 22.

Figure 27A:
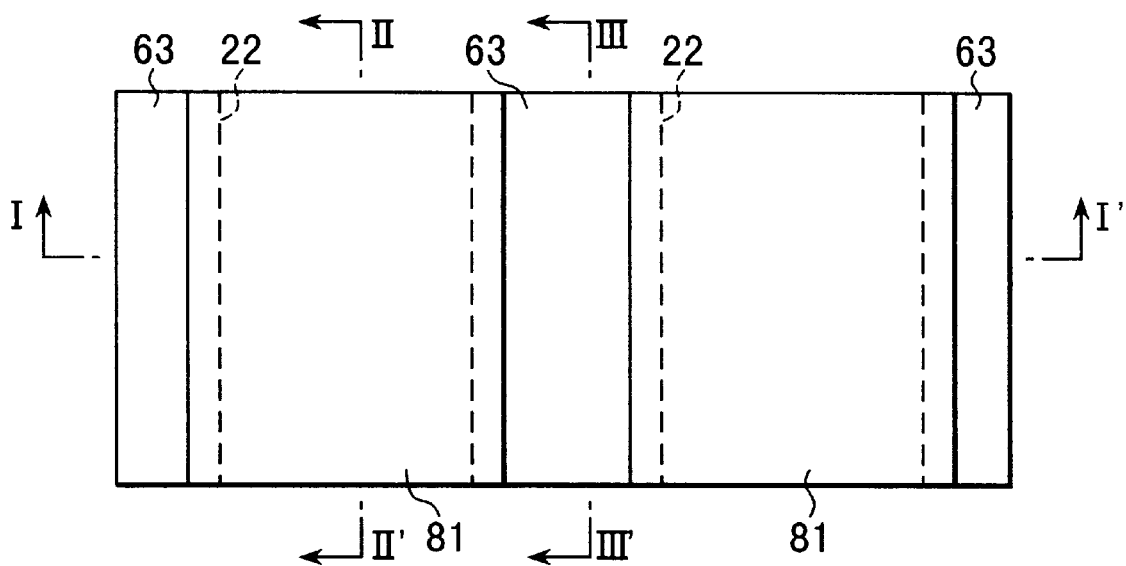
FIGS. 27A to 27D are views showing steps in the manufacture of the magnetic storage device shown in FIGS. 26A to 26D.
Figure 27B:
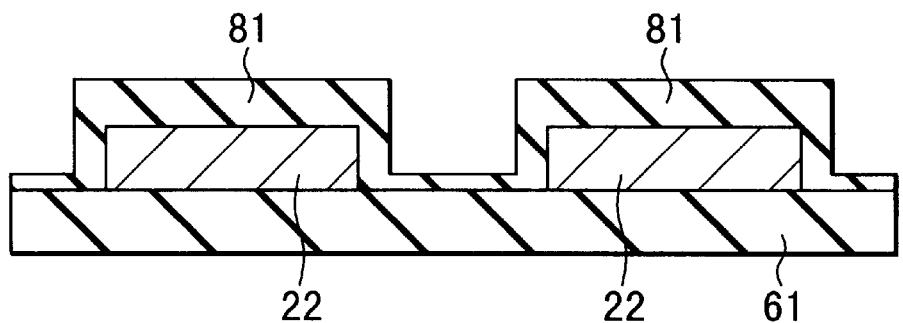
Figures 27C, 27D:
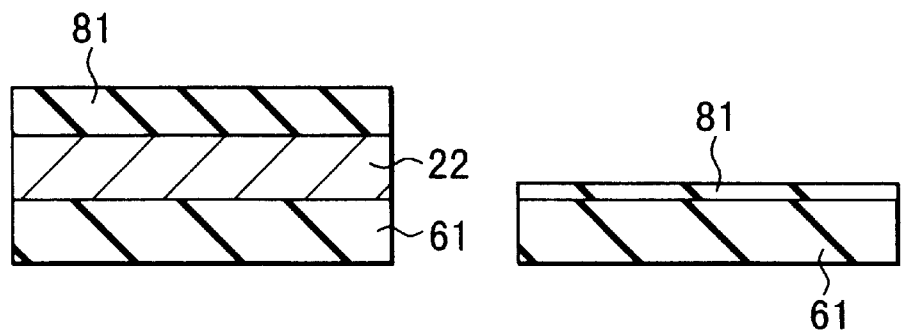

This structure can be formed by the following method. A 50-nm to 1,000-nm thick conductive film of W, Al, or AlCu is deposited on the entire surface of the insulating base 61 which has been planarized by CMP in advance, and patterned to form the data selection lines 22. A silicon oxide film or a silicon nitride film having a thickness ½ the arrangement interval of the data selection lines 22, e.g., 5 to 200 nm is deposited on the entire surface using an isotropic film formation method to form the insulating interlayer 81, thereby obtaining the shape shown in FIG. 27A. The subsequent processes are the same as those described with reference to FIGS. 24A to 24D and 25A to 25D, and a detailed description thereof will be omitted.

In this modification, although the thickness of the surface insulating film 63 and sidewall insulating film 64 cannot be arbitrarily selected, fine anisotropic etching in forming the surface insulating films 63 need not be performed. Hence, for example, alumina or MgO which is difficult to anisotropically etch can be used, and the process is simplified. In addition, during etching the data transfer lines 10, the etching gas can be prevented from entering from the boundary between the surface insulating film 63 and sidewall insulating film 64 and etching the data selection line 22.

ALTERNATIVE EMBODIMENT

An embodiment for providing a magnetic storage device capable of obtaining a large read signal, operating at a high speed, and forming high-density memory cells even when magnetic memory cells using a plurality of TMRs (Tunnel Magneto-Resistances) are connected will be described next.

The magnetic storage device according to this embodiment comprises a plurality of memory cells each having a nonmagnetic insulating film between a first magnetic film and a second magnetic film, data selection lines connected to one terminal of the memory cell, and data transfer lines connected to the other terminals of memory cells, in which a plurality of data selection lines are connected to data transfer lines through the memory cells, and a rectifying element having the same rectifying direction are inserted between the data transfer lines and memory cells. By using the arrangement of this embodiment, even when the number of parallel-connected memory cells is increased, a large read signal amount can be ensured independently of the states of unselected memory cells which are in parallel connected. Hence, even when noise in memory cells is large, a stable read operation can be realized.

Since the signal voltage amplitude is large, the memory cells can be read-accessed using not a sample/hold sense amplifier but a differential sense amplifier. The data need not be time-serially read, and the memory cells can be read-accessed at a higher speed.

In addition, since the data need not be time-serially read in this embodiment, variations in power supply voltage between the sample operation and the hold operation are minimized, and a stable memory cell operation can be realized. Furthermore, even when the absolute size of wiring or memory cell elements varies, the common offset amount of the variations between elements can be canceled using the differential sense amplifier, and a stable memory cell operation can be realized.

Even when the number of memory cells which are in parallel connected is increased, a large read output can be ensured, the number of memory cells to be in parallel connected can be further increased, the ratio of the memory cell area to the area of a sense amplifier or a peripheral circuit can be increased, and the memory cell occupation ratio can be increased.

When the memory cell structure of the present invention is used, a sufficient resistance difference between data of level "1" and data of level "0" can be obtained even when the current of the data transfer line in the data read is small. Hence, degradation in reliability by electro-migration upon an increase in current of the data selection line, a decrease or local change in resistance change ratio due to heat generated by the data selection line, or a change in resistance depending on the read history because of the different degrees of increase in temperature depending on the read count can be prevented. A change in read data signal output or a change in resistance values of memory cells in the neighborhood can also be prevented. Therefore, even when the degree of integration is increased, the read does not become difficult because the array noise does not increase.

Additionally, since the current flowing to an unselected memory cell decreases, the power consumption can be reduced.

Figure 28:
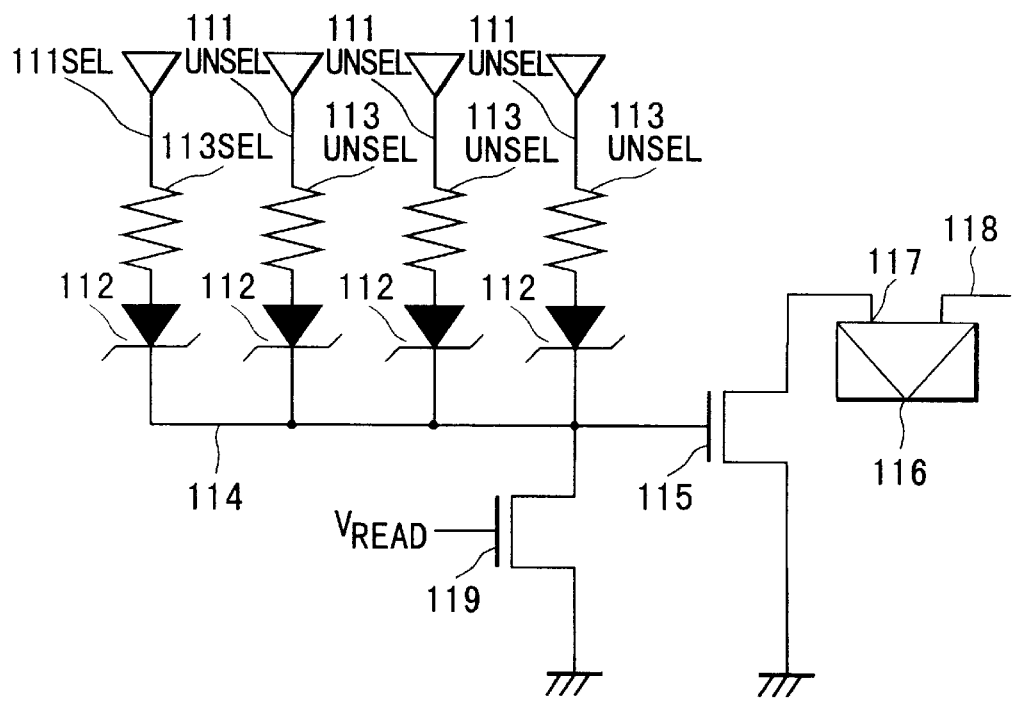
FIG. 28 is a view showing a circuit for reading out data from a memory cell matrix according to the alternative embodiment.

FIG. 28 is a circuit diagram schematically showing a circuit arrangement for read-accessing a memory cell matrix according to this embodiment.

Four data selection lines 111 (a selected data selection line 111$_{sel}$ and unselected data selection lines 111$_{unsel}$) are connected to one data transfer line 114 through memory cells 113 (a selected memory cell 113$_{sel}$ and unselected memory cells 113$_{unsel}$) and Schottky diodes 112, respectively. The Schottky diodes 112 have the same rectifying direction.

Data is selectively written/read in/from the selected memory cell 113$_{sel}$ connected to the selected data selection line 111$_{sel}$. For the unselected memory cells 113$_{unsel}$ connected to the unselected data selection lines 111$_{unsel}$, the circuit arrangement and timing must be adjusted to prevent any erroneous write or read and data destruction.

One memory cell 113 and one Schottky diode 112 connected to the memory cell 113 construct one memory cell block. In this circuit diagram, four memory cell blocks are connected to the data transfer line 114.

Four memory cells 113 are connected to the data transfer line 114 to form a 1×4 memory cell structure. Although not illustrated for the illustrative convenience, the memory cells 13 are preferably connected in parallel to the data selection lines 111 to form a high-density memory cell block. The number of memory cells connected to the data transfer line 114 and data selection lines 111 are not limited to four, and a plurality of data transfer lines or memory cells suffice. The number is preferably $2^n$ (n is a positive integer) from the viewpoint of address decoding.

The data selection lines 111 are connected to a so-called address decoder to exclusively and selectively supply a current to the selected data selection line 111$_{sel}$. As the address decoder, a known circuit for a Dynamic RAM or a Static RAM is used.

One terminal of the data transfer line 114 is connected to the gate electrode of a first transistor 115 comprising an n-type MISFET. The source electrode of the first transistor 115 is connected to a voltage node having a constant voltage of, e.g., 0V, and the drain electrode is connected to an input terminal 117 of a differential sense amplifier 116.

The first transistor 115 amplifies the signal voltage read out from one of the four memory cell blocks and flowing to the data transfer line 114 to ensure a large input signal read margin of the differential sense amplifier 116.

A data transfer line 118 paired with the input terminal 117 is connected to the differential sense amplifier 116.

The data transfer line 114 is also connected to the drain electrode of a second transistor 119 comprising an n-type MISFET. The drain electrode is connected to ground. The second transistor 119 flows a read current to the selected memory cell 113$_{sel}$ through the data transfer line 114. A read voltage $V_{read}$ is applied to the gate electrode of the second transistor 19.

Figure 29:
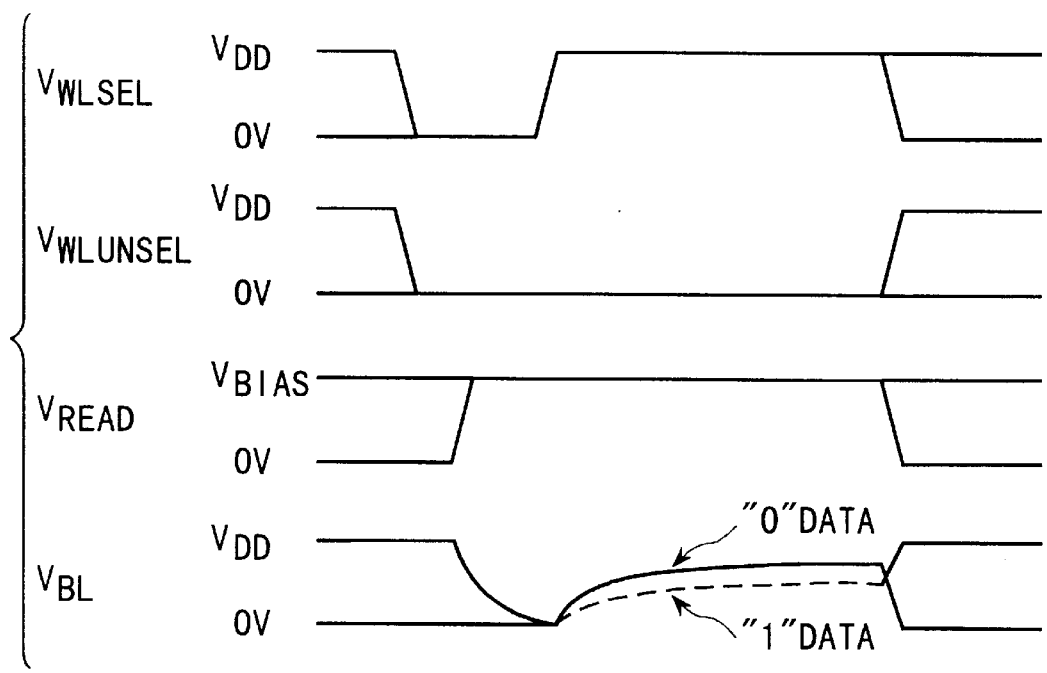
FIG. 29 is a timing chart explaining the operation of the circuit shown in FIG. 28.

FIG. 29 is a timing chart showing the operation of this circuit.

First, a potential $V_{WLsel}$ of the selected data selection line $111_{sel}$ and a potential $V_{WLunsel}$ of the unselected data selection lines $111_{unsel}$ are set to be, e.g., 0V equal to or lower than the precharge voltage of the data transfer line 114 to block the current flowing from the data transfer line 114 to the data selection line 111, thereby floating the data transfer line 114.

The gate voltage $V_{read}$ of the transistor 119 is changed from 0V to $V_{DD}$ to turn on the transistor 119, thereby setting a potential $V_{BL}$ of the data transfer line 114 to be the precharge voltage of, e.g., 0V.

Next, the potential $V_{WLsel}$ of the selected data selection line $111_{sel}$ is set at $V_{DD}$ higher than the precharge voltage to selectively flow a current to the selected memory cell $113_{sel}$. The potential $V_{WLunsel}$ of the unselected data selection lines $111_{unsel}$ is kept at the voltage equal to or lower than the precharge voltage.

When the current is flowed to the selected memory cell $113_{sel}$ and the data in the selected memory cell $113_{sel}$ is of level "0", the resistance is lower than that of the selected memory cell $113_{sel}$ in the "1" state. For this reason, the voltage built-up of the data transfer line 114 in the "0" state is greater than that in the "1" state.

Figure 30A:
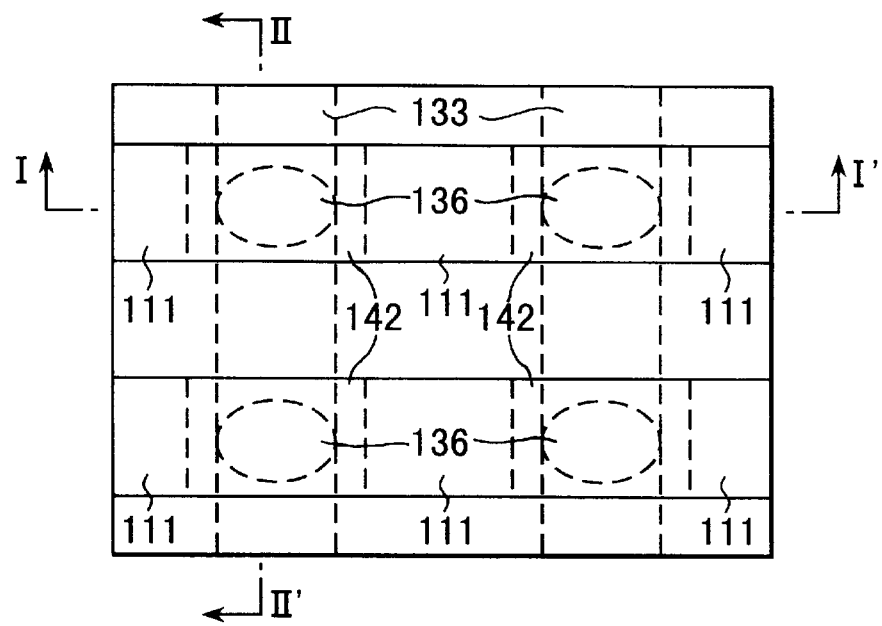
FIGS. 30A to 30C are views showing the structure of a memory cell block included in the circuit of FIG. 28.
Figure 30B:
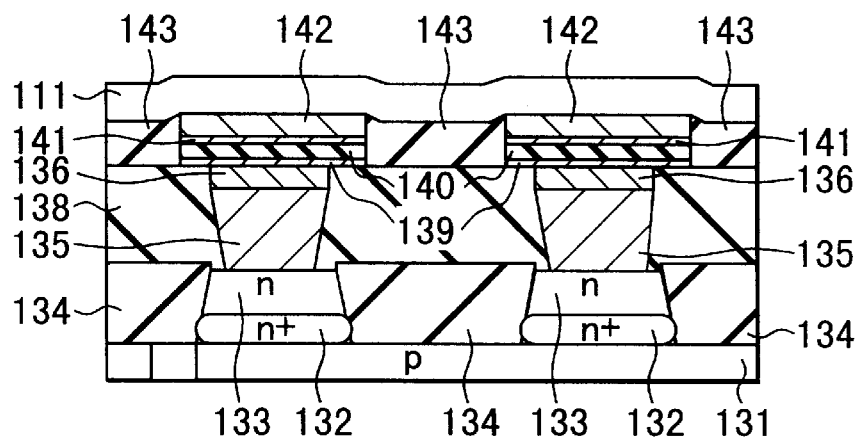
Figure 30C:
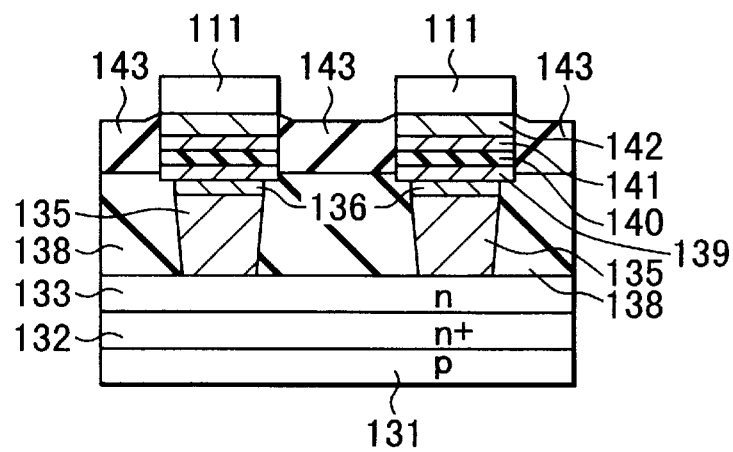

FIGS. 30A to 30C show a specific arrangement example of the TMR memory cell block of this embodiment. FIG. 30A is a plan view. FIG. 30B is a sectional view taken along a line I–I' in FIG. 30A. FIG. 30C is a sectional view taken along a line II–II' in FIG. 30A.

An n$^+$-type silicon layer 32 doped with an impurity such as Sb, P, or As at a concentration of $10^{16}$ to $10^{21}$ cm$^{-3}$ and having a thickness of 10 to 500 nm, and an n-type silicon layer 133 doped with an impurity such as Sb, P, or As at a concentration of $10^{15}$ to $10^{18}$ cm$^{-3}$ and having a thickness of 5 to 100 nm are sequentially formed on a p-type silicon substrate 131 doped with B or In at $10^{16}$ to $10^{18}$ cm$^{-3}$. Two linear n$^+$-type silicon layers 132 and n-type silicon layers 133 are formed, and the n$^+$-type silicon layers 132 function as data transfer lines. The n-type layers 132 and 133 of the data transfer lines are electrically disconnected from each other by applying a bias reverse to the p-type silicon substrate.

The two linear multilayered structures each comprising the n$^+$-type silicon layer 132 and n-type silicon layer 133 are insulated and isolated from each other by a first element isolation insulating film 134 formed on the p-type silicon substrate 131. The thickness of the first element isolation insulating film 134 is 10 to 500 nm, and the surface of the first element isolation insulating film 134 is flush with or at a position higher than the surface of the n-type silicon layer 133.

A conductive layer 135 and a first barrier metal layer 136 are stacked in a predetermined region of each n-type silicon layer 133. The conductive layer 135 and n-type silicon layer 133 form a Schottky junction to constitute a Schottky diode (rectifying element) 137 using the n-type silicon layer 133 as a cathode. The conductive layer 35 and first barrier metal layer 136 are surrounded by a second element isolation insulating film 138 having a thickness of 50 to 1,000 nm. A first magnetic film 139, a nonmagnetic insulating film 140, a second magnetic film 141, and a second barrier metal layer 142 are formed in a predetermined region on the first barrier metal layer 136 and second element isolation insulating film 138. The first magnetic film 139, nonmagnetic insulating film 140, and second magnetic film 141 are formed in a matrix. The direction of one side of the matrix is preferably parallel to the longitudinal direction of the n-type silicon layer 133. A third element isolation insulating film 143 having a thickness of 10 to 500 nm is formed around the first magnetic film 139, nonmagnetic insulating film 140, second magnetic film 141, and second battier metal layer 142.

The data selection line 111 extending along the line I–I' is formed on the second battier metal layer 142 and third element isolation insulating film 143.

In FIGS. 30A to 30C, the first magnetic film 139 is made of a ferromagnetic material. The second magnetic film 141 is made of a ferromagnetic material having a coercivity smaller than that of the first magnetic film 139 or a soft ferromagnetic material having a small coercivity of, e.g., 20 Oe or less.

It is only necessary that the coercivity of the second magnetic film 141 is smaller than that of the first magnetic film 139, and the first magnetic film 139 need not always be formed from a ferromagnetic material, and the second magnetic film 141 need not always be formed from a soft ferromagnetic material. Both the first and second magnetic films 139 and 141 may be made of ferromagnetic materials, or both the first and second magnetic films 139 and 141 may be made of soft ferromagnetic materials.

As the first magnetic film 139, a 0.5-nm to 500-nm thick film of Fe, Ni, Co, Cr, or Mn, an alloy thereof such as NiFe, CoFe, NiFeCo, or CoPt, or a multilayered structure thereof can be used.

The second magnetic film 141 preferably has a smaller coercivity than that of the first magnetic film 139 and almost the same magnetization as that of the first magnetic film 139. As the second magnetic film 141, a 0.5-nm to 500-nm thick film of NiFe, CoFe, NiFeCo, CoTaZr, CoNbZr, or FeTaN, or a multilayered structure such as CoZrNb/NiFe/CoFe can be used.

The coercivity of the second magnetic film 141 can be made smaller than that of the second magnetic film 141 not only by changing the material of the second magnetic film 141 but also by making the second magnetic film 141 thinner than the first magnetic film 139 although the compositions are the same.

The second magnetic film 141 and first magnetic film 139 sandwich the nonmagnetic insulating film 140. The current flowing from the first magnetic film 139 to the second magnetic film 141 contains a current component which flows through the nonmagnetic insulating film 140 without inverting spin of conduction electrons. That is, the spin relaxation length of conduction electrons in the nonmagnetic insulating film 140 is larger than the thickness of the nonmagnetic insulating film 140. As the nonmagnetic insulating film 140, a 0.2-nm to 50-nm thick silicon oxide film, silicon nitride film, Ti oxide film, or aluminum oxide film can be used.

The multilayered structure comprising the first magnetic film 139, nonmagnetic insulating film 140, and second magnetic film 141 forms a magnetic storage portion where a magnetic resistance is generated depending on a magnetized state. This corresponds to the memory cell 113 for storing a magnetized state at a portion where a data selection line is stacked. When the directions of magnetization of the first and second magnetic films 139 and 141 are parallel, the state densities of the first and second magnetic films 139 and 141 considering spin match with each other, and the resistance of the current flowing between the first and second magnetic films 139 and 141 becomes low. When the directions of magnetization of the first and second magnetic films 139 and 141 are antiparallel, the resistance of the current flowing between the first and second magnetic films 139 and 141 becomes high. The exchange magnetic field between the first and second magnetic films 139 and 141 is preferably weaker than the coercivity of the second magnetic film 141 because magnetization of these films can be independently controlled.

To store, at the central portion of the magnetic storage portion, magnetization along the data selection line independently of magnetization at the edge portion along the data transfer line 114, the thickness of the first and second magnetic films 139 and 141 are preferably made large to decrease the thickness of the Neel wall and increase the width of the data transfer line.

The first barrier metal layer 136 comprises a TaN, TiN, or TaW film having a thickness of, e.g., 1 to 100 nm. The first barrier metal layer 136 prevents impurity contamination in forming the upper structure and improves the contact between the interconnections. The data transfer line 114 is formed from a W, Al, AlCu, or Cu film having a thickness of, e.g., 50 to 1,000 nm and reduces the parasitic resistance of the connection region between memory cells on the data transfer line. Referring to FIG. 30A, two memory cells are formed on two adjacent data selection lines, respectively. Each of the element isolation insulating films 134, 138, and 143 is formed from, e.g., a silicon oxide film, a titanium oxide film, an aluminum oxide film, or a silicon nitride film.

The magnetization easy axes of the first and second magnetic films 139 and 141 are substantially parallel to the longitudinal direction of the data selection line 111. To form this magnetization easy axis, when the films are made of NiFe, an anisotropic magnetic field of about 5 to 15 Oe can be formed by depositing the films while applying a magnetic field along the magnetization easy axis. When the directions of magnetization of the first and second magnetic films 139 and 141 are entirely stored along the magnetization easy axis in opposite directions, two states, e.g., 1-bit logic information are stored. According to the same sequences as in the first embodiment, the magnetic states of the films 139 and 141 can be controlled using data transfer and data control lines.

More specifically, referring to FIG. 30A, the magnetic memory cells are connected in parallel to the data transfer lines along the line II–II', and two memory cells are connected in parallel to the data selection lines along the line I–I', so a 2×2 magnetic memory cell array is formed in cross points.

In this embodiment, for example, when a metal such as Al or Cu is used for the data selection line 111, the resistance of the data selection line 111 can be maintained low, and the current to be flowed to the data selection line 111 can be increased. For this reason, the number of memory cells connected to the data selection line 111 can be increased, and the density can be increased. In addition, since the parasitic capacitance or resistance of the data selection line 111 can also be reduced, a memory cell of low power consumption and high operation speed can be achieved.

ANOTHER ALTERNATIVE EMBODIMENT

Figure 31:
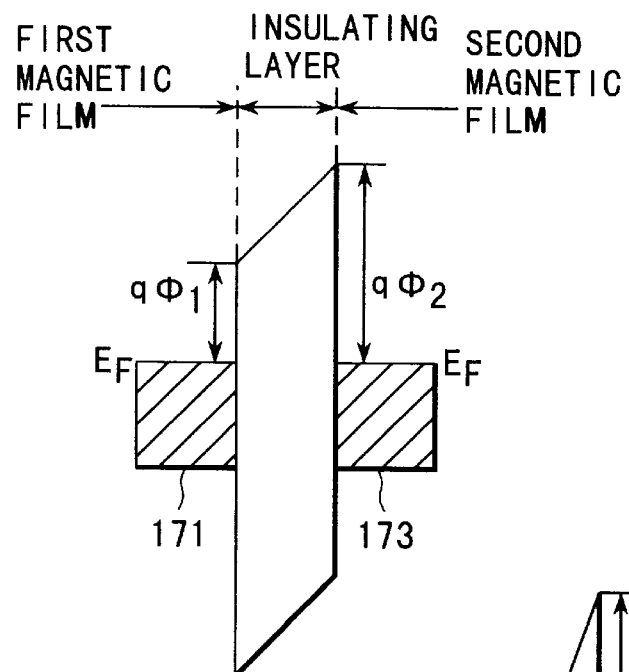
FIG. 31 is a band diagram representing a thermal equilibrium state of a memory cell in FIG. 28.

Another alternative embodiment is related to a structure in which a TMR memory cell itself has a rectifying function instead of connecting a rectifying element to the TMR memory cell. FIG. 31 is a band diagram showing the thermal equilibrium state of the TMR memory cell portion according to this embodiment.

In this diagram, an energy barrier $q\Phi 1$ between the Fermi energy of a first magnetic film 171 made of a ferromagnetic material and a nonmagnetic insulating film 172 is different from an energy barrier $q\Phi 2$ between the Fermi energy of a second magnetic film 173 made of a ferromagnetic material and the nonmagnetic insulating film 172.

In the thermal equilibrium state, the nonmagnetic insulating film 172 forms an asymmetric tunnel barrier. The magnitude relationship between $\Phi 1$ and $\Phi 2$, need not always be $\Phi 2 > \Phi 1$ but may be $\Phi 2 < \Phi 1$ as far as an asymmetric tunnel barrier is formed.

Due to the asymmetric tunnel barrier of the nonmagnetic insulating film 172, the resistance value obtained when a current is flowed to the TMR memory cell in the forward direction is different from that obtained when a current is flowed in the reverse direction. That is, the TMR memory cell has a rectifying properties. The rectifying properties can make an output from unselected cell at a low level, so that the signal output can be made larger than that in the prior art.

In this embodiment, the rectifying properties can be obtained by using the asymmetric tunnel barrier without connecting a rectifying element in series to the memory cell. This will be described below.

Figure 32A:
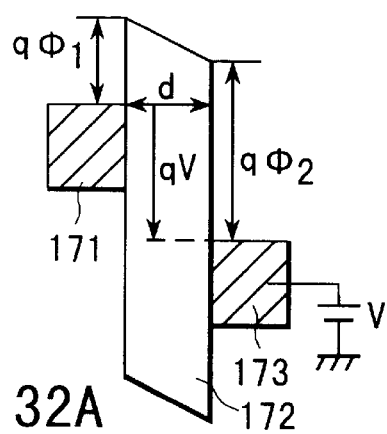
FIGS. 32A and 32B are band diagrams representing thermal equilibrium states where ±V is applied to a TMR memory cell, respectively.
Figure 32B:
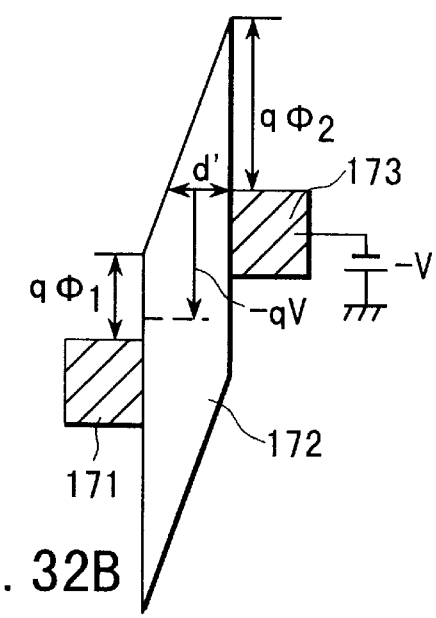

FIG. 32A is a band diagram of the TMR memory cell when a positive voltage V is applied to the second magnetic film 173 in the diagram of FIG. 31. FIG. 32B is a band diagram of the TMR memory cell when a negative voltage −V is applied to the second magnetic film 173.

When the positive voltage V is applied to the second magnetic film 173, the current tunneling from the first magnetic film 171 to the second magnetic film 173 directly tunnels by only a thickness $\underline{d}$ of the nonmagnetic insulating film 172, as shown in FIG. 32A.

When the negative voltage −V is applied to the second magnetic film 173, a Fowler-Nordheim current flows from the second magnetic film 173 to the first magnetic film 171 due to carriers tunneling the region with a width d' smaller than the thickness $\underline{d}$ of the nonmagnetic insulating film 172.

When the negative voltage −V is applied to the second magnetic film 173 (FIG. 32B), a larger current than that when the positive voltage V is applied (FIG. 32A) flows. Therefore, a difference in resistance value can be generated depending on the direction of the current by applying voltages having same absolute value and different signs between the first magnetic film 171 and second magnetic film 173.

Even when a voltage difference V' (<V) between the first magnetic film 171 and second magnetic film 173 causes both the currents in the opposite directions to directly tunnel, asymmetry still exists depending on the direction of the tunnel current.

Figure 33A:
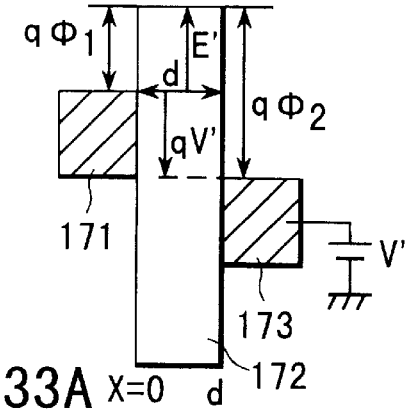
FIGS. 33A and 33B are band diagrams representing thermal equilibrium states where ±V' (V'<V) is applied to a TMR memory cell, respectively.
Figure 33B:
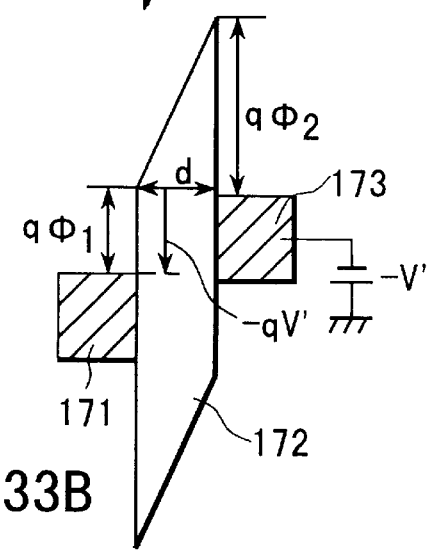

This will be described in association with a case wherein the positive voltage V' is applied (FIG. 33A) and a case wherein the negative voltage −V' is applied (FIG. 33B). For the descriptive convenience, assume that $qV'=q\Phi 2-q\Phi 1$, and $q\Phi 1=q\Phi 2/2$. In WKB approximation, a tunnel probability P of electrons passing through the potential barrier in the x direction is given by:

$$\exp[-2\int_0^d k(x)dx]$$

where $\underline{d}$ is the tunneling distance, and k(x) is the attenuation constant of electrons at a position $\underline{x}$. Referring to FIG. 33A, when tunnel of electrons on the Fermi surface is taken into consideration, k(x) is represented by:

$$2\pi(2mE')^{0.5}/h$$

where E' is the barrier height of electrons at the position $\underline{x}$, $\underline{m}$ is the effective mass of electrons, and $\underline{h}$ is the Planck constant. The terms in indices of the tunnel probability P in FIGS. 33A and 33B are calculated. Since the barrier heights E' at the position x are different, the former is 1.06 times the latter, so the current further decreases.

Hence, when the tunnel barrier has an asymmetry, an asymmetry also occurs in the tunnel current even when the barrier widths equal, so a resistance value difference can be generated depending on the direction of the current.

Figure 34A:
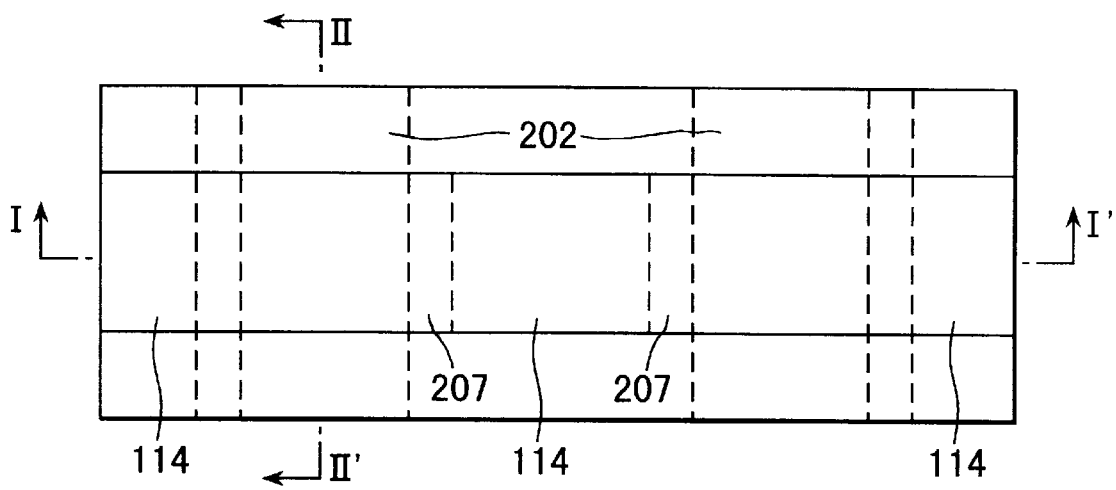
FIGS. 34A to 34C are views showing the structure of a TMR memory cell of the magnetic storage device.
Figure 34B:
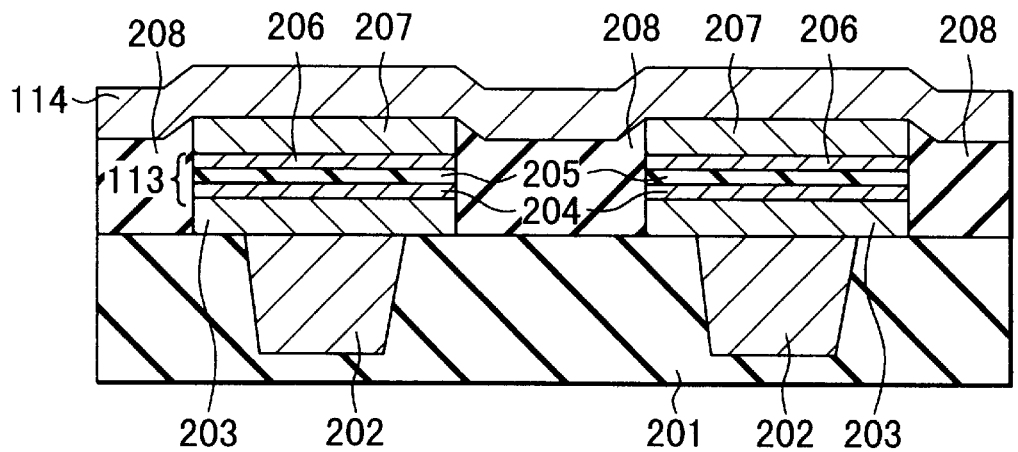
Figure 34C:
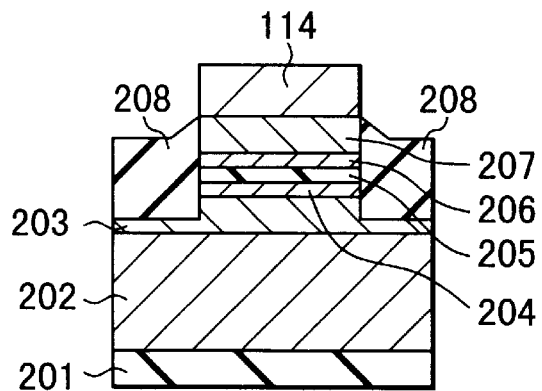

A specific structure of the TMR memory cell of this embodiment will be described next. FIGS. 34A, 34B, and 34C are views showing the specific arrangement of a magnetic storage device according to another alternative embodiment of the present invention. FIG. 34A is a plan view. FIG. 34B is a sectional view taken along a line I–I' in FIG. 34A. FIG. 34C is a sectional view taken along a line II–II' in FIG. 34A.

Two data selection lines 202 are formed in an insulating layer 201 along the line II–II'. A first barrier metal layer 203 is formed on each data selection line 202 in a direction along the longitudinal direction of the data selection line 202. A first magnetic film 204 formed from a ferromagnetic material, a nonmagnetic insulating film 205, a second magnetic film 206 formed from a ferromagnetic material, and a second barrier metal layer 207 are stacked in a region where the first barrier metal layer 203 is formed to a large thickness.

An element isolation insulating film 208 is formed to almost flush with the surface of the second barrier metal layer 207. A data transfer line 114 is formed on the second barrier metal layer 207 and element isolation insulating film 208 along the line I–I'.

In this embodiment, the barrier height between the nonmagnetic insulating film 205 and the second magnetic film 206 must be different from that between the nonmagnetic insulating film 205 and the first magnetic film 204, and the barrier of the nonmagnetic insulating film 205 must become asymmetric when a voltage of 0V is applied to the first and second magnetic films 204 and 206.

As the nonmagnetic insulating film 205, a 0.2-nm to 50-nm thick silicon oxide film, silicon nitride film, titanium oxide film, or aluminum oxide film can be used.

As the first magnetic film 204, a 0.5-nm to 500-nm thick film of Fe, Ni, Co, Cr, or Mn, an alloy thereof such as NiFe, CoFe, NiFeCo, or CoPt, or a multilayered structure thereof can be used. As the second magnetic film 206, a 0.5-nm to 500-nm thick film of NiFe, CoFe, NiFeCo, CoTaZr, CoNbZr, or FeTaN or a multilayered structure such as CoZrNb/NiFe/CoFe can be used.

To make the barrier value of the second magnetic film 206 with respect to the nonmagnetic insulating film 205 different from that of the first magnetic film 204 with respect to the nonmagnetic insulating film 205, different materials or compositions must be selected for the first and second magnetic films 204 and 206.

The first and second magnetic films 204 and 206 sandwich the nonmagnetic insulating film 205. The current flowing from the first magnetic film 204 to the second magnetic film 206 and the current flowing from the second magnetic film 206 to the first magnetic film 204 have a current component flowing through the nonmagnetic insulating film 205 without inverting spin of conduction electrons. That is, the spin relaxation length of conduction electrons in the nonmagnetic insulating film 205 is larger than the thickness of the nonmagnetic insulating film.

The multilayered structure comprising the first magnetic film 204, nonmagnetic insulating film 205, and second magnetic film 206 forms a memory cell 13 whose resistance changes depending on a magnetized state. When the directions of magnetization of the first and second magnetic films 204 and 206 are parallel, the state densities of the first and second magnetic films 204 and 206 considering spin match with each other, and the resistance of the current flowing between the first and second magnetic films 204 and 206 through the nonmagnetic insulating film 205 becomes low. Conversely, when the directions of magnetization of the first and second magnetic films 204 and 206 are antiparallel, the resistance of the current flowing between the first and second magnetic films 204 and 206 through the nonmagnetic insulating film 205 is maximized.

A current flowing when a positive voltage V with respect to the first magnetic film 204 is applied to the second magnetic film 206 has a value different from that of a current flowing when a negative voltage –V with respect to the first magnetic film 204 is applied to the second magnetic film 206.

To store, at the central portion of the magnetic storage portion, magnetization along the data selection line independently of magnetization at the edge portion along the data transfer line 114, the thickness of the first and second magnetic films 204 and 206 are preferably made large to make the width of the data transfer line larger than the thickness of the Neel wall.

The second barrier metal layer 207 comprises a TaN, TiN, or TaW film having a thickness of, e.g., 1 to 100 nm. The second barrier metal layer 207 prevents impurity contamination in forming the overlying structure and improves the contact between the connections. The data transfer line 114 is formed from a W, Al, AlCu, or Cu film having a thickness of, e.g., 50 to 1,000 nm and reduces the parasitic resistance of the connection region between memory cells on the data transfer line.

The first barrier metal layer 203 comprises a TaN, Ti, TiN, or TaW film having a thickness of, e.g., 1 to 100 nm. The data selection line 202 is formed from a Ti, W, Cu, TiN, TiSi, WSi, W, Al, AlSi film having a thickness of, e.g., 50 to 1,000 nm.

Referring to FIGS. 34A to 234C, one memory cell is formed on each of two adjacent data selection lines 202, and the memory cells are connected in parallel to one data transfer line 114. In the memory cells 113 connected in parallel to one data transfer line 114, the second and first magnetic films 206 and 204 are stacked in the same orders.

Each of the insulating layer 201 and element isolation insulating film 208 is an insulating layer formed from, e.g., a silicon oxide film, a titanium oxide film, an aluminum oxide film, or a silicon nitride film. In this embodiment, the magnetization easy axes of the first and second magnetic films 204 and 206 are parallel to the data selection line 202. To form this magnetization easy axis, when the films are made of NiFe, an anisotropic magnetic field of about 5 to 15 Oe can be formed by depositing the films while applying a magnetic field along the magnetization easy axis. When the directions of magnetization of the first and second magnetic films 204 and 206 are entirely stored along the magnetization easy axis in opposite directions, two states, e.g., 1-bit logic information are stored.

The present invention is not limited to the above embodiments. In the above embodiments, to form an insulating film such as an insulating interlayer, a surface insulating film, and a sidewall insulating film, a method of forming an oxide film by thermal oxidation, a method of forming an oxide film by implanting oxygen ions at a low acceleration energy of about 30 keV, a method of depositing an insulating film, or a method of depositing a silicon nitride film, or a combination thereof may be used.

To form an element isolation film or an insulating film, another method of converting a magnetic film or metal film into an insulating film, e.g., a method of implanting oxygen ions into a deposited magnetic film or a method of oxidizing a deposited magnetic film may be used.

As an insulating film, a single-layered film of a resist, Spin-on-glass, a silicon nitride film, a titanium oxide film, a tantalum oxide film, an $Al_2O_3$ film, or an organic paraelectric film, or a composite film thereof can be used.

As the material of the ferromagnetic film 11, 204, 206, 55, and 139, ferromagnetic particles 52$_2$, soft ferromagnetic film 13 and 141, and soft ferromagnetic particles 52$_3$, a magnetic semiconductor such as HgMnTe, CdMnSe, InMnAs, or GaMnAs, a perovskite ferromagnetic material such as LaCaMnO or LaSrMnO, a spinel ferrite such as FeO, MnFeO, CoFeO, NiFeO, PtMnSb, or NiMnSb may be used. In this case, for the nonmagnetic conductive film 12, nonmagnetic insulator film 140, 205, or nonmagnetic matrix 52$_1$, for example, HgCdTe, InGaAs, SrTiO, or MgO doped with an n- or p-type impurity can be used. The positions of the ferromagnetic film 11 and soft ferromagnetic film 13 may be replaced.

In the first embodiment, an n-type MISFET and p-type MISFET are used as a switching device. However, the p- and n-type MISFETS may be replaced by inverting the gate input. In place of the n-type MISFET, an npn bipolar transistor or pnp bipolar transistor may be used. When a bipolar transistor is used, a collector electrode is used in place of a drain electrode, an emitter electrode is used in place of a source electrode, and a base electrode is used in place of a gate electrode. To turn on an npn transistor, a positive voltage of 0.6V or more for, e.g., Si, is applied in the forward direction of p-n junction, and to turn on a pnp transistor, a negative voltage is applied in the forward direction. To turn off the transistor, the base electrode is set at 0V.

Various changes and modifications can be made within the spirit and scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic storage device comprising:
   a plurality of data selection lines;
   a first power supply node for supplying currents of two types having the same polarity and different magnitudes to said plurality of data selection lines;
   a plurality of data transfer lines arranged to intersect said plurality of data selection lines; and
   a plurality of memory cells each comprising:
      a first magnetic material element having a magnetization easy axis arranged to substantially be parallel to the longitudinal direction of said data selection lines;
      a second magnetic material having a magnetization easy axis arranged to substantially be parallel to the longitudinal direction of said data selection lines and having a coercivity smaller than that of said first magnetic material; and
      a nonmagnetic material being interposed between said first magnetic material and said second magnetic material,
   each memory cell being located at the intersection region between one of said data selection lines and one of said data transfer lines,
   wherein:
      when data is to be written in a selected memory cell, one of said currents of two types is supplied to a selected data selection line, and when data is to be read from the selected memory cell, the other of said currents of two types is supplied to the selected data selection line.

2. The device according to claim 1, wherein:
   a binary data is stored in a selected memory cell by directing directions of magnetization of both said first and second magnetic materials in a first direction parallel to the magnetization easy axis or in a second direction opposite to the first direction by magnetic fields generated by the currents passing said data selection lines and said data transfer lines.

3. The device according to claim 2, wherein:
   said memory cells each have a multilayered structure comprising:
      a first film made of said first magnetic material;
      a second film made of said second magnetic material; and
      a third film made of said nonmagnetic material, the third film being sandwiched between said first magnetic material and said second magnetic material.

4. The device according to claim 2, wherein:
   each of said data transfer lines has the same multilayered structure as said memory cell, and said data transfer lines function as said memory cells at portions intersecting said data selection lines.

5. The device according to claim 4, wherein:
   the distance between said first and second magnetic materials is set smaller than a mean free path of carriers bearing electrical conduction in said nonmagnetic material.

6. A magnetic storage device comprising:
   a plurality of data selection lines;
   a first power supply node commonly connected to said plurality of data selection lines, for supplying currents of two types having the same polarity and different magnitudes;
   at least one pair of data transfer lines including a plurality of memory cells and crossing said plurality of data selection lines;
   a differential amplification circuit having two input/output terminals, said input/output terminals being connected to one terminal of each of said data transfer lines;
   a second power supply node connected to the other terminal of each of said data transfer lines; and
   at least one data input/output line connected to said two input/output terminals of said differential amplification circuit,
   wherein:
      said memory cells each comprises:
         a first magnetic material film having a magnetization easy axis arranged substantially parallel to the longitudinal direction of said data selection lines;
         a second magnetic material film having a magnetization easy axis arranged substantially parallel to the longitudinal direction of said data selection lines and having a coercivity smaller than said first magnetic film; and
         a nonmagnetic material film sandwiched between said first and second magnetic films,
   each memory cell being located at the intersection region between one of said data selection lines and said data transfer lines, when data is to be written in a selected memory cell, one of said currents of two types is supplied to a selected data selection line, and when data is to be read from a selected memory cell, the other of said currents of two types is supplied to a selected data selection line, and each of said at least one pair of data transfer lines includes a reference memory cell, and said reference memory cell is arranged to supply a reference voltage for determining data to said differential amplification circuit when data is to be read from a selected memory cell.

7. The device according to claim 6, wherein:

binary data is stored in a selected memory cell by directing the magnetization directions of both said first and second magnetic films in a first direction parallel to the magnetization easy axis or in a second direction opposite to the first direction by magnetic fields generated by the currents in said data selection lines and said data transfer lines.

8. The device according to claim 7, wherein:

the voltage of said second power supply node is fixed constant during the operation of said device.

9. The device according to claim 8, wherein:

said differential amplifier circuit further comprises two power supply terminals, one of said two power supply terminals of said differential amplification circuit is connected to a third power supply node for supplying a voltage higher than the voltage at said second power supply node, the other of said two power supply terminals is connected to a fourth power supply node for supplying a voltage lower than the voltage at said second power supply node.

10. The device according to claim 9, wherein:

read currents pass a selected pair of said data transfer lines from said second power supply node to said two input/output terminals, and the magnetic fields generated by the currents have magnitudes to change the magnetization direction of said second magnetic film of a selected memory cell and not to change the magnetization direction of said second magnetic film of unselected memory cells.

11. The device according to claim 10, wherein:

restoration current is supplied from said third power supply node or said fourth power supply node to one of said selected pair of said data transfer lines in a direction reverse to the read current after said read currents flow, and the restoration current generates a magnetic field having a magnitude to change the direction of magnetization of said second magnetic film of a selected memory cell and not to change the direction of magnetization of said second magnetic film of unselected memory cells.

12. The device according to claim 11, wherein:

the distance between said first and second magnetic material films is smaller than a mean free path of carriers bearing electrical conduction in said nonmagnetic material film.

13. The device according to claim 12, wherein when data is to be read from a selected memory cell, a magnetic field of a magnitude smaller than the coercivity of said first magnetic film and larger than the coercivity of said second magnetic film is provided by a synthesized magnetic field of a magnetic field formed by a current passing one of said data selection lines and a magnetic field formed by a current passing one of said data transfer lines, to apply said synthesized magnetic filed to said selected memory cell.

14. The device according to claim 13, wherein:

when data is to be written in a selected memory cell, current is supplied to said data selection line in a predetermined direction, whereby a synthesized magnetic field of a magnitude greater than the coercivity of said first magnetic material film is applied to said selected memory cell.

15. The device according to claim 13, wherein:

when data is to be written in said memory cell, current in the same direction as that of the current in the read operation is supplied to a selected data selection line, and the synthesized magnetic field of a magnitude greater than the coercivity of said first magnetic film is applied to said selected memory cell.

16. A magnetic storage device comprising:

a plurality of memory cells each having a first magnetic state storage element and a second magnetic state storage element having a coercivity smaller than said first magnetized state storage element;

memory cell selection means for selecting one of said plurality of memory cells;

first magnetic field generation means for applying a first magnetic field in a first direction to a selected memory cell;

second magnetic field generation means for applying a second magnetic field to said selected memory cell in a second direction perpendicular to the first direction, to change the magnetization direction of at least one of said first magnetic state storage element and said second magnetic state storage element of said selected memory cell by a synergic effect of said first magnetic field and said second magnetic field;

magnetic field magnitude control means, in an information write operation, for controlling the magnitudes of the first magnetic field and said second magnetic field so as to set the magnetization directions of said first magnetic state storage element and said second magnetic state storage elements of said selected memory cell substantially parallel in accordance with the binary information to be written, and in read operation, for controlling the magnitudes of the first magnetic field and said second magnetic field so as to change the magnetization direction of one of said first magnetic state storage element and said second magnetic state storage element of said selected memory cell to make substantially an antiparallel state in said selected memory cell; and determination means for electrically determining whether the magnetization directions of said first magnetic state storage element and said second magnetic state storage element of said selected memory cell are parallel or antiparallel, thereby to output a read signal.

17. The device according to claim 16, further comprising:

information transfer means for electrically connecting said selected memory cell to said determination means to transfer an electrical signal representing information stored in said memory cell between said selected memory cell and said determination means; and signal input/output means for transferring an input signal to said magnetic state change means and for receiving the read signal from said determination means.

18. The device according to claim 17, wherein:

said magnetic field magnitude control means further controls the magnitude of said first magnetic field and said second magnetic field such that the magnetization directions of said first magnetic state storage element and said second magnetic state storage elements of any of unselected memory cells are not changed in write operation or read operation.

19. A magnetic storage device comprising:

a plurality of memory cells each having a first magnetic material, and a second magnetic material, and a nonmagnetic insulating film interposed between the first and second magnetic materials;

data selection lines each being connected to one end of corresponding ones of the plurality of memory cells; and a data transfer line being connected to the other ends of the memory cells, the data selection lines being connected to the data transfer line through the memory cell, respectively, wherein the memory cells include recitifying elements having the same recitifying direction, respectively, and the barrier height of the nonmagnetic insulating film relative to the first magnetic material differs from the barrier height of the nonmagnetic insulating film relative to the second magnetic material.

20. A magnetic storage device according to claim 19, wherein the resistance value of each memory cell is smaller when a forward directional current flows through the memory cell than when a reverse directional current flows through the memory cell.

21. A magnetic storage device according to claim 20, wherein the data selection lines are arranged substantially perpendicular to the data transfer line.

22. A magnetic storage device according to claim 20, wherein the data selection lines are connected to an input of an amplifier.

* * * * *

UNITED STATES PATENT AND TRADEMARK OFFICE
CERTIFICATE OF CORRECTION

PATENT NO. : 6,169,688 B1
DATED : January 2, 2001
INVENTOR(S) : Mitsuhiro Noguchi Page 1 of 1

It is certified that error appears in the above-identified patent and that said Letters Patent is hereby corrected as shown below:

Claim 19, column 43,
Line 17, "memory cell" should read -- memory cells --.

Claim 19, column 44,
Lines 1 and 2, "recitifying" should read -- rectifying --.

Signed and Sealed this

Twenty-fifth Day of September, 2001

Attest:

*Nicholas P. Godici*

NICHOLAS P. GODICI
*Attesting Officer*    *Acting Director of the United States Patent and Trademark Office*